(12) United States Patent
Or-Bach et al.

(10) Patent No.: US 9,786,636 B2
(45) Date of Patent: *Oct. 10, 2017

(54) SEMICONDUCTOR DEVICE AND STRUCTURE

(71) Applicant: Monolithic 3D Inc., San Jose, CA (US)

(72) Inventors: Zvi Or-Bach, San Jose, CA (US); Brian Cronquist, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/008,444

(22) Filed: Jan. 28, 2016

(65) Prior Publication Data

US 2016/0141274 A1    May 19, 2016

Related U.S. Application Data

(63) Continuation-in-part of application No. 14/541,452, filed on Nov. 14, 2014, now Pat. No. 9,252,134, (Continued)

(51) Int. Cl.
| | |
|---|---|
| H01L 21/00 | (2006.01) |
| H01L 25/065 | (2006.01) |
| H01L 21/768 | (2006.01) |
| H01L 23/48 | (2006.01) |
| H01L 23/485 | (2006.01) |
| H01L 23/522 | (2006.01) |

(Continued)

(52) U.S. Cl.
CPC ........ *H01L 25/0657* (2013.01); *H01L 21/743* (2013.01); *H01L 21/76898* (2013.01); *H01L 23/36* (2013.01); *H01L 23/481* (2013.01); *H01L 23/485* (2013.01); *H01L 23/522* (2013.01); *H01L 23/5225* (2013.01); *H01L 25/50* (2013.01); *H01L 27/0688* (2013.01); *H01L 27/088* (2013.01); *H01L 29/66621* (2013.01); *H01L 27/092* (2013.01); *H01L 29/4236* (2013.01); *H01L 29/78* (2013.01); *H01L 2225/06506* (2013.01); *H01L 2225/06537* (2013.01); *H01L 2225/06544* (2013.01); *H01L 2225/06589* (2013.01); *H01L 2924/0002* (2013.01); *H01L 2924/01104* (2013.01); *H01L 2924/12032* (2013.01); *H01L 2924/12042* (2013.01); *H01L 2924/13091* (2013.01); *H01L 2924/2064* (2013.01); *H01L 2924/351* (2013.01)

(58) Field of Classification Search
None
See application file for complete search history.

(56) References Cited

U.S. PATENT DOCUMENTS

| | | | | |
|---|---|---|---|---|
| 8,674,470 B1* | 3/2014 | Or-Bach | ................ | H01L 24/25 257/499 |
| 9,252,134 B2* | 2/2016 | Or-Bach | ................ | H01L 24/25 |
| 2015/0255418 A1* | 9/2015 | Gowda | ................ | H01L 23/367 257/690 |

* cited by examiner

*Primary Examiner* — Thao P Le

(57) ABSTRACT

An Integrated Circuit device, including: a base wafer including single crystal, the base wafer including a plurality of first transistors; at least one metal layer providing interconnection between the plurality of first transistors; a first wire structure constructed to provide power to a portion of the first transistors; a second layer of less than 2 micron thickness, the second layer including a plurality of second single crystal transistors, the second layer overlying the at least one metal layer; and a second wire structure constructed to provide power to a portion of the second transistors, where the second wire structure is isolated from the first wire structure to provide a different power voltage to the portion of the second transistors.

20 Claims, 29 Drawing Sheets

Related U.S. Application Data which is a continuation of application No. 14/198,041, filed on Mar. 5, 2014, now Pat. No. 8,921,970, which is a continuation of application No. 13/726,091, filed on Dec. 22, 2012, now Pat. No. 8,674,470.

(51) Int. Cl.
*H01L 29/66* (2006.01)
*H01L 21/74* (2006.01)
*H01L 25/00* (2006.01)
*H01L 27/06* (2006.01)
*H01L 27/088* (2006.01)
*H01L 23/36* (2006.01)
*H01L 29/423* (2006.01)
*H01L 29/78* (2006.01)
*H01L 27/092* (2006.01)

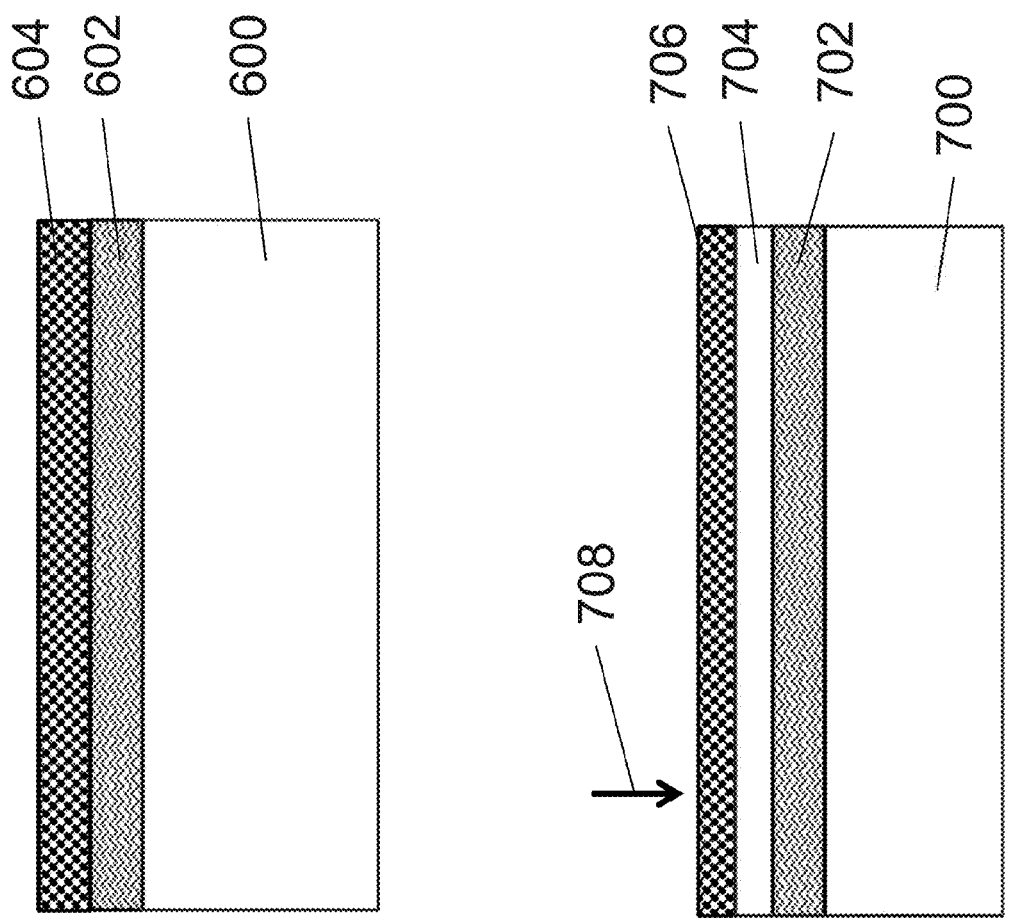

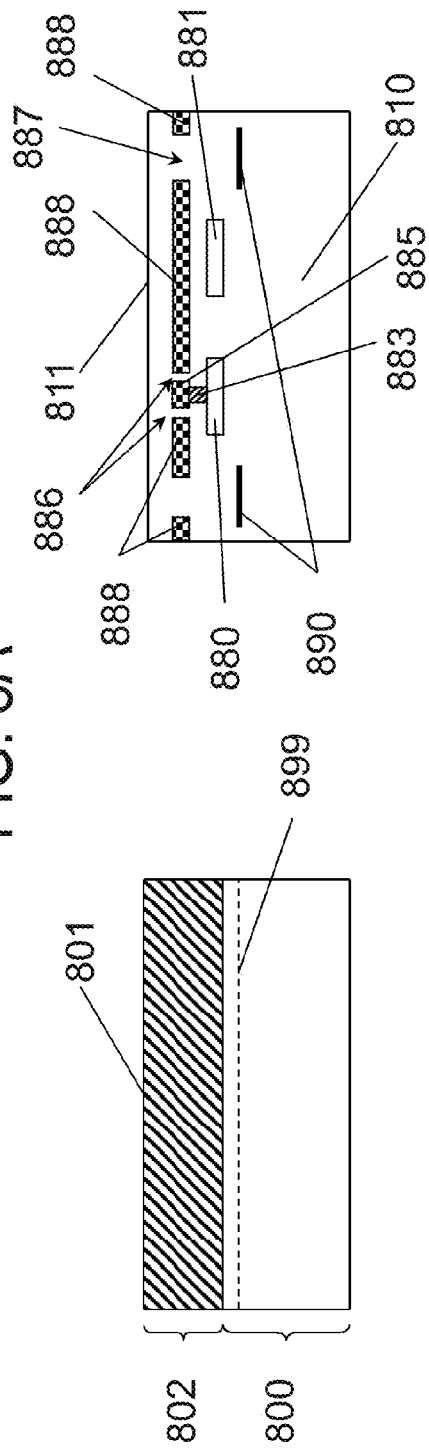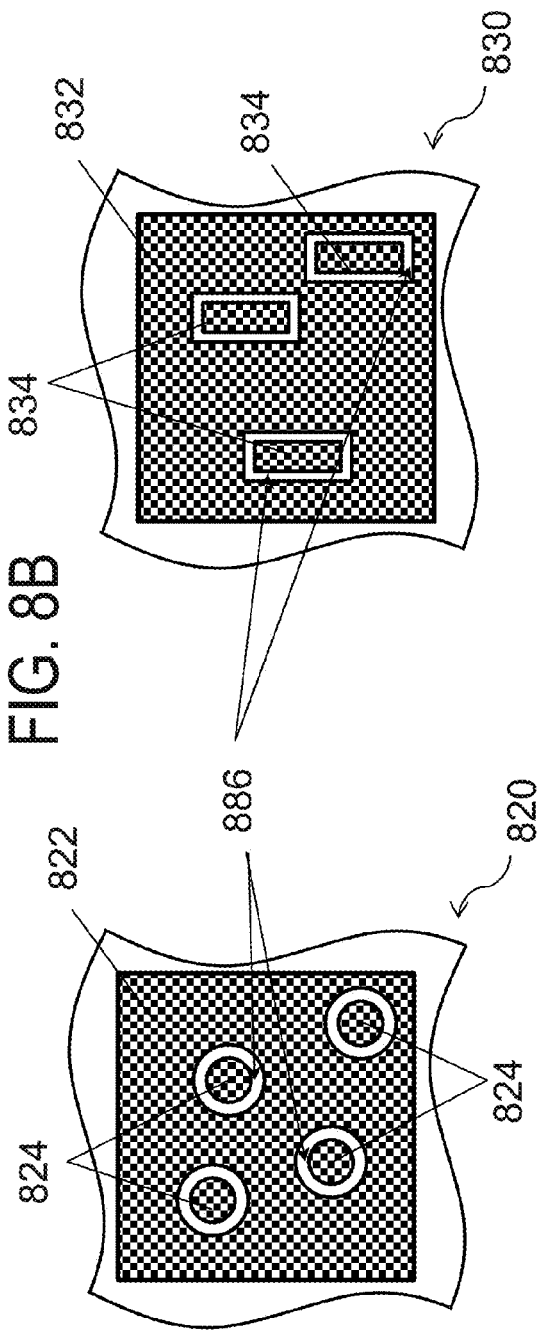

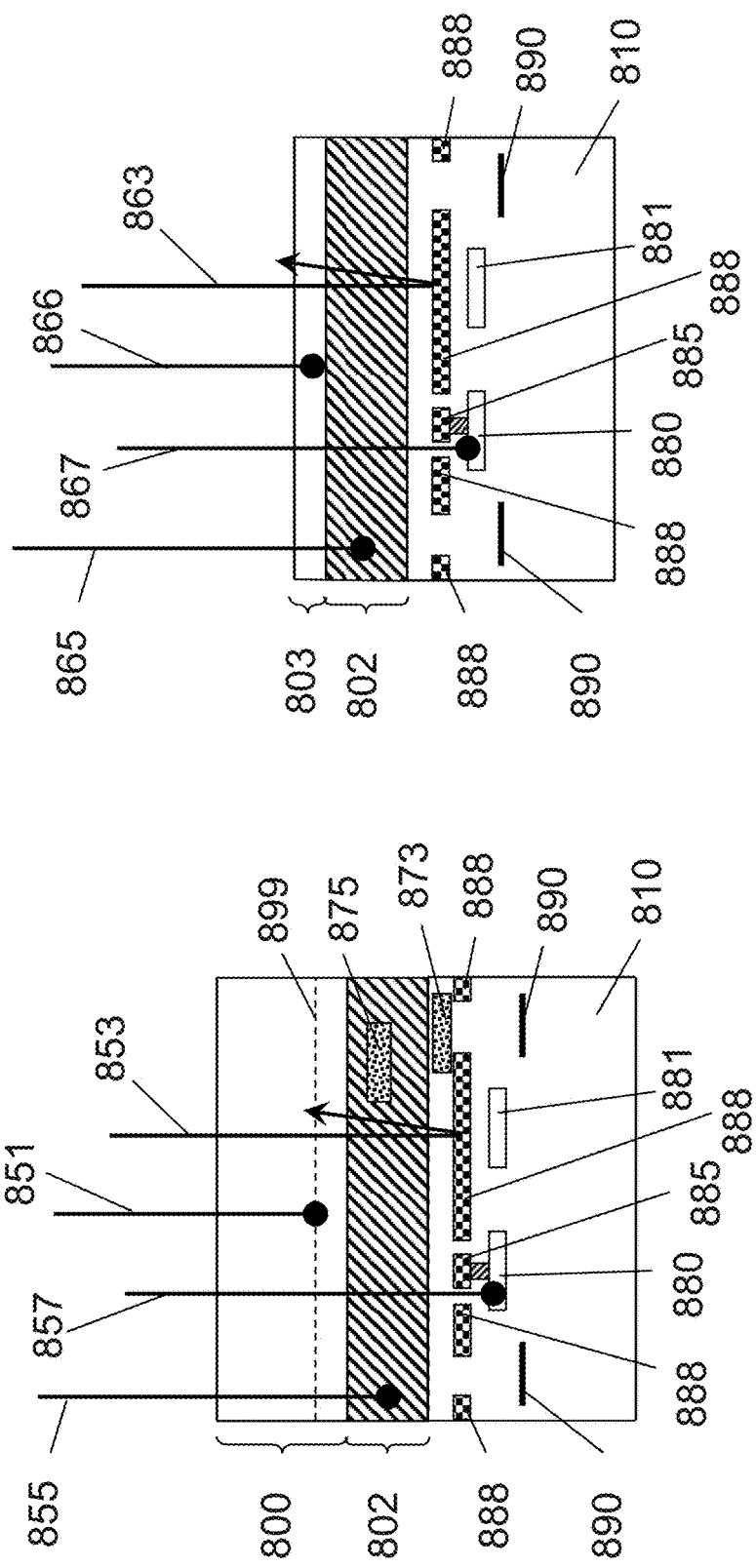

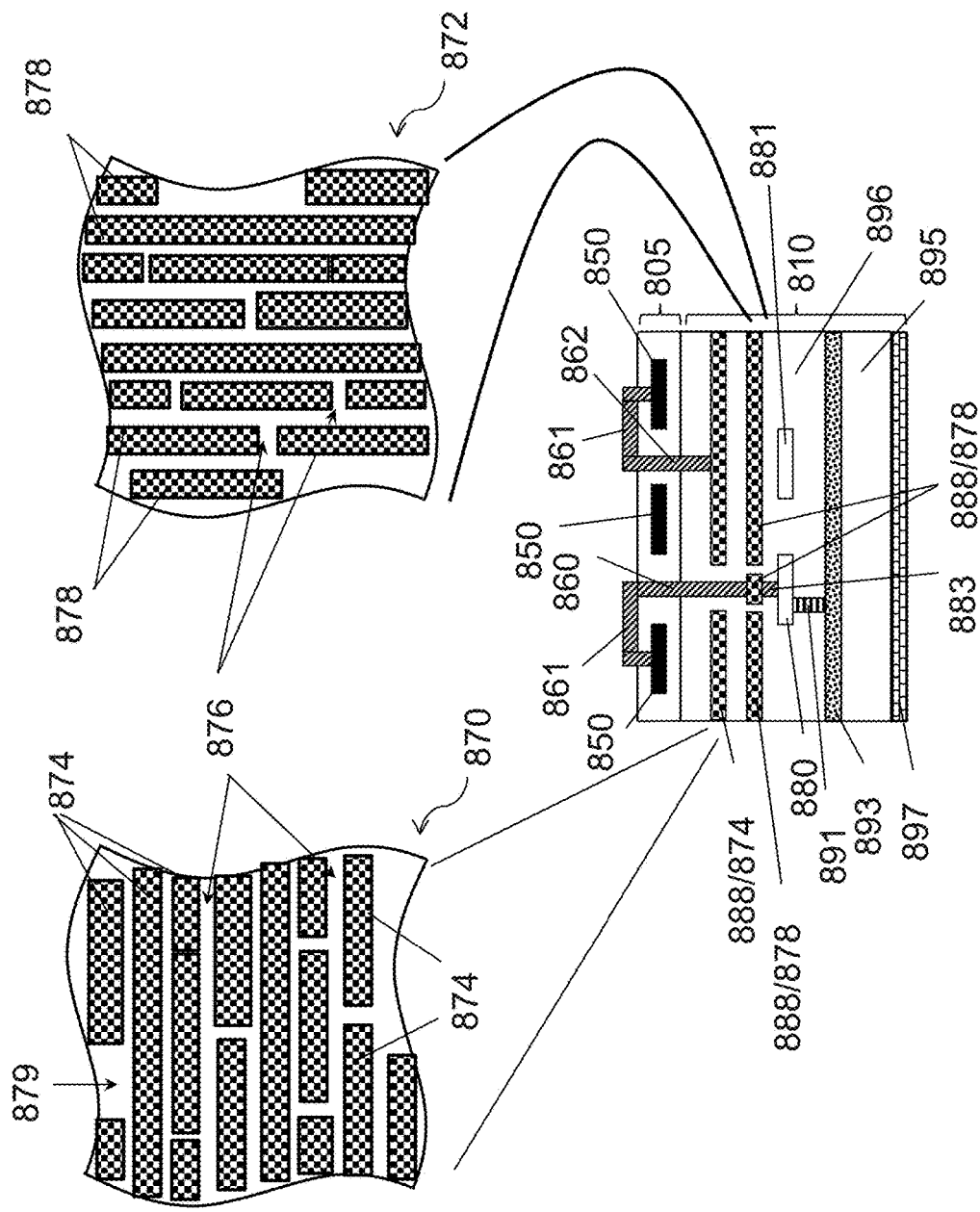

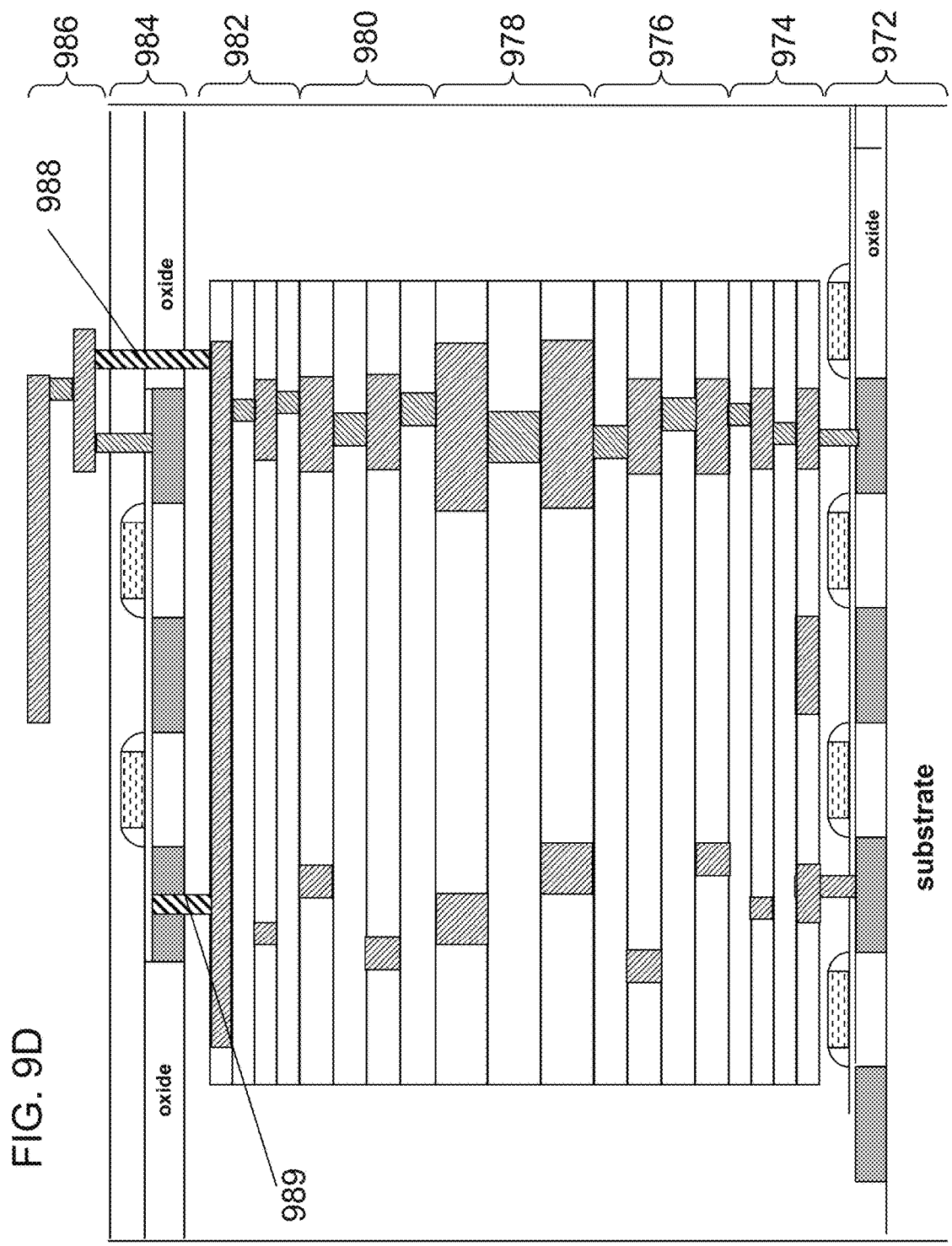

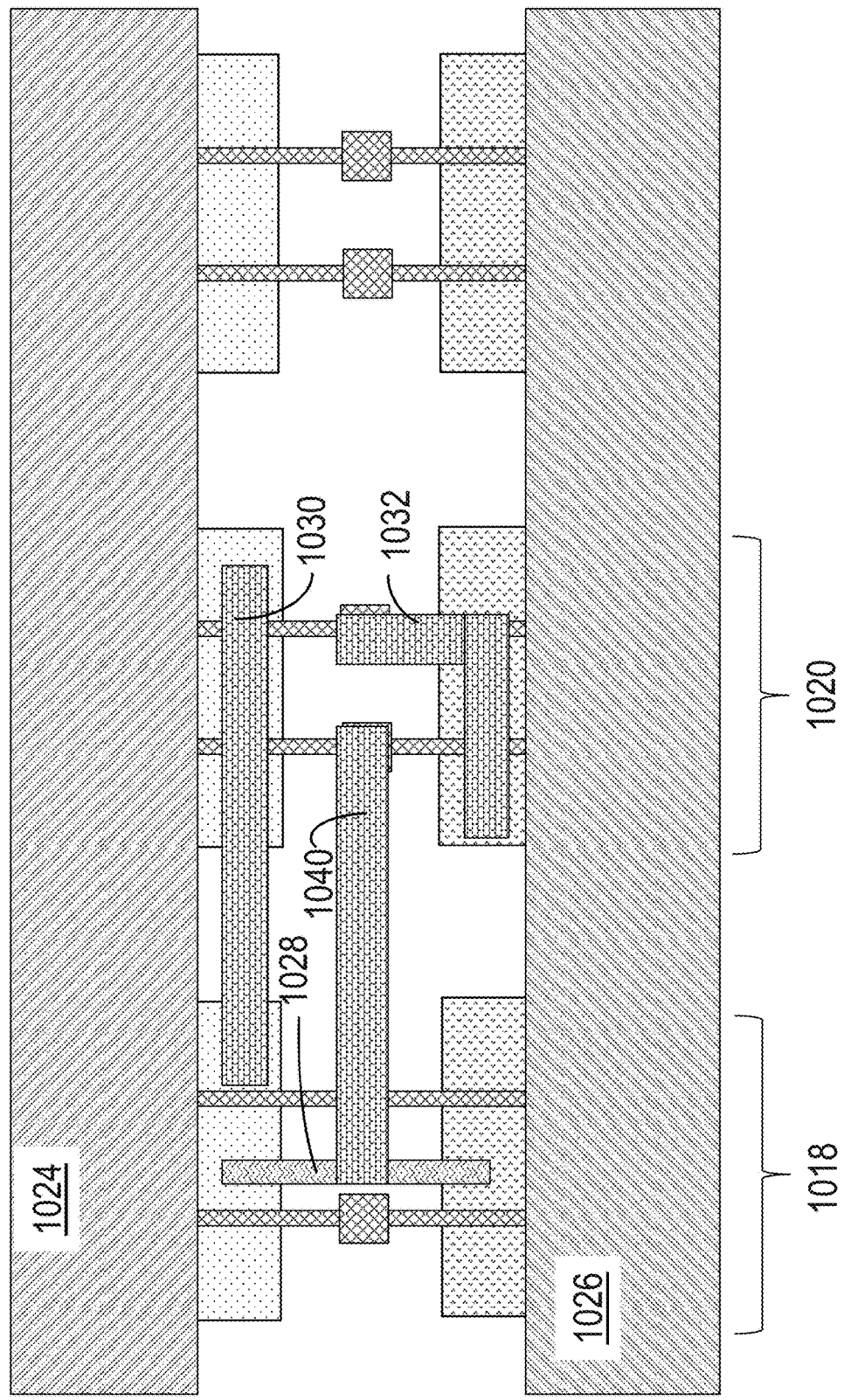

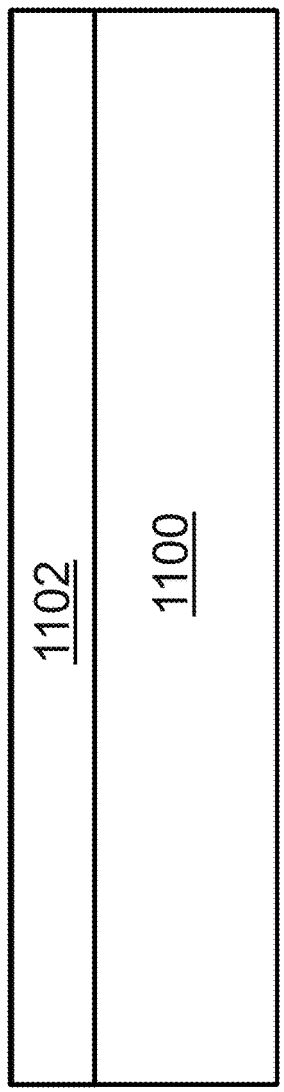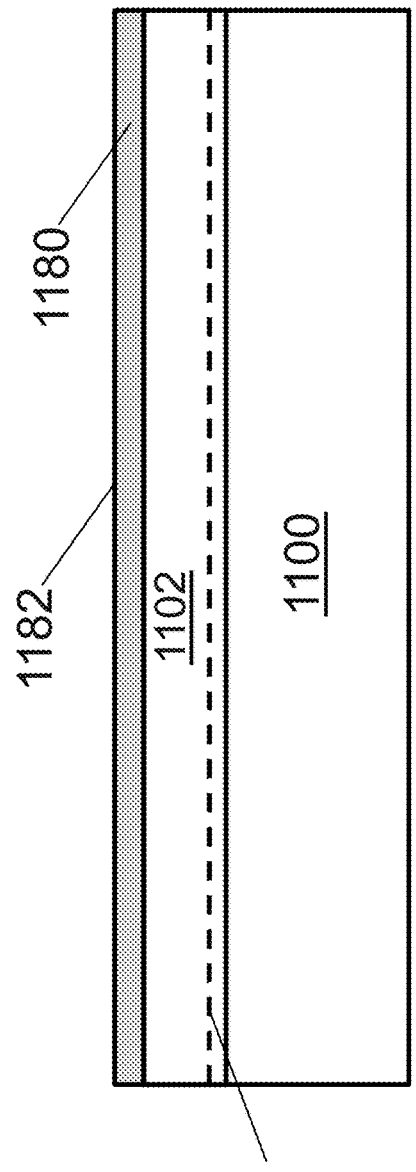

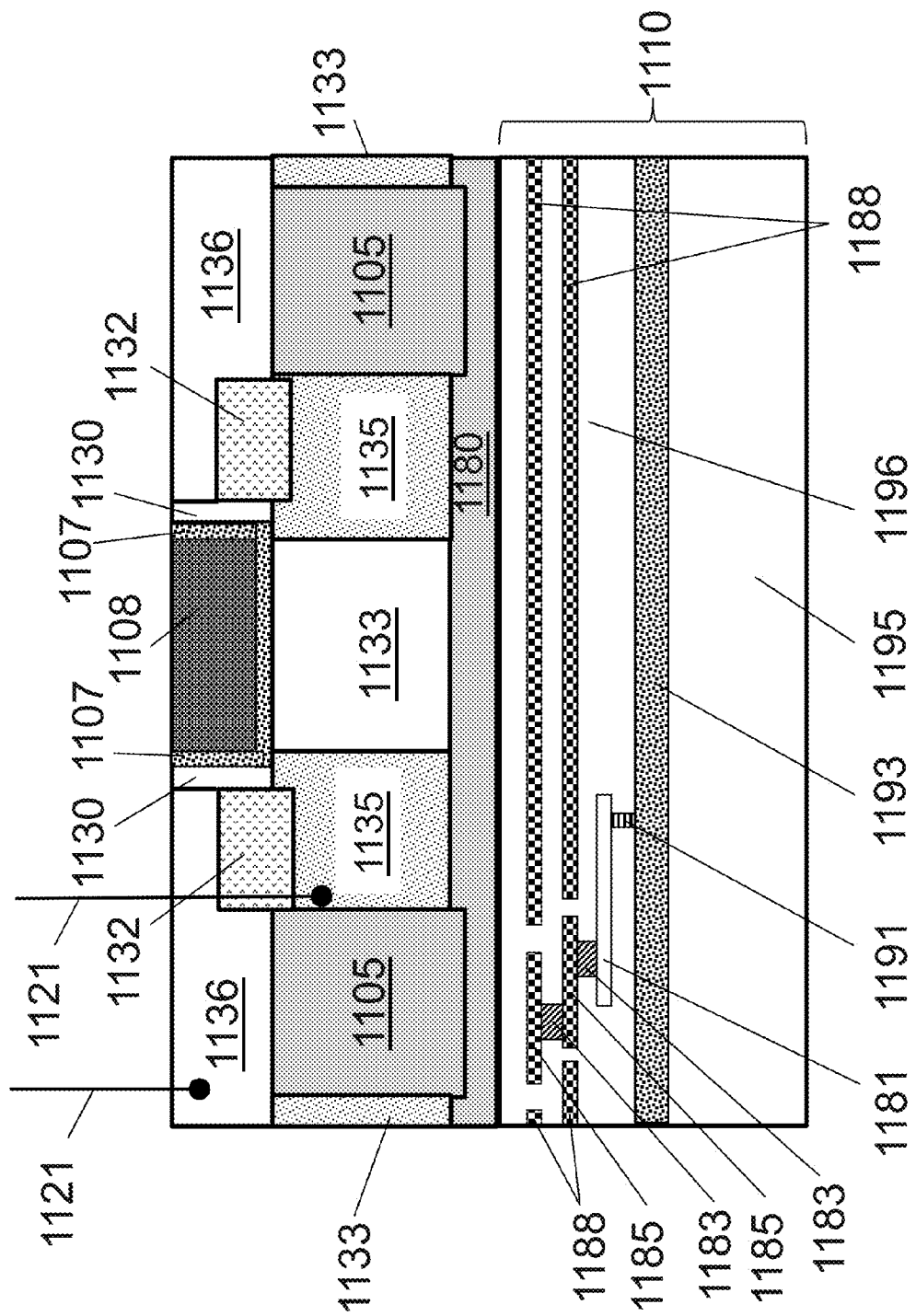

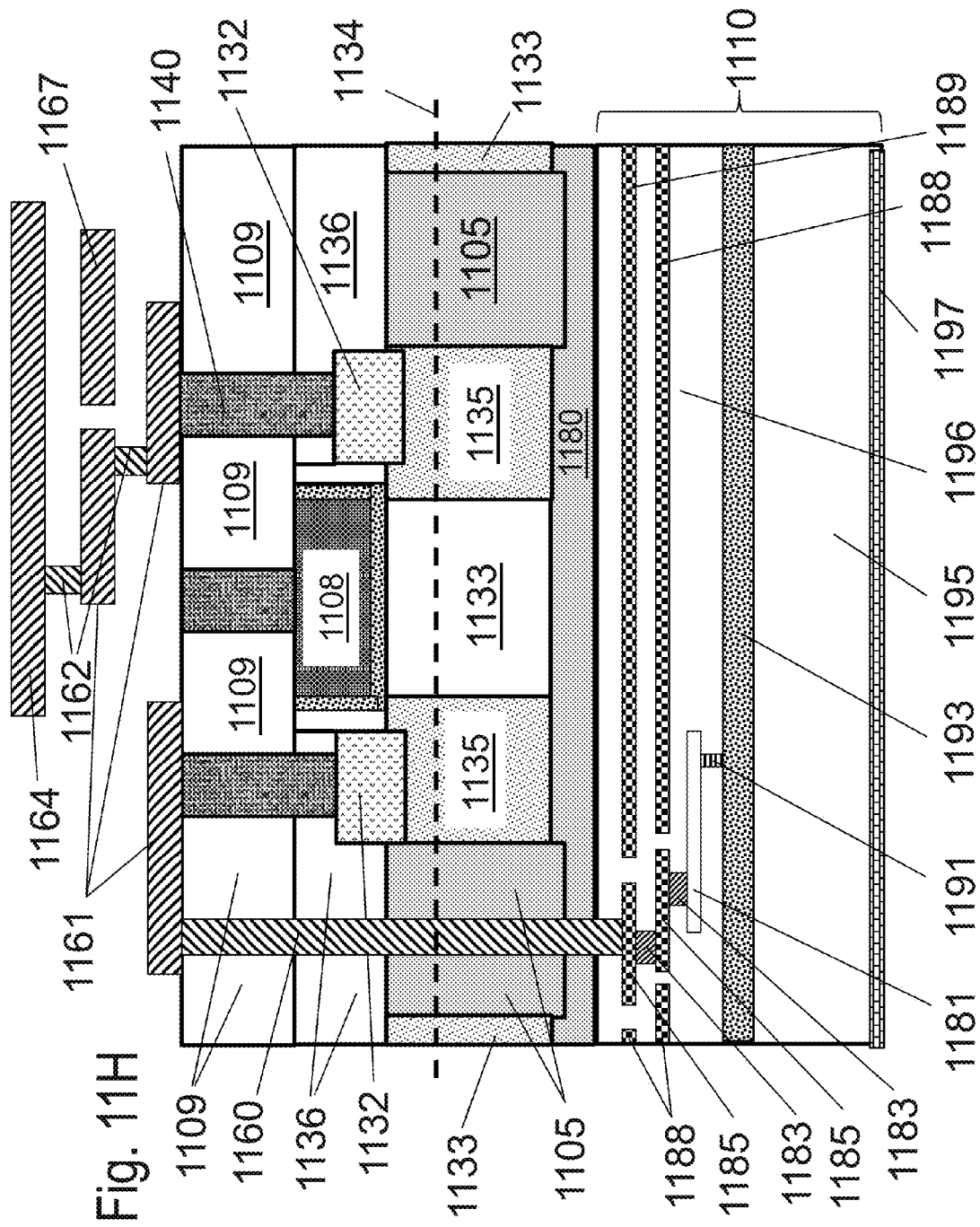

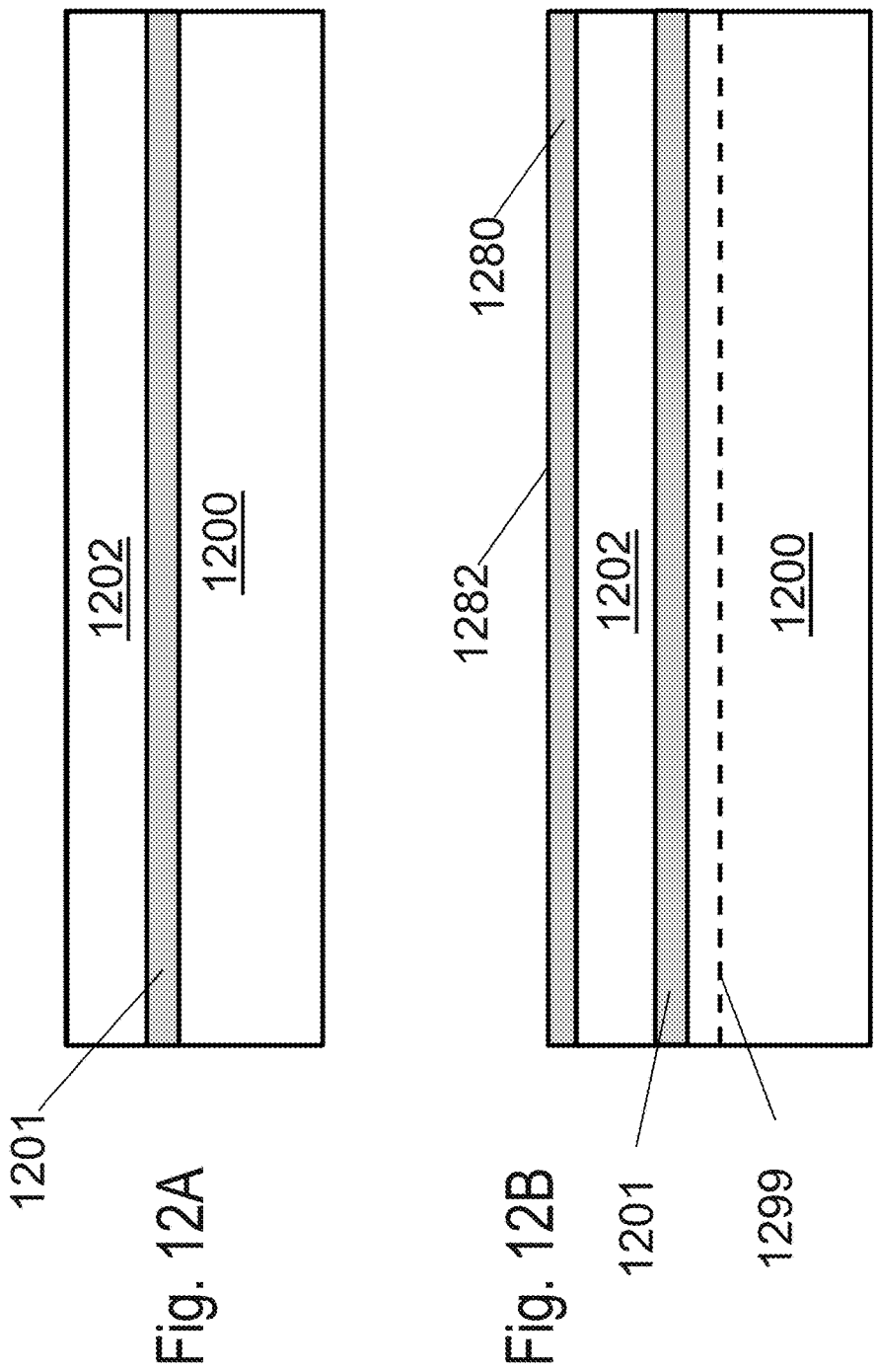

SEMICONDUCTOR DEVICE AND STRUCTURE

This application is a continuation-in-part of U.S. patent application Ser. No. 14/541,452, filed on Nov. 14, 2014, which is a continuation of U.S. patent application Ser. No. 14/198,041, filed on Mar. 5, 2014, now U.S. Pat. No. 8,921,970 issued on Dec. 30, 2014, which is a continuation of U.S. patent application Ser. No. 13/726,091, filed on Dec. 22, 2012, now U.S. Pat. No. 8,674,470 issued on Mar. 18, 2014. The contents of the foregoing applications are incorporated herein by reference.

BACKGROUND OF THE INVENTION

1. Field of the Invention

This application relates to the general field of Integrated Circuit (IC) devices and fabrication methods, and more particularly to multilayer or Three Dimensional Integrated Circuit (3D-IC) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,557,632, 8,298,875, 8,642,416, 8,362,482, 8,378,715, 8,379,458, 8,450,804, 8,574,929, 8,581,349, 8,642,416, 8,687,399, 8,742,476, 8,674,470, 8,803,206, 8,902,663, 8,994,404, 9,021,414, 9,023,688, 9,030,858; US patent publications 2011/0092030 and 2013/0020707; and pending U.S. patent application Ser. No. 13/836,080, 62/077,280, 62/042,229, Ser. No. 13/803,437, 61/932,617, Ser. Nos. 14/607,077, 14/642,724, 62/139,636, 62/149,651, and 62/198,126. The entire contents of the foregoing patents, publications, and applications are incorporated herein by reference.

Electro-Optics: There is also work done for integrated monolithic 3D including layers of different crystals, such as U.S. Pat. No. 8,283,215, U.S. Pat. Nos. 8,163,581, 8,753,913, 8,823,122, and U.S. patent application Ser. Nos. 13/274,161 and 14/461,539. The entire contents of the foregoing patents, publications, and applications are incorporated herein by reference.

An early work on monolithic 3D was presented in U.S. Pat. No. 7,052,941 and follow-on work in related patents includes U.S. Pat. No. 7,470,598. A technique which has been used over the last 20 years to build SOI wafers, called "Smart-Cut" or "Ion-Cut", was presented in U.S. Pat. No. 7,470,598 as one of the options to perform layer transfer for the formation of a monolithic 3D device. Yet in a related patent disclosure, by the same inventor of U.S. Pat. No. 7,470,598, U.S. application Ser. No. 12/618,542 it states: "In one embodiment of the previous art, exfoliating implant method in which ion-implanting Hydrogen into the wafer surface is known. But this exfoliating implant method can destroy lattice structure of the doped layer 400 by heavy ion-implanting In this case, to recover the destroyed lattice structure, a long time thermal treatment in very high temperature is required. This long time/high temperature thermal treatment can severely deform the cell devices of the lower region." Moreover, in U.S. application Ser. No. 12/635,496 by the same inventor is stated: [0034] Among the technologies to form the detaching layer, one of the well known technologies is Hydrogen Exfoliating Implant. This method has a critical disadvantage which can destroy lattice structures of the substrate because it uses high amount of ion implantation. In order to recover the destroyed lattice structures, the substrate should be cured by heat treatment in very high temperature long time. This kind of high temperature heat treatment can damage cell devices in the lower regions." Furthermore, in U.S. application Ser. No. 13/175,652 it is stated: "Among the technologies to form the detaching layer 207, one technology is called as exfoliating implant in which gas phase ions such as hydrogen is implanted to form the detaching layer, but in this technology, the crystal lattice structure of the multiple doped layers 201, 203, 205 can be damaged. In order to recover the crystal lattice damage, a thermal treatment under very high temperature and long time should be performed, and this can strongly damage the cell devices underneath." In fact the Inventor had posted a video infomercial on his corporate website, and was up-loaded on YouTube on Jun. 1, 2011, clearly stating in reference to the Smart Cut process: "The wafer bonding and detaching method is well-known SOI or Semiconductor-On-Insulator technology. Compared to conventional bulk semiconductor substrates, SOI has been introduced to increase transistor performance. However, it is not designed for 3D IC either. Let me explain the reasons . . . . The dose of hydrogen is too high and, therefore, semiconductor crystalline lattices are demolished by the hydrogen ion bombardment during the hydrogen ion implantation Therefore, typically annealing at more than 1,100 Celsius is required for curing the lattice damage after wafer detaching. Such high temperature processing certainly destroys underlying devices and interconnect layers. Without high temperature annealing, the transferred layer should be the same as a highly defective amorphous layer. It seems that there is no way to cure the lattice damage at low temperatures. BeSang has disruptive 3D layer formation technology and it enables formation of defect-free single crystalline semiconductor layer at low temperatures . . . "

In at least one embodiment presented herein, an innovative method to repair the crystal lattice damage caused by the hydrogen implant is described.

Regardless of the technique used to construct 3D stacked integrated circuits or chips, heat removal is a serious issue for this technology. For example, when a layer of circuits with power density P is stacked atop another layer with power density P, the net power density is 2P. Removing the heat produced due to this power density is a significant challenge. In addition, many heat producing regions in 3D stacked integrated circuits or chips have a high thermal resistance to the heat sink, and this makes heat removal even more difficult.

Several solutions have been proposed to tackle this issue of heat removal in 3D stacked integrated circuits and chips. These are described in the following paragraphs.

Publications have suggested passing liquid coolant through multiple device layers of a 3D-IC to remove heat. This is described in "Microchannel Cooled 3D Integrated Systems", Proc. Intl Interconnect Technology Conference, 2008 by D. C. Sekar, et al., and "Forced Convective Interlayer Cooling in Vertically Integrated Packages," Proc. Intersoc. Conference on Thermal Management (ITHERM), 2008 by T. Brunschweiler, et al.

Thermal vias have been suggested as techniques to transfer heat from stacked device layers to the heat sink. Use of power and ground vias for thermal conduction in 3D-ICs has also been suggested. These techniques are described in "Allocating Power Ground Vias in 3D ICs for Simultaneous Power and Thermal Integrity" ACM Transactions on Design Automation of Electronic Systems (TODAES), May 2009 by Hao Yu, Joanna Ho and Lei He.

Other techniques to remove heat from 3D Integrated Circuits and Chips will be beneficial.

Additionally the 3D technology according to some embodiments of the invention may enable some very innovative IC alternatives with reduced development costs, increased yield, and other illustrative benefits.

SUMMARY

The invention may be directed to multilayer or Three Dimensional Integrated Circuit (3D IC) devices and fabrication methods.

In one aspect, an Integrated Circuit device, including: a base wafer including single crystal, the base wafer including a plurality of first transistors; at least one metal layer providing interconnection between the plurality of first transistors; a second layer including a plurality of second transistors, the second layer overlying the at least one metal layer; where the second transistors are aligned to the first transistors with a less than about 40 nm alignment error, and where at least one of the second transistors include a back-bias structure.

In another aspect, an Integrated Circuit device, including: a base wafer including single crystal, the base wafer including a plurality of first transistors; at least one metal layer providing interconnection between the plurality of first transistors; a second layer of less than 2 micron thickness, the second layer including a plurality of second transistors, the second layer overlying the at least one metal layer; where the second transistors are aligned to the first transistors with a less than about 40 nm alignment error, and at least one conductive structure constructed to provide power to a portion of the second transistors, where the provide power is controlled by at least one of the second transistors.

In another aspect, an Integrated Circuit device, including: a base wafer including single crystal, the base wafer including a plurality of first transistors; at least one metal layer providing interconnection between the plurality of first transistors; a first wire structure constructed to provide power to a portion of the first transistors; a second layer of less than 2 micron thickness, the second layer including a plurality of second single crystal transistors, the second layer overlying the at least one metal layer; and second wire structure constructed to provide power to a portion of the second transistors, wherein the second wire structure is isolated from the first wire structure to provide a different power voltage to the portion of the second transistors.

In another aspect, an Integrated Circuit device, including: a base wafer including single crystal, the base wafer including a plurality of first transistors; at least one metal layer providing interconnection between the plurality of first transistors; a second layer of less than 2 micron thickness, the second layer including a plurality of second transistors, the second layer overlying the at least one metal layer; and at least one conductive structure constructed to provide power to a portion of the second transistors, wherein the provide power is controlled by at least one of the transistors.

In another aspect, an Integrated Circuit device, including: a base wafer including single crystal, the base wafer including a plurality of first transistors; at least one metal layer providing interconnection between the plurality of first transistors; a second layer of less than 2 micron thickness, the second layer including a plurality of second transistors, the second layer overlying the at least one metal layer, wherein the plurality of second transistors include single crystal; a plurality of conductive pads, wherein at least one of the conductive pads overlays at least one of the second transistors; and at least one I/O circuit, wherein the at least one I/O circuit is adapted to interface with external devices through at least one of the plurality of conductive pads.

BRIEF DESCRIPTION OF THE DRAWINGS

Various embodiments of the invention will be understood and appreciated more fully from the following detailed description, taken in conjunction with the drawings in which:

FIG. 6 is an exemplary drawing illustration of a partitioning of a circuit design into three layers of a 3D-IC;

FIG. 7 is an exemplary drawing illustration of a carrier substrate with an integrated heat sink/spreader and/or optically reflective layer;

FIGS. 8A-8G are exemplary drawing illustrations of the integration of a shield/heat sink layer in a 3D-IC;

FIGS. 9A-9D are exemplary drawing illustrations of at least one layer of connections below a layer of transistors, and macro-cell formation;

FIGS. 10A and 10B are exemplary drawing illustrations of at least one layer of connections under a transistor layer and over a transistor layer, and macro-cell formation;

FIGS. 11A-11H are exemplary drawing illustrations of a process flow for manufacturing fully depleted MOSFET (FD-MOSFET) with an integrated shield/heat sink layer; and FIGS. 12A-12G are exemplary drawing illustrations of another process flow for manufacturing fully depleted MOSFET (FD-MOSFET) with an integrated shield/heat sink layer.

DETAILED DESCRIPTION

Figure 1:
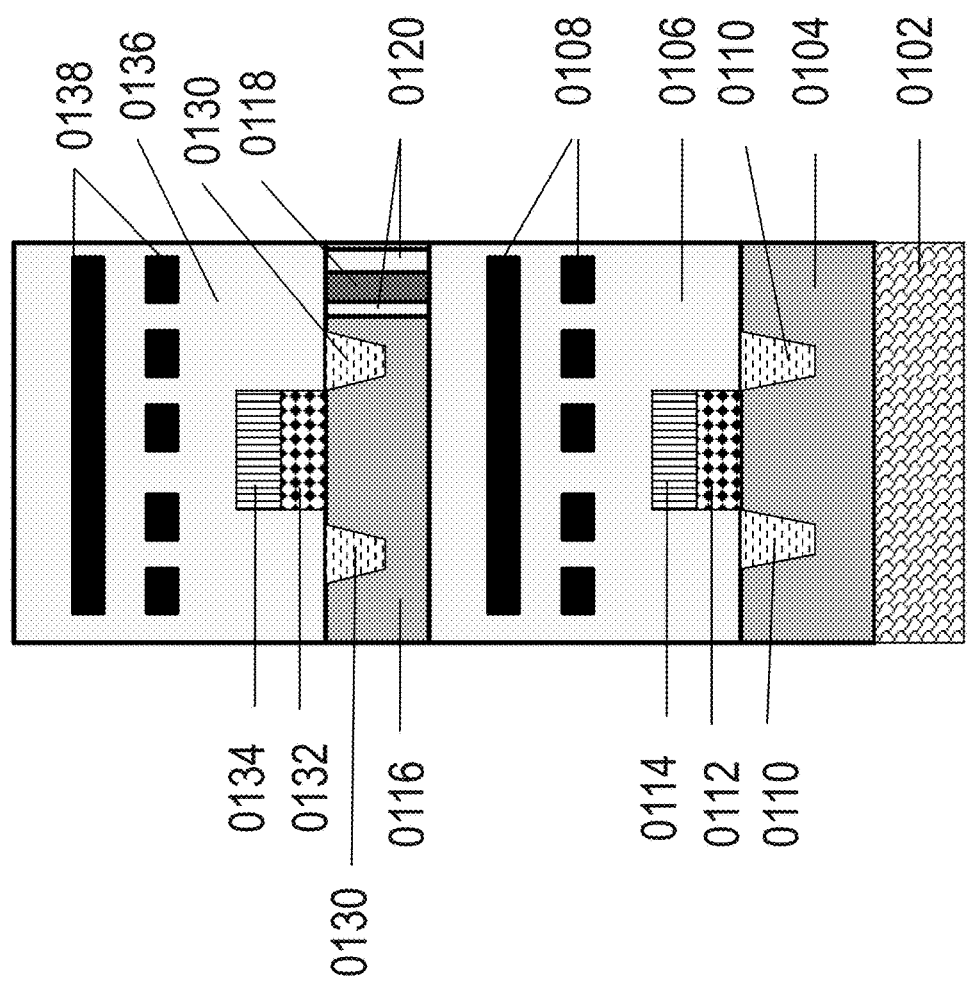
FIG. 1 is an exemplary drawing illustration of a 3D integrated circuit.

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

FIG. 1 illustrates a 3D integrated circuit. Two crystalline layers, 0104 and 0116, which may include semiconductor materials such as, for example, mono-crystalline silicon, germanium, GaAs, InP, and graphene, are shown. For this illustration, mono-crystalline (single crystal) silicon may be used. Silicon layer 0116 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0104 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0104 may also be of thicknesses greater than 100 um, depending on, for example, the strength of bonding to heat removal apparatus 0102. Silicon layer 0104 may include transistors such as, for example, MOSFETS, FinFets, BJTs, HEMTs, HBTs, which may include gate electrode region 0114, gate dielectric region 0112, source and drain junction regions (not shown), and shallow trench isolation (STI) regions 0110. Silicon layer 0116 may include transistors such as, for example, MOSFETS, FinFets, BJTs, HEMTs, HBTs, which may include gate electrode region 0134, gate dielectric region 0132, source and drain junction regions (not shown), and shallow trench isolation (STI) regions 0130. A through-silicon via (TSV) 0118 could be present and may have an associated surrounding dielectric region 0120. Wiring layers 0108 for silicon layer 0104 and wiring dielectric regions 0106 may be present and may form an associated interconnect layer or layers. Wiring layers 0138 for silicon layer 0116 and wiring dielectric 0136 may be present and may form an associated interconnect layer or layers. Through-silicon via (TSV) 0118 may connect to wiring layers 0108 and wiring layers 0138 (not shown). The heat removal apparatus 0102 may include a heat spreader and/or a heat sink. The heat removal problem for the 3D integrated circuit shown in FIG. 1 is immediately apparent. The silicon layer 0116 is far away from the heat removal apparatus 0102, and it may be difficult to transfer heat among silicon layer 0116 and heat removal apparatus 0102. Furthermore, wiring dielectric regions 0106 may not conduct heat well, and this increases the thermal resistance among silicon layer 0116 and heat removal apparatus 0102. Silicon layer 0104 and silicon layer 0116 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0102 may include an external surface from which heat transfer may take place by methods such as air cooling, liquid cooling, or attachment to another heat sink or heat spreader structure.

Figure 2:
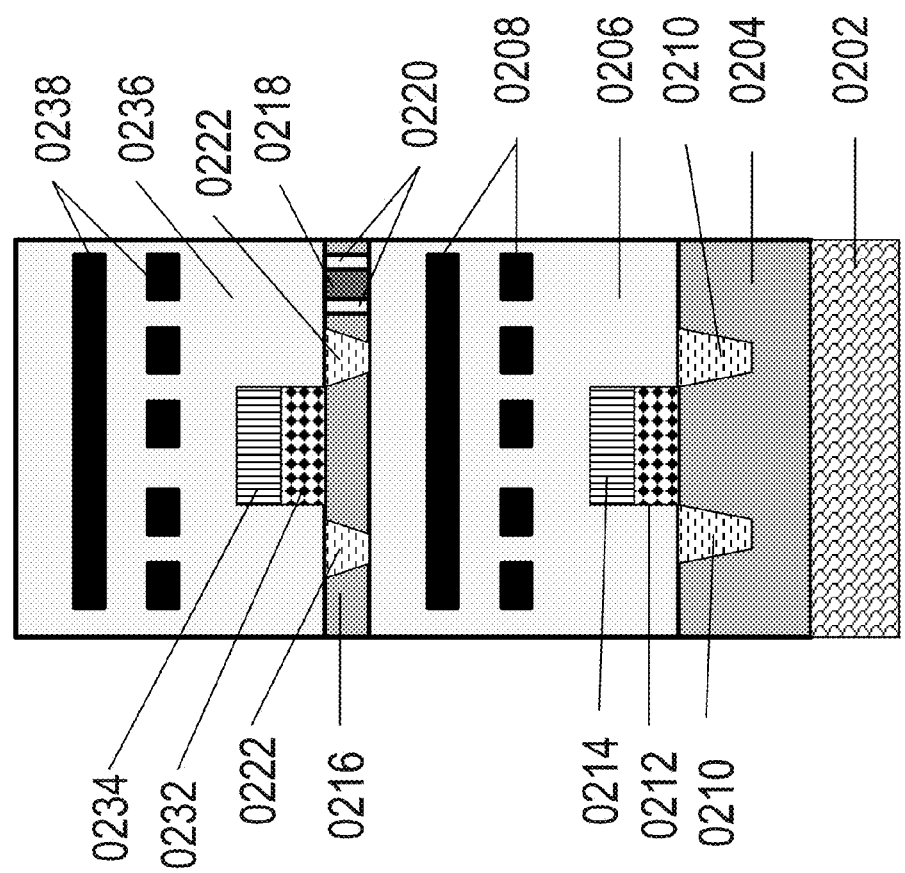
FIG. 2 is an exemplary drawing illustration of another 3D integrated circuit.

FIG. 2 illustrates an exemplary 3D integrated circuit that could be constructed, for example, using techniques described in U.S. Pat. Nos. 8,273,610, 8,557,632, and 8,581,349. The contents of the foregoing patent and applications are incorporated herein by reference. Two crystalline layers, 0204 and 0216, which may include semiconductor materials such as, for example, mono-crystalline silicon, germanium, GaAs, InP, and graphene, are shown. For this illustration, mono-crystalline (single crystal) silicon may be used. Silicon layer 0216 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0204 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0204 may also be of thicknesses greater than 100 um, depending on, for example, the strength of bonding to heat removal apparatus 0202. Silicon layer 0204 may include transistors such as, for example, MOSFETS, FinFets, BJTs, HEMTs, HBTs, which may include gate electrode region 0214, gate dielectric region 0212, source and drain junction regions (not shown for clarity) and shallow trench isolation (STI) regions 0210. Silicon layer 0216 may include transistors such as, for example, MOSFETS, FinFets, BJTs, HEMTs, HBTs, which may include gate electrode region 0234, gate dielectric region 0232, source and drain junction regions (not shown for clarity), and shallow trench isolation (STI) regions 0222. It can be observed that the STI regions 0222 can go right through to the bottom of silicon layer 0216 and provide good electrical isolation. This, however, may cause challenges for heat removal from the STI surrounded transistors since STI regions 0222 are typically composed of insulators that do not conduct heat well. Therefore, the heat spreading capabilities of silicon layer 0216 with STI regions 0222 are low. A through-layer via (TLV) 0218 may be present and may include an associated surrounding dielectric region 0220. Wiring layers 0208 for silicon layer 0204 and wiring dielectric regions 0206 may be present and may form an associated interconnect layer or layers. Wiring layers 0238 for silicon layer 0216 and wiring dielectric 0236 may be present and may form an associated interconnect layer or layers. Through-layer via (TLV) 0218 may connect to wiring layers 0208 and wiring layers 0238 (not shown). The heat removal apparatus 0202 may include a heat spreader and/or a heat sink. The heat removal problem for the 3D integrated circuit shown in FIG. 2 is immediately apparent. The silicon layer 0216 may be far away from the heat removal apparatus 0202, and it may be difficult to transfer heat among silicon layer 0216 and heat removal apparatus 0202. Furthermore, wiring dielectric regions 0206 may not conduct heat well, and this increases the thermal resistance among silicon layer 0216 and heat removal apparatus 0202. The heat removal challenge is further exacerbated by the poor heat spreading properties of silicon layer 0216 with STI regions 0222. Silicon layer 0204 and silicon layer 0216 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0202 may include an external surface from which heat transfer may take place by methods such as air cooling, liquid cooling, or attachment to another heat sink or heat spreader structure.

Figure 3:
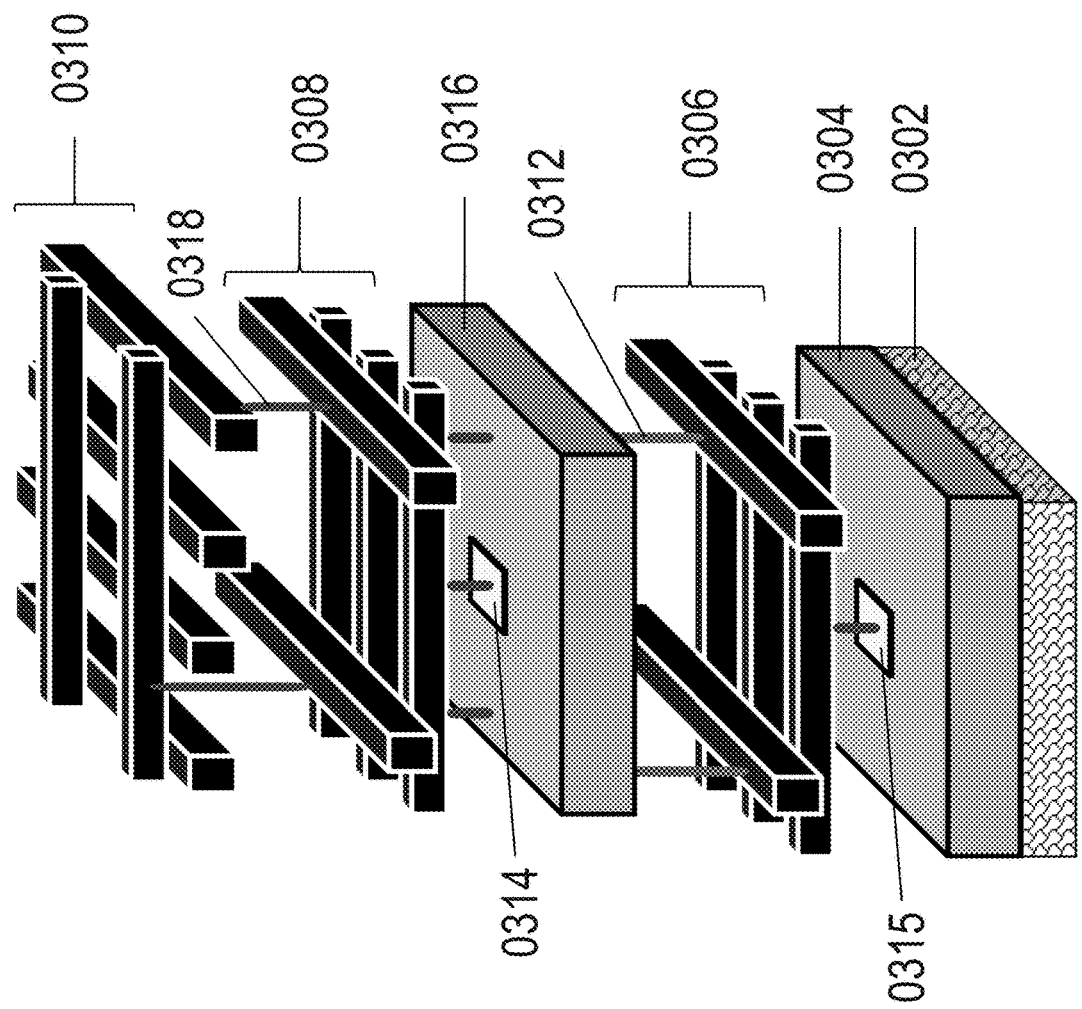
FIG. 3 is an exemplary drawing illustration of the power distribution network of a 3D integrated circuit.

FIG. 3 illustrates how the power or ground distribution network of a 3D integrated circuit could assist heat removal. FIG. 3 illustrates an exemplary power distribution network or structure of the 3D integrated circuit. As shown in FIGS. 1 and 2, a 3D integrated circuit, could, for example, be constructed with two silicon layers, first silicon layer 0304 and second silicon layer 0316. The heat removal apparatus 0302 could include, for example, a heat spreader and/or a heat sink. The power distribution network or structure could consist of a global power grid 0310 that takes the supply voltage (denoted as $V_{DD}$) from the chip/circuit power pads and transfers $V_{DD}$ to second local power grid 0308 and first local power grid 0306, which transfers the supply voltage to logic/memory cells, transistors, and/or gates such as second transistor 0314 and first transistor 0315. Second layer vias 0318 and first layer vias 0312, such as the previously described TSV or TLV, could be used to transfer the supply voltage from the global power grid 0310 to second local power grid 0308 and first local power grid 0306. The global power grid 0310 may also be present among first silicon layer 0304 and second silicon layer 0316. The 3D integrated circuit could have a similarly designed and laid-out distribution networks, such as for ground and other supply voltages, as well. The power grid may be designed and constructed such that each layer or strata of transistors and devices may be supplied with a different value Vdd. For example, first silicon layer 0304 may be supplied by its power grid to have a Vdd value of 1.0 volts and second silicon layer 0316 a Vdd value of 0.8 volts. Furthermore, the global power grid 0310 wires may be constructed with substantially higher conductivity, for example 30% higher, 50% higher, 2× higher, than local power grids, for example, such as first local power grid 0306 wires and second local power grid 0308 wires. The thickness, linewidth, and material composition for the global power grid 0310 wires may provide for the higher conductivity, for example, the thickness of the global power grid 0310 wires may be twice that of the local power grid wires and/or the linewidth of the global power grid 0310 wires may be 2× that of the local power grid wires. Moreover, the global power grid 0310 may be optimally located in the top strata or layer of transistors and devices.

Typically, many contacts may be made among the supply and ground distribution networks and first silicon layer 0304. Due to this, there could exist a low thermal resistance among the power/ground distribution network and the heat removal apparatus 0302. Since power/ground distribution networks may be typically constructed of conductive metals and could have low effective electrical resistance, the power/ground distribution networks could have a low thermal resistance as well. Each logic/memory cell or gate on the 3D integrated circuit (such as, for example, second transistor 0314) is typically connected to $V_{DD}$ and ground, and therefore could have contacts to the power and ground distribution network. The contacts could help transfer heat efficiently (for example, with low thermal resistance) from each logic/memory cell or gate on the 3D integrated circuit (such as, for example, second transistor 0314) to the heat removal apparatus 0302 through the power/ground distribution network and the silicon layer 0304. Silicon layer 0304 and silicon layer 0316 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0302 may include an external surface from which heat transfer may take place by methods such as air cooling, liquid cooling, or attachment to another heat sink or heat spreader structure.

While the previous paragraph described how an existing power distribution network or structure can transfer heat efficiently from logic/memory cells or gates in 3D-ICs to their heat sink, many techniques to enhance this heat transfer capability will be described herein. Many embodiments of the invention can provide several benefits, including lower thermal resistance and the ability to cool higher power 3D-ICs. As well, thermal contacts may provide mechanical stability and structural strength to low-k Back End Of Line (BEOL) structures, which may need to accommodate shear forces, such as from CMP and/or cleaving processes. The heat transfer capability enhancement techniques may be useful and applied to different methodologies and implementations of 3D-ICs, including monolithic 3D-ICs and TSV-based 3D-ICs. The heat removal apparatus employed, which may include heat sinks and heat spreaders, may include an external surface from which heat transfer may take place by methods such as air cooling, liquid cooling, or attachment to another heat sink or heat spreader structure.

Figure 4:
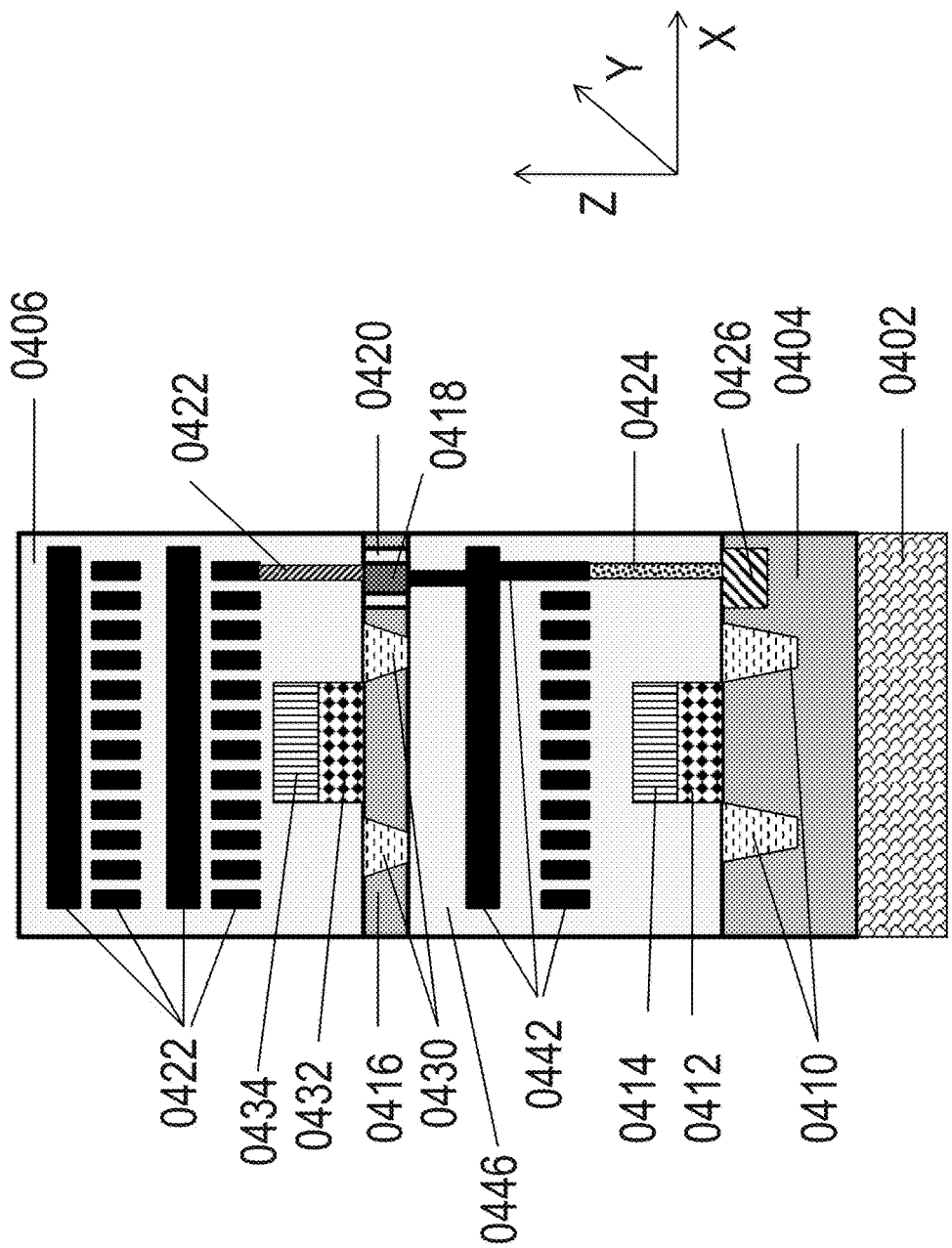
FIG. 4 is an exemplary drawing illustration of a thermal contact concept.
Figure 5:
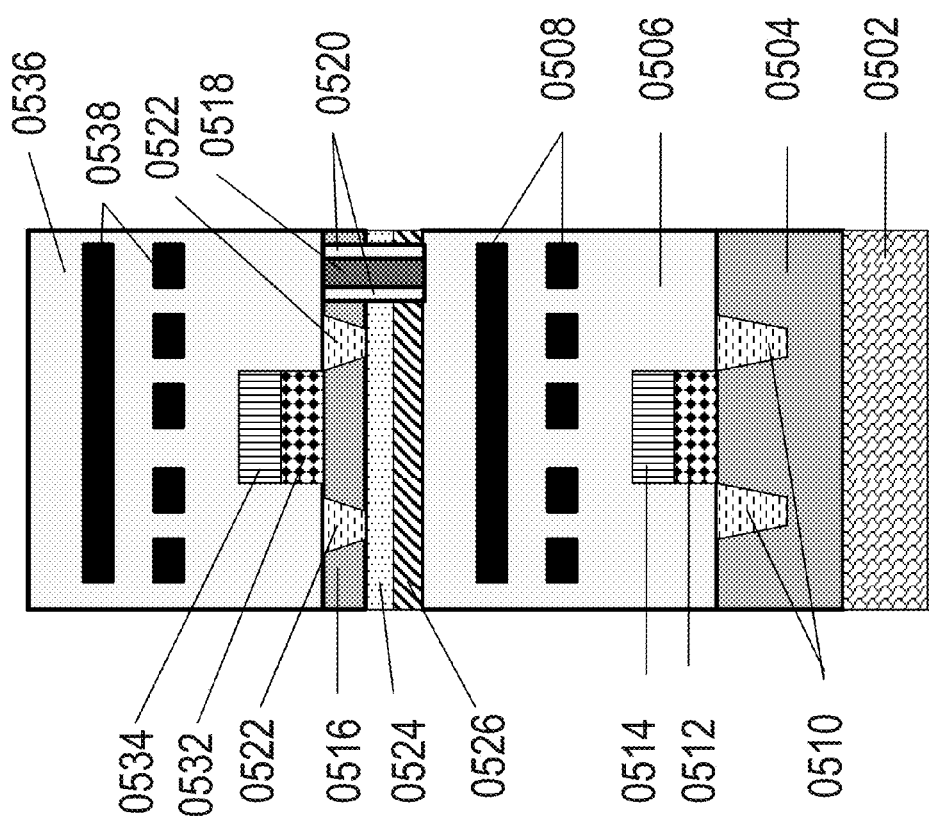
FIG. 5 is an exemplary drawing illustration of the use of heat spreaders in 3D stacked device layers.

FIG. 4 illustrates an embodiment of the invention, wherein thermal contacts in a 3D-IC is described. The 3D-IC and associated power and ground distribution network may be formed as described in FIGS. 1, 2, 3 herein. For example, two crystalline layers, 0404 and 0416, which may include semiconductor materials such as, for example, mono-crystalline silicon, germanium, GaAs, InP, and graphene, may have transistors. For this illustration, mono-crystalline (single crystal) silicon may be used. Silicon layer 0416 could be thinned down from its original thickness, and its final thickness could be in the range of about 0.01 um to about 50 um, for example, 10 nm, 100 nm, 200 nm, 0.4 um, 1 um, 2 um or 5 um. Silicon layer 0404 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0404 may also be of thicknesses greater than 100 um, depending on, for example, the strength of bonding to heat removal apparatus 0402. Silicon layer 0404 may include transistors such as, for example, MOSFETS, FinFets, BJTs, HEMTs, HBTs, which may include STI regions 0410, gate dielectric regions 0412, gate electrode regions 0414 and several other regions that may be necessary for transistors such as source and drain junction regions (not shown for clarity). Silicon layer 0416 may include transistors such as, for example, MOSFETS, FinFets, BJTs, HEMTs, HBTs, which may include STI regions 0430, gate dielectric regions 0432, gate electrode regions 0434 and several other regions that may be necessary for transistors such as source and drain junction regions (not shown for clarity). Heat removal apparatus 0402 may include, for example, heat spreaders and/or heat sinks. In the example shown in FIG. 5, silicon layer 0404 is closer to the heat removal apparatus 0402 than other silicon layers such as silicon layer 0416. Wiring layers 0442 for silicon layer 0404 and wiring dielectric 0446 may be present and may form an associated interconnect layer or layers. Wiring layers 0422 for silicon layer 0416 and wiring dielectric 0406 may be present and may form an associated interconnect layer or layers. Through-layer vias (TLVs) 0418 for power delivery and interconnect and their associated dielectric regions 0420 are shown. Dielectric regions 0420 may include STI regions, such as STI regions 0430. A thermal contact 0424 may connect the local power distribution network or structure to the silicon layer 0404. The local power distribution network or structure may include wiring layers 0442 used for transistors in the silicon layer 0404. Thermal junction region 0426 can be, for example, a doped or undoped region of silicon, and further details of thermal junction region 0426 will be given in FIG. 6 of the incorporated parent application. The thermal contact 0424 can be suitably placed close to the corresponding through-layer via 0418; this helps transfer heat efficiently as a thermal conduction path from the through-layer via 0418 to thermal junction region 0426 and silicon layer 0404 and ultimately to the heat removal apparatus 0402. For example, the thermal contact 0424 could be located within approximately 2 um distance of the through-layer via 0418 in the X-Y plane (the through-layer via 0418 vertical length direction is considered the Z plane in FIG. 4). While the thermal contact 0424 is described above as being between the power distribution network or structure and the silicon layer closest to the heat removal apparatus, it could also be between the ground distribution network and the silicon layer closest to the heat sink. Furthermore, more than one thermal contact 0424 can be placed close to the through-layer via 0418. The thermal contacts can improve heat transfer from transistors located in higher layers of silicon such as silicon layer 0416 to the heat removal apparatus 0402. While mono-crystalline silicon has been mentioned as the transistor material in this document, other options are possible including, for example, poly-crystalline silicon, mono-crystalline germanium, mono-crystalline III-V semiconductors, graphene, and various other semiconductor materials with which devices, such as transistors, may be constructed within. Moreover, thermal contacts and vias may not be stacked in a vertical line through multiple stacks, layers, strata of circuits. Thermal contacts and vias may include materials such as sp2 carbon as conducting and sp3 carbon as non-conducting of electrical current. Thermal contacts and vias may include materials such as carbon nano-tubes. Thermal contacts and vias may include materials such as, for example, copper, aluminum, tungsten, titanium, tantalum, cobalt metals and/or silicides of the metals. Silicon layer 0404 and silicon layer 0416 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0402 may include an external surface from which heat transfer may take place by methods such as air cooling, liquid cooling, or attachment to another heat sink or heat spreader structure.

A thermal connection may be defined as the combination of a thermal contact and a thermal junction. The thermal connections illustrated in FIG. 6, FIG. 7 of the incorporated parent application and other figures in this document are designed into a chip to remove heat, and are designed to not conduct electricity. Essentially, a semiconductor device including power distribution wires is described wherein some of said wires have a thermal connection designed to conduct heat to the semiconductor layer and the wires do not substantially conduct electricity through the thermal connection to the semiconductor layer.

Thermal contacts similar to those illustrated in FIG. 6 and FIG. 7 of the incorporated parent application can be used in the white spaces of a design, for example, locations of a design where logic gates or other useful functionality may not be present. The thermal contacts may connect white-space silicon regions to power and/or ground distribution networks. Thermal resistance to the heat removal apparatus can be reduced with this approach. Connections among silicon regions and power/ground distribution networks can be used for various device layers in the 3D stack, and may not be restricted to the device layer closest to the heat removal apparatus. A Schottky contact or diode may also be utilized for a thermal contact and thermal junction. Moreover, thermal contacts and vias may not have to be stacked in a vertical line through multiple stacks, layers, strata of circuits.

FIG. 8 illustrates an embodiment of the invention, which can provide enhanced heat removal from 3D-ICs by integrating heat spreader regions in stacked device layers. The 3D-IC and associated power and ground distribution network may be formed as described in FIGS. 1, 2, 3 herein. For example, two crystalline layers, 0504 and 0516, which may include semiconductor materials such as, for example, mono-crystalline silicon, germanium, GaAs, InP, and graphene, are shown. For this illustration, mono-crystalline (single crystal) silicon may be used. Silicon layer 0516 could be thinned from its original thickness, and its final thickness could be in the range of about 0.01 um to about 50 um, for example, 10 nm, 100 nm, 200 nm, 0.4 um, 1 um, 2 um or 5 um. Silicon layer 0504 could be thinned down from its original thickness, and its final thickness could be in the range of about 0.01 um to about 50 um, for example, 10 nm, 100 nm, 200 nm, 0.4 um, 1 um, 2 um or 5 um; however, due to strength considerations, silicon layer 0504 may also be of thicknesses greater than 100 um, depending on, for example, the strength of bonding to heat removal apparatus 0502. Silicon layer 0504 may include transistors such as, for example, MOSFETS, FinFets, BJTs, HEMTs, HBTs, which may include gate electrode region 0514, gate dielectric region 0512, shallow trench isolation (STI) regions 0510 and several other regions that may be necessary for transistors such as source and drain junction regions (not shown for clarity). Silicon layer 0516 may include transistors such as, for example, MOSFETS, FinFets, BJTs, HEMTs, HBTs, which may include gate electrode region 0534, gate dielectric region 0532, shallow trench isolation (STI) regions 0522 and several other regions that may be necessary for transistors such as source and drain junction regions (not shown for clarity). A through-layer via (TLV) 0518 may be present and may include an associated surrounding dielectric region 0520. Wiring layers 0508 for silicon layer 0504 and wiring dielectric 0506 may be present and may form an associated interconnect layer or layers. Wiring layers 0538 for silicon layer 0516 and wiring dielectric 0536 may be present and may form an associated interconnect layer or layers. Through-layer via (TLV) 0518 may connect to wiring layers 0508 and wiring layers 0538 (not shown). The heat removal apparatus 0502 may include, for example, a heat spreader and/or a heat sink. It can be observed that the STI regions 0522 can go right through to the bottom of silicon layer 0516 and provide good electrical isolation. This, however, may cause challenges for heat removal from the STI surrounded transistors since STI regions 0522 are typically composed of insulators that do not conduct heat well. The buried oxide layer 0524 typically does not conduct heat well. To tackle heat removal issues with the structure shown in FIG. 5, a heat spreader 0526 may be integrated into the 3D stack. The heat spreader 0526 material may include, for example, copper, aluminum, graphene, diamond, carbon or any other material with a high thermal conductivity (defined as greater than 10 W/m-K). While the heat spreader concept for 3D-ICs is described with an architecture similar to FIG. 2, similar heat spreader concepts could be used for architectures similar to FIG. 1, and also for other 3D IC architectures. Silicon layer 0504 and silicon layer 0516 may be may be substantially absent of semiconductor dopants to form an undoped silicon region or layer, or doped, such as, for example, with elemental or compound species that form a p+, or p, or p−, or n+, or n, or n− silicon layer or region. The heat removal apparatus 0502 may include an external surface from which heat transfer may take place by methods such as air cooling, liquid cooling, or attachment to another heat sink or heat spreader structure.

Three dimensional devices offer a new possibility of partitioning designs into multiple layers or strata based various criteria, such as, for example, routing demands of device blocks in a design, lithographic process nodes, speed, cost, and density. Many of the criteria are illustrated in at least FIGS. 13, 210-215, and 239 and related specification sections in U.S. Pat. No. 8,273,610, the contents are incorporated herein by reference. An additional criterion for partitioning decision-making may be one of trading cost for process complexity/attainment. For example, spacer based patterning techniques, wherein a lithographic critical dimension can be replicated smaller than the original image by single or multiple spacer depositions, spacer etches, and subsequent image (photoresist or prior spacer) removal, are becoming necessary in the industry to pattern smaller linewidths while still using the longer wavelength steppers and imagers. Other double, triple, and quad patterning techniques, such as pattern and cut, may also be utilized to overcome the lithographic constraints of the current imaging equipment. However, the spacer based and multiple patterning techniques are expensive to process and yield, and generally may be constraining to design and layout: they generally may require regular patterns, sometimes substantially all parallel lines. An embodiment of the invention is to partition a design into those blocks and components that may be amenable and efficiently constructed by the above expensive patterning techniques onto one or more layers in the 3D-IC, and partition the other blocks and components of the design onto different layers in the 3D-IC. As illustrated in FIG. 6, third layer of circuits and transistors 604 may be stacked on top of second layer of circuits and transistors 602, which may be stacked on top of first layer/substrate of circuits and transistors 600. The formation of, stacking, and interconnect within and between the three layers may be done by techniques described herein, in the incorporated by reference documents, or any other 3DIC stacking technique that can form vertical interconnects of a density greater than 10,000 vias/cm². Partitioning of the overall device between the three layers may, for example, consist of the first layer/substrate of circuits and transistors 600 including the portion of the overall design wherein the blocks and components do not require the expensive patterning techniques discussed above; and second layer of circuits and transistors 602 may include a portion of the overall design wherein the blocks and components may lead to the expensive patterning techniques discussed above, and may be aligned in, for example, the 'x' direction, and third layer of circuits and transistors 604 may include a portion of the overall design wherein the blocks and components may lead to the expensive patterning techniques discussed above, and may be aligned in a direction different from second layer of circuits and transistors 602, for example, the 'y' direction (perpendicular to the second layer's pattern). The partitioning constraint discussed above related to process complexity/attainment may be utilized in combination with other partitioning constraints to provide an optimized fit to the design's logic and cost demands. For example, the procedure and algorithm (illustrated in FIG. 239 and related specification found in the referenced patent document) to partition a design into two target technologies may be adapted to also include the constraints and criterion described herein FIG. 6.

A large portion of the circuit designs currently are layed-out in a 'Manhattan' style framework, wherein the lines, spaces and connections are in orthogonal Cartesian relationships. Some designs recently have been layed-out in a diagonal, or 45 degree fashion, commonly known as the 'X Architecture'. However, to mix both styles, X and Manhattan, on one chip in 2D has been problematic. Too much area is lost due to the clash between layout styles/frameworks. An embodiment of the invention is to partition a design into those blocks and components that may be amenable and efficiently constructed by placing substantially only Manhattan style layouts onto one or more layers in the 3D-IC, and partition the other blocks and components of the design that may be amenable and efficiently constructed using substantially only X-architecture layouts onto different layers in the 3D-IC. As illustrated in FIG. 6, third layer of circuits and transistors 604 may be stacked on top of second layer of circuits and transistors 602, which may be stacked on top of first layer/substrate of circuits and transistors 600. The formation of, stacking, and interconnect within and between the three layers may be done by techniques described herein, in the incorporated by reference documents, or any other 3DIC stacking technique that can form vertical interconnects of a density greater than 10,000 vias/cm², or may be formed with conventional TSVs of lessor density. Partitioning of the overall device between the three layers may, for example, consist of the first layer/substrate of circuits and transistors 600 including the portion of the overall design wherein the blocks and components are layed-out in Manhattan style; and second layer of circuits and transistors 602 may include a portion of the overall design wherein the blocks and components may be layed-out in an X Architecture style, and third layer of circuits and transistors 604 may include a portion of the overall design wherein the blocks and components may be layed-out in Manhattan style. The partitioning constraint discussed above related to layout style/framework may be utilized in combination with other partitioning constraints to provide an optimized fit to the design's logic and cost demands. For example, the procedure and algorithm (illustrated in FIG. 239 and related specification found in the referenced patent document) to partition a design into two target technologies may be adapted to also include the constraints and criterion described herein FIG. 6.

Ion implantation damage repair, and transferred layer annealing, such as activating doping, may utilize carrier wafer liftoff techniques as illustrated in at least FIGS. 184-189 and related specification sections in U.S. Pat. No. 8,273,610, the contents are incorporated herein by reference. High temperature glass carrier substrates/wafers may be utilized, but may locally be structurally damaged or de-bond from the layer being annealed when exposed to LSA (laser spike annealing) or other optical anneal techniques that may locally exceed the softening or outgassing temperature threshold of the glass carrier. An embodiment of the invention is to improve the heat-sinking capability and structural strength of the glass carrier by inserting a layer of a material that may have a greater heat capacity and/or heat spreading capability than glass or fused quartz, and may have an optically reflective property, for example, aluminum, tungsten or forms of carbon such as carbon nanotubes. As illustrated in FIG. 7, carrier substrate 799 may include substrate 700, heat sink reflector material 702, bonding material 704, and desired transfer layer 706. Substrate 700 may include, for example, monocrystalline silicon wafers, high temperature glass or fused quartz wafers/substrates, germanium wafers, InP wafers, or high temperature polymer substrates. Substrate 700 may have a thickness greater than about 50 um, such as 100 um, 1000 um, 1 mm, 2 mm, 5 mm to supply structural integrity for the subsequent processing. Heat sink reflector material 702 may include material that may have a greater heat capacity and/or heat spreading capability than glass or fused quartz, and may have an optically reflective property, for example, aluminum, tungsten, silicon based silicides, or forms of carbon such as carbon nanotubes. Bonding material 704 may include silicon oxides, indium tin oxides, fused quartz, high temperature glasses, and other optically transparent to the LSA beam or optical annealing wavelength materials. Bonding material 704 may have a thickness greater than about 5 nm, such as 10 nm, 20 nm, 100 nm, 200 nm, 300 nm, 500 nm. Desired transfer layer 706 may include any layer transfer devices and/or layer or layers contained herein this document or the incorporated referenced documents, for example, the gate-last partial transistor layers, DRAM $Si/SiO_2$ layers, sub-stack layers of circuitry, RCAT doped layers, or starting material doped monocrystalline silicon. Carrier substrate 799 may be exposed to an optical annealing beam, such as, for example, a laser-spike anneal beam from a commercial semiconductor material oriented single or dual-beam laser spike anneal DB-LSA system of Ultratech Inc., San Jose, Calif., USA, or a short pulse laser (such as 160 ns), with 308 nm wavelength, such as offered by Excico of Gennevilliers, France. Optical anneal beam 708 may locally heat desired transfer layer 706 to anneal defects and/or activate dopants. The portion of the optical anneal beam 708 that is not absorbed by desired transfer layer 706 may pass through bonding material 704 and be absorbed and or reflected by heat sink reflector material 702. This may increase the efficiency of the optical anneal/activation of desired transfer layer 706, and may also provide a heat spreading capability so that the temperature of desired transfer layer 706 and bonding material 704 locally near the optical anneal beam 708, and in the beam's immediate past locations, may not exceed the debond temperature of the bonding material 704 to desired transfer layer 706 bond. The annealed and/or activated desired transfer layer 706 may be layer transferred to an acceptor wafer or substrate, as described, for example, in the referenced patent document FIG. 186. Substrate 700, heat sink reflector material 702, and bonding material 704 may be removed/decoupled from desired transfer layer 706 by being etched away or removed during the layer transfer process. The heat removal apparatus, such as heat sinks and heat spreaders, may include an external surface from which heat transfer may take place by methods such as air cooling, liquid cooling, or attachment to another heat sink or heat spreader structure.

Defect annealing, such as furnace thermal or optical annealing, of thin layers of the crystalline materials generally included in 3D-ICs to the temperatures that may lead to substantial dopant activation or defect anneal, for example above 600° C., may damage or melt the underlying metal interconnect layers of the stacked 3D-IC, such as copper or aluminum interconnect layers. An embodiment of the invention is to form 3D-IC structures and devices wherein a heat spreading, heat conducting and/or optically reflecting or absorbent material layer or layers (which may be called a shield) is incorporated between the sensitive metal interconnect layers and the layer or regions being optically irradiated and annealed, or annealed from the top of the 3D-IC stack using other methods. An exemplary generalized process flow is shown in FIGS. 8A-F. An exemplary process flow for an FD-RCAT with an optional integrated heat shield/spreader is shown in FIGS. 34A-34H of the incorporated parent application. An exemplary process flow for a FD-MOSFET with an optional integrated heat shield/spreader is shown in FIGS. 11A-11H herein. An exemplary process flow for a planar fully depleted n-channel MOSFET (FD-MOSFET) with an optional integrated heat shield/spreader and back planes and body bias taps is shown in FIGS. 12A-12G herein. An exemplary process flow for a horizontally oriented JFET or JLT with an optional integrated heat shield/spreader is shown in FIGS. 47A-47H of the incorporated parent application. The 3D-ICs may be constructed in a 3D stacked layer using procedures outlined herein (such as, for example, FIGS. 39, 40, 41) and in U.S. Pat. No. 8,273,610 and U.S. Pat. Nos. 8,557,632 and 8,581,349. The contents of the foregoing applications are incorporated herein by reference. The topside defect anneal may include optical annealing to repair defects in the crystalline 3D-IC layers and regions (which may be caused by the ion-cut implantation process), and may be utilized to activate semiconductor dopants in the crystalline layers or regions of a 3D-IC, such as, for example, LDD, halo, source/drain implants. The 3D-IC may include, for example, stacks formed in a monolithic manner with thin layers or stacks and vertical connection such as TLVs, and stacks formed in an assembly manner with thick (>2 um) layers or stacks and vertical connections such as TSVs. Optical annealing beams or systems, such as, for example, a laser-spike anneal beam from a commercial semiconductor material oriented single or dual-beam continuous wave (CW) laser spike anneal DB-LSA system of Ultratech Inc., San Jose, Calif., USA (10.6 um laser wavelength), or a short pulse laser (such as 160 ns), with 308 nm wavelength, and large area (die or step-field sized, including 1 $cm^2$) irradiation such as offered by Excico of Gennevilliers, France, may be utilized (for example, see Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012). Additionally, the defect anneal may include, for example, laser anneals (such as suggested in Rajendran, B., "Sequential 3D IC Fabrication: Challenges and Prospects", Proceedings of VLSI Multi Level Interconnect Conference 2006, pp. 57-64), Ultrasound Treatments (UST), megasonic treatments, and/or microwave treatments. The topside defect anneal ambient may include, for example, vacuum, high pressure (greater than about 760 torr), oxidizing atmospheres (such as oxygen or partial pressure oxygen), and/or reducing atmospheres (such as nitrogen or argon). The topside defect anneal may include temperatures of the layer being annealed above about 400° C. (a high temperature thermal anneal), including, for example, 600° C., 800° C., 900° C., 1000° C., 1050° C., 1100° C. and/or 1120° C., and the sensitive metal interconnect (for example, may be copper or aluminum containing) and/or device layers below may not be damaged by the annealing process, for example, which may include sustained temperatures that do not exceed 200° C., exceed 300° C., exceed 370° C., or exceed 400° C. As understood by those of ordinary skill in the art, short-timescale (nanosceonds to miliseconds) temperatures above 400° C. may also be acceptable for damage avoidance, depending on the acceptor layer interconnect metal systems used. The topside defect anneal may include activation of semiconductor dopants, such as, for example, ion implanted dopants or PLAD applied dopants. It will also be understood by one of ordinary skill in the art that the methods, such as the heat sink/shield layer and/or use of short pulse and short wavelength optical anneals, may allow almost any type of transistor, for example, such as FinFets, bipolar, nanowire transistors, to be constructed in a monolithic 3D fashion as the thermal limit of damage to the underlying metal interconnect systems is overcome. Moreover, multiple pulses of the laser, other optical annealing techniques, or other anneal treatments such as microwave, may be utilized to improve the anneal, activation, and yield of the process. The transistors formed as described herein may include many types of materials; for example, the channel and/or source and drain may include single crystal materials such as silicon, germanium, or compound semiconductors such as GaAs, InP, GaN, SiGe, and although the structures may be doped with the tailored dopants and concentrations, they may still be substantially crystalline or mono-crystalline.

As illustrated in FIG. 8A, a generalized process flow may begin with a donor wafer 800 that may be preprocessed with wafer sized layers 802 of conducting, semi-conducting or insulating materials that may be formed by deposition, ion implantation and anneal, oxidation, epitaxial growth, combinations of above, or other semiconductor processing steps and methods. For example, donor wafer 800 and wafer sized layers 802 may include semiconductor materials such as, for example, mono-crystalline silicon, germanium, GaAs, InP, and graphene. For this illustration, mono-crystalline (single crystal) silicon and associated silicon oriented processing may be used. The donor wafer 800 may be preprocessed with a layer transfer demarcation plane (shown as dashed line) 899, such as, for example, a hydrogen implant cleave plane, before or after (typical) wafer sized layers 802 are formed. Layer transfer demarcation plane 899 may alternatively be formed within wafer sized layers 802. Other layer transfer processes, some described in the referenced patent documents, may alternatively be utilized. Damage/defects to the crystalline structure of donor wafer 800 may be annealed by some of the annealing methods described, for example the short wavelength pulsed laser techniques, wherein the donor wafer 800 wafer sized layers 802 and portions of donor wafer 800 may be heated to defect annealing temperatures, but the layer transfer demarcation plane 899 may be kept below the temperate for cleaving and/or significant hydrogen diffusion. Dopants in at least a portion of wafer sized layers 802 may also be electrically activated. Thru the processing, donor wafer 800 and/or wafer sized layers 802 could be thinned from its original thickness, and their/its final thickness could be in the range of about 0.01 um to about 50 um, for example, 10 nm, 100 nm, 200 nm, 0.4 um, 1 um, 2 um or 5 um. Donor wafer 800 and wafer sized layers 802 may include preparatory layers for the formation of horizontally or vertically oriented types of transistors such as, for example, MOSFETS, FinFets, FD-RCATs, BJTs, HEMTs, HBTs, JFETs, JLTs, or partially processed transistors (for example, the replacement gate HKMG process described in the referenced patent documents). Donor wafer 800 and wafer sized layers 802 may include the layer transfer devices and/or layer or layers contained herein this document or referenced patent documents, for example, DRAM Si/SiO$_2$ layers, RCAT doped layers, multi-layer doped structures, or starting material doped or undoped monocrystalline silicon, or polycrystalline silicon. Donor wafer 800 and wafer sized layers 802 may have alignment marks (not shown). Acceptor wafer 810 may be a preprocessed wafer, for example, including monocrystalline bulk silicon or SOI, that may have fully functional circuitry including metal layers (including aluminum or copper metal interconnect layers that may connect acceptor wafer 810 transistors and metal structures, such as TLV landing strips and pads, prepared to connect to the transferred layer devices) or may be a wafer with previously transferred layers, or may be a blank carrier or holder wafer, or other kinds of substrates suitable for layer transfer processing. Acceptor wafer 810 may have alignment marks 890 and metal connect pads or strips 880 and ray blocked metal interconnect 881. Acceptor wafer 810 may include transistors such as, for example, MOSFETS, FinFets, FD-RCATs, BJTs, JFETs, JLTs, HEMTs, and/or HBTs. Acceptor wafer 810 may include shield/heat sink layer 888, which may include materials such as, for example, Aluminum, Tungsten (a refractory metal), Copper, silicon or cobalt based silicides, or forms of carbon such as carbon nanotubes or DLC (Diamond Like Carbon). Shield/heat sink layer 888 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 888 may include isolation openings 886, and alignment mark openings 887, which may be utilized for short wavelength alignment of top layer (donor) processing to the acceptor wafer alignment marks 890. Shield/heat sink layer 888 may include shield path connect 885 and shield path via 883. Shield path via 883 may thermally and/or electrically couple and connect shield path connect 885 to acceptor wafer 810 interconnect metallization layers such as, for example, metal connect pads or strips 880 (shown). If two shield/heat sink layers 888 are utilized, one on top of the other and separated by an isolation layer common in semiconductor BEOL, such as carbon doped silicon oxide, shield path connect 885 may also thermally and/or electrically couple and connect each shield/heat sink layer 888 to the other and to acceptor wafer 810 interconnect metallization layers such as, for example, metal connect pads or strips 880, thereby creating a heat conduction path from the shield/heat sink layer 888 to the acceptor wafer substrate, and a heat sink (shown in FIG. 8F). The topmost shield/heat sink layer may include a higher melting point material, for example a refractory metal such as Tungsten, and the lower heat shield layer may include a lower melting point material such as copper.

As illustrated in FIG. 8B, two exemplary top views of shield/heat sink layer 888 are shown. In shield/heat sink portion 820 a shield area 822 of the shield/heat sink layer 888 materials described above and in the incorporated references may include TLV/TSV connects 824 and isolation openings 886. Isolation openings 886 may be the absence of the material of shield area 822. TLV/TSV connects 824 are an example of a shield path connect 885. TLV/TSV connects 824 and isolation openings 886 may be drawn in the database of the 3D-IC stack and may formed during the acceptor wafer 810 processing. In shield/heat sink portion 830 a shield area 832 of the shield/heat sink layer 888 materials described above and in the incorporated references may have metal interconnect strips 834 and isolation openings 886. Metal interconnect strips 834 may be surrounded by regions, such as isolation openings 886, where the material of shield area 832 may be etched away, thereby stopping electrical conduction from metal interconnect strips 834 to shield area 832 and to other metal interconnect strips. Metal interconnect strips 834 may be utilized to connect/couple the transistors formed in the donor wafer layers, such as 802, to themselves from the 'backside' or 'underside' and/or to transistors in the acceptor wafer level/layer. Metal interconnect strips 834 and shield/heat sink layer 888 regions such as shield area 822 and shield area 832 may be utilized as a ground plane for the transistors above it residing in the donor wafer layer or layers and/or may be utilized as power supply or back-bias, such as Vdd or Vsb, for the transistors above it residing in the transferred donor wafer layer or layers. The strips and/or regions of shield/heat sink layer 888 may be controlled by second layer transistors when supplying power or other signals such as data or control. For example, as illustrated in FIG. 8G, the topmost shield/heat sink layer 888 may include a topmost shield/heat sink portion 870, which may be configured as fingers or stripes of conductive material, such as top strips 874 and strip isolation spaces 876, which may be utilized, for example, to provide back-bias, power, or ground to the second layer transistors above it residing in the donor wafer layer or layers (for example donor wafer device structures 850). A second shield/heat sink layer 888, below the topmost shield/heat sink layer, may include a second shield/heat sink portion 872, which may be configured as fingers or stripes of conductive material, such as second strips 878 and strip isolation spaces 876, may be oriented in a different direction (although not necessarily so) than the topmost strips, and may be utilized, for example, to provide back-bias, power, or ground to the second layer transistors above it residing in the donor wafer layer or layers (for example donor wafer device structures 850). Openings, such as opening 879, in the topmost shield/heat sink layer may be designed to allow connection from the second layer of transistors to the second shield/heat sink layer, such as from donor wafer device structures 850 to second strips 878. The strips or fingers may be illustrated as orthogonally oriented layer to layer, but may also take other drawn shapes and forms; for example, such as diagonal running shapes as in the X-architecture, overlapping parallel strips, and so on. The portions of the shield/heat sink layer 888 or layers may include a combination of the strip/finger shapes of FIG. 8G and the illustrated via connects and fill-in regions of FIG. 8B.

Bonding surfaces, donor bonding surface 801 and acceptor bonding surface 811, may be prepared for wafer bonding by depositions (such as silicon oxide), polishes, plasma, or wet chemistry treatments to facilitate successful wafer to wafer bonding. The insulation layer, such as deposited bonding oxides and/or before bonding preparation existing oxides, between the donor wafer transferred layer and the acceptor wafer topmost metal layer, may include thicknesses of less than 1 um, less than 500 nm, less than 400 nm, less than 300 nm, less than 200 nm, or less than 100 nm.

Figure 8E:
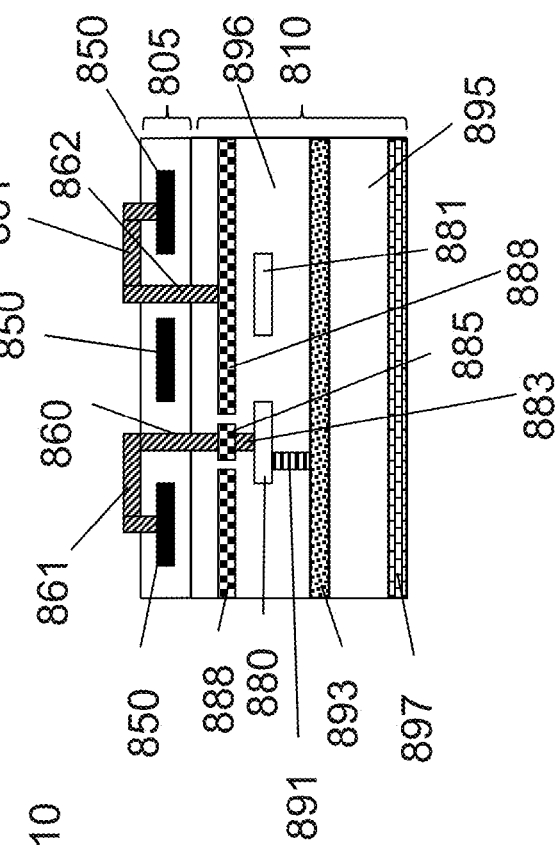

As illustrated in FIG. 8C, the donor wafer 800 with wafer sized layers 802 and layer transfer demarcation plane 899 may be flipped over, aligned, and bonded to the acceptor wafer 810. The donor wafer 800 with wafer sized layers 802 may have alignment marks (not shown). Various topside defect anneals may be utilized. For this illustration, an optical beam such as the laser annealing previously described is used. Optical anneal beams may be optimized to focus light absorption and heat generation at or near the layer transfer demarcation plane (shown as dashed line) 899 to provide a hydrogen bubble cleave with exemplary cleave ray 851. The laser assisted hydrogen bubble cleave with the absorbed heat generated by exemplary cleave ray 851 may also include a pre-heat of the bonded stack to, for example, about 100° C. to about 400° C., and/or a thermal rapid spike to temperatures above about 200° C. to about 600° C. The laser assisted ion-cut cleave may provide a smoother cleave surface upon which better quality transistors may be manufactured. Reflected ray 853 may be reflected and/or absorbed by shield/heat sink layer 888 regions thus blocking the optical absorption of ray blocked metal interconnect 881 and potentially enhancing the efficiency of optical energy absorption of the wafer sized layers 802. Additionally, shield/heat sink layer 888 may laterally spread and conduct the heat generated by the topside defect anneal, and in conjunction with the dielectric materials (low heat conductivity) above and below shield/heat sink layer 888, keep the interconnect metals and low-k dielectrics of the acceptor wafer interconnect layers cooler than a damage temperature, such as, for example, 400° C. Annealing of dopants or annealing of damage, such as from the H cleave implant damage, may be accomplished by optical annealing rays, such as repair ray 855. A small portion of the optical energy, such as unblocked ray 857, may hit and heat, or be reflected, by (a few rays as the area of the heat shield openings, such as 824, is small compared to the die or device area) such as metal connect pads or strips 880. Heat generated by absorbed photons from, for example, cleave ray 851, reflected ray 853, and/or repair ray 855 may also be absorbed by shield/heat sink layer 888 regions and dissipated laterally and may keep the temperature of underlying metal layers, such as ray blocked metal interconnect 881, and other metal layers below it, cooler and prevent damage. Shield/heat sink layer 888 may act as a heat spreader. A second layer of shield/heat sink layer 888 (not shown) may have been constructed (during the acceptor wafer 810 formation) with a low heat conductive material sandwiched between the two heat sink layers, such as silicon oxide or carbon doped 'low-k' silicon oxides, for improved thermal protection of the acceptor wafer interconnect layers, metal and dielectrics. Electrically conductive materials may be used for the two layers of shield/heat sink layer 888 and thus may provide, for example, a Vss and a Vdd plane for power delivery that may be connected to the donor layer transistors above, as well may be connected to the acceptor wafer transistors below. Shield/heat sink layer 888 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 888 may be sandwiched and/or substantially enclosed by materials with a low thermal conductivity less than 10 W/m-K, for example, silicon dioxide (about 1.4 W/m-K). The sandwiching of high and low thermal conductivity materials in layers, such as shield/heat sink layer 888 and under & overlying dielectric layers, spreads the localized heat/light energy of the topside anneal laterally and protect the underlying layers of interconnect metallization & dielectrics, such as in the acceptor wafer, from harmful temperatures or damage. Further, absorber layers or regions, for example, including amorphous carbon, amorphous silicon, and phase changing materials (see U.S. Pat. Nos. 6,635,588 and 6,479,821 to Hawryluk et al. for example), may be utilized to increase the efficiency of the optical energy capture in conversion to heat for the desired annealing or activation processes. For example, pre-processed layers 802 may include a layer or region of optical absorbers such as transferred absorber region 875, acceptor wafer 810 may include a layer or region of optical absorbers such as acceptor absorber region 873, and second device layer 805 may include a layer or region of optical absorbers such as post transfer absorber regions 877 (shown in FIG. 8E). Transferred absorber region 875, acceptor absorber region 873, and/or post transfer absorber regions 877 may be permanent (could be found within the device when manufacturing is complete) or temporary so is removed during the manufacturing process.

As illustrated in FIG. 8D, the donor wafer 800 may be cleaved at or thinned to (or past, not shown) the layer transfer demarcation plane 899, leaving donor wafer portion 803 and the pre-processed layers 802 bonded to the acceptor wafer 810, by methods such as, for example, ion-cut or other layer transfer methods. The layer transfer demarcation plane 899 may instead be placed in the pre-processed layers 802. Optical anneal beams, in conjunction with reflecting layers and regions and absorbing enhancement layers and regions, may be optimized to focus light absorption and heat generation within or at the surface of donor wafer portion 803 and provide surface smoothing and/or defect annealing (defects may be from the cleave and/or the ion-cut implantation), and/or post ion-implant dopant activation with exemplary smoothing/annealing ray 866. The laser assisted smoothing/annealing with the absorbed heat generated by exemplary smoothing/annealing ray 866 may also include a pre-heat of the bonded stack to, for example, about 100° C. to about 400° C., and/or a thermal rapid spike to temperatures above about 200° C. to about 600° C. Moreover, multiple pulses of the laser may be utilized to improve the anneal, activation, and yield of the process. Reflected ray 863 may be reflected and/or absorbed by shield/heat sink layer 888 regions thus blocking the optical absorption of ray blocked metal interconnect 881. Annealing of dopants or annealing of damage, such as from the H cleave implant damage, may be also accomplished by a set of rays such as repair ray 865. A small portion of the optical energy, such as unblocked ray 867, may hit and heat, or be reflected, by a few rays (as the area of the heat shield openings, such as 824, is small) such as metal connect pads or strips 880. Heat generated by absorbed photons from, for example, smoothing/annealing ray 866, reflected ray 863, and/or repair ray 865 may also be absorbed by shield/heat sink layer 888 regions and dissipated laterally and may keep the temperature of underlying metal layers, such as ray blocked metal interconnect 881, and other metal layers below it, cooler and prevent damage. A second layer of shield/heat sink layer 888 may be constructed with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 888 may act as a heat spreader. When there may be more than one shield/heat sink layer 888 in the device, the heat conducting layer closest to the second crystalline layer may be constructed with a different material, for example a high melting point material, for example a refractory metal such as tungsten, than the other heat conducting layer or layers, which may be constructed with, for example, a lower melting point material such as aluminum or copper. Electrically conductive materials may be used for the two layers of shield/heat sink layer 888 and thus may provide, for example, a Vss and a Vdd plane that may be connected to the donor layer transistors above, as well may be connected to the acceptor wafer transistors below. Furthermore, some or all of the layers utilized as shield/heat sink layer 888, which may include shapes of material such as the strips or fingers as illustrated in FIG. 8G, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 888 layer or layers. Moreover, some or all of the layers utilized as shield/heat sink layer 888, which may include strips or fingers as illustrated in FIG. 8G, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 888 layer or layers. The Vsupply on line 17C12 and the control signals on control line 17C16 may be controlled by and/or generated in the second layer transistors (donor, for example donor wafer device structures 850) or first layer transistors (acceptor, for example acceptor wafer transistors and devices 893), or off chip circuits. Furthermore, some or all of the layers utilized as shield/heat sink layer 888, which may include strips or fingers as illustrated in FIG. 8G or other shapes such as those in FIG. 8B, may be utilized to distribute independent power supplies to various portions of the second layer transistors (donor, for example donor wafer device structures 850) or first layer transistors (acceptor, for example acceptor wafer transistors and devices 893) and circuits; for example, one power supply and/or voltage may be routed to the sequential logic circuits of the second layer and a different power supply and/or voltage routed to the combinatorial logic circuits of the second layer. Patterning of shield/heat sink layer 888 or layers can impact their heat-shielding capacity. This impact may be mitigated, for example, by enhancing the top shield/heat sink layer 888 areal density, creating more of the secondary shield/heat sink layers 888, or attending to special CAD rules regarding their metal density, similar to CAD rules that are required to accommodate Chemical-Mechanical Planarization (CMP). These constraints would be integrated into a design and layout EDA tool.

As illustrated in FIG. 8E, the remaining donor wafer portion 803 may be removed by polishing or etching and the transferred layers 802 may be further processed to create second device layer 805 which may include donor wafer device structures 850 and metal interconnect layers (such as second device layer metal interconnect 861) that may be precisely aligned to the acceptor wafer alignment marks 890. Donor wafer device structures 850 may include, for example, CMOS transistors such as N type and P type transistors, or at least any of the other transistor or device types discussed herein this document or referenced patent documents. The details of CMOS in one transferred layer and the orthogonal connect strip methodology may be found as illustrated in at least FIGS. 30-38, 73-80, and 94 and related specification sections of U.S. Pat. No. 8,273,610. As discussed above and herein this document and referenced patent documents, annealing of dopants or annealing of damage, such as from the dopant application such as ion-implantation, or from etch processes during the formation of the transferred layer transistor and device structures, may be accomplished by optical annealing. Donor wafer device structures 850 may include transistors and/or semiconductor regions wherein the dopant concentration of the regions in the horizontal plane, such as shown as exemplary dopant plane 849, may have regions that differ substantially in dopant concentration, for example, 10× greater, and/or may have a different dopant type, such as, for example p-type or n-type dopant. Additionally, the annealing of deposited dielectrics and etch damage, for example, oxide depositions and silicon etches utilized in the transferred layer isolation processing, for example, STI (Shallow Trench Isolation) processing or strained source and drain processing, may be accomplished by optical annealing. Second device layer metal interconnect 861 may include electrically conductive materials such as copper, aluminum, conductive forms of carbon, and tungsten. Donor wafer device structures 850 may utilize second device layer metal interconnect 861 and thru layer vias (TLVs) 860 to electrically couple (connection paths) the donor wafer device structures 850 to the acceptor wafer metal connect pads or strips 880, and thus couple donor wafer device structures (the second layer transistors) with acceptor wafer device structures (first layer transistors). Thermal TLVs 862 may be constructed of thermally conductive but not electrically conductive materials, for example, DLC (Diamond Like Carbon), and may connect donor wafer device structures 850 thermally to shield/heat sink layer 888. TLVs 860 may be constructed out of electrically and thermally conductive materials, such as Tungsten, Copper, or aluminum, and may provide a thermal and electrical connection path from donor wafer device structures 850 to shield/heat sink layer 888, which may be a ground or Vdd plane in the design/layout. TLVs 860 and thermal TLVs 862 may be also constructed in the device scribelanes (pre-designed in base layers or potential dicelines) to provide thermal conduction to the heat sink, and may be sawed/diced off when the wafer is diced for packaging. Shield/heat sink layer 888 may be configured to act as an emf (electro-motive force) shield to prevent direct layer to layer cross-talk between transistors in the donor wafer layer and transistors in the acceptor wafer. In addition to static ground or Vdd biasing, shield/heat sink layer 888 may be actively biased with an anti-interference signal from circuitry residing on, for example, a layer of the 3D-IC or off chip. TLVs 860 may be formed through the transferred layers 802. As the transferred layers 802 may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers 802, the smaller the thru layer via diameter obtainable, which may result from maintaining manufacturable via aspect ratios. Thus, the transferred layers 802 (and hence, TLVs 860) may be, for example, less than about 2 microns thick, less than about 1 micron thick, less than about 0.4 microns thick, less than about 200 nm thick, less than about 150 nm thick, less than about 100 nm thick, less than about 50 nm thick, less than about 20 nm thick, or less than about 5 nm thick. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers. The above TLV dimensions and alignment capability and transferred layer thicknesses may be also applied to any of the discussed TLVs or transferred layers described elsewhere herein. Transferred layers 802 may be considered to be overlying the metal layer or layers of acceptor wafer 810. Alignment marks in acceptor wafer 810 and/or in transferred layers 802 may be utilized to enable reliable contact to transistors and circuitry in transferred layers 802 and donor wafer device structures 850 and electrically couple them to the transistors and circuitry in the acceptor wafer 810. The donor wafer 800 may now also be processed, such as smoothing and annealing, and reused for additional layer transfers. The transferred layers 802 and other additional regions created in the transferred layers during transistor processing are thin and small, having small volumes on the order of $2 \times 10^{-16}$ cm$^3$ ($2 \times 10^5$ nm$^3$ for a 100 nm by 100 nm×20 nm thick device). As a result, the amount of energy to manufacture with known in the art transistor and device formation processing, for example, annealing of ion-cut created defects or activation of dopants and annealing of doping or etching damages, is very small and may lead to only a small amount of shield layer or layers or regions or none to effectively shield the underlying interconnect metallization and dielectrics from the manufacturing processing generated heat. The energy may be supplied by, for example, pulsed and short wavelength optical annealing techniques described herein and incorporated references, and may include the use of optical absorbers and reflectors and optical/thermal shielding and heat spreaders, some of which are described herein and incorporated references.

Figure 8F:
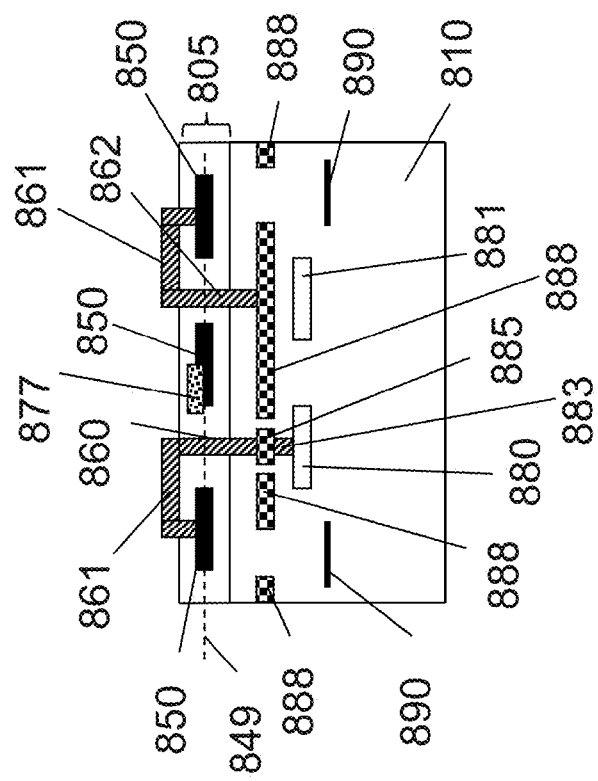

As illustrated in FIG. 8F, a thermal conduction path may be constructed from the devices in the upper layer, the transferred donor layer and formed transistors, to the acceptor wafer substrate and associated heat sink. The thermal conduction path from the donor wafer device structures 850 to the acceptor wafer heat sink 897 may include second device layer metal interconnect 861, TLVs 860, shield path connect 885, shield path via 883, metal connect pads or strips 880, first (acceptor) layer metal interconnect 891, acceptor wafer transistors and devices 893, and acceptor substrate 895. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 895. The elements of the thermal conduction path may include materials that are thermally conductive but may not be substantially electrically conductive, for example, Plasma Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL dielectric 896. In general, within the active device or devices (that are generating the heat that is desired to be conducted away thru at least the thermal conduction path), it would be advantageous to have an effective conduction path to reduce the overall space and area that a designer would allocate for heat transfer out of the active circuitry space and area. A designer may select to use only materials with a high thermal conductivity (such as greater than 10 W/m-K), much higher for example than that for monocrystalline silicon, for the desired thermal conduction path. However, there may need to be lower than desired thermal conductivity materials in the heat conduction path due to requirements such as, for example, the mechanical strength of a thick silicon substrate, or another heat spreader material in the stack. The area and volume allocated to that structure, such as the silicon substrate, is far larger than the active circuit area and volume. Accordingly, since a copper wire of 1 um$^2$ profile is about the same as a 286 um$^2$ profile of a column of silicon, and the thermal conduction path may include both a copper wire/ TLV/via and the bulk silicon substrate, a proper design may take into account and strive to align the different elements of the conductive path to achieve effective heat transfer and removal, for example, may attempt to provide about 286 times the silicon substrate area for each Cu thermal via utilized in the thermal conduction path. The heat removal apparatus, which may include acceptor wafer heat sink 897, may include an external surface from which heat transfer may take place by methods such as air cooling, liquid cooling, or attachment to another heat sink or heat spreader structure.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 8 formation techniques.

A planar fully depleted n-channel MOSFET (FD-MOSFET) with an optional integrated heat shield/spreader suitable for a monolithic 3D IC may be constructed as follows. The FD-MOSFET may provide an improved transistor variability control and conduction channel electrostatic control, as well as the ability to utilize an updoped channel, thereby improving carrier mobility. In addition, the FD-MOSFET does not demand doping or pocket implants in the channel to control the electrostatic characteristics and tune the threshold voltages. Sub-threshold slope, DIBL, and other short channel effects are greatly improved due to the firm gate electrostatic control over the channel. Moreover, a heat spreading, heat conducting and/or optically reflecting material layer or layers may be incorporated between the sensitive metal interconnect layers and the layer or regions being optically irradiated and annealed to repair defects in the crystalline 3D-IC layers and regions and to activate semiconductor dopants in the crystalline layers or regions of a 3D-IC without harm to the sensitive metal interconnect and associated dielectrics. FIG. 11A-11H illustrates an exemplary re-channel FD-MOSFET which may be constructed in a 3D stacked layer using procedures outlined below and in U.S. Pat. No. 8,273,610 and U.S. Pat. Nos. 8,557,632 and 8,581,349. The contents of the foregoing applications are incorporated herein by reference.

As illustrated in FIG. 11A, a P-substrate donor wafer 1100 may be processed to include a wafer sized layer of doping across the wafer. The channel layer 1102 may be formed by ion implantation and thermal anneal P-substrate donor wafer 1100 may include a crystalline material, for example, monocrystalline (single crystal) silicon. P-substrate donor wafer 1100 may be very lightly doped (less than 1e15 atoms/cm$^3$) or nominally un-doped (less than 1e14 atoms/cm$^3$). Channel layer 1102 may have additional ion implantation and anneal processing to provide a different dopant level than P-substrate donor wafer 1100 and may have graded or various layers of doping concentration. The layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The preferred crystalline channel layer 1102 will be undoped to eventually create an FD-MOSFET transistor with an updoped conduction channel.

As illustrated in FIG. 11B, the top surface of the P-substrate donor wafer 1100 layer stack may be prepared for oxide wafer bonding with a deposition of an oxide or by thermal oxidation of channel layer 1102 to form oxide layer 1180. A layer transfer demarcation plane (shown as dashed line) 1199 may be formed by hydrogen implantation or other methods as described in the incorporated references. The P-substrate donor wafer 1100, such as surface 1182, and acceptor wafer 1110 may be prepared for wafer bonding as previously described and low temperature (less than approximately 400° C.) bonded. Acceptor wafer 1110, as described in the incorporated references, may include, for example, transistors, circuitry, and metal, such as, for example, aluminum or copper, interconnect wiring, a metal shield/heat sink layer or layers, and thru layer via metal interconnect strips or pads. Acceptor wafer 1110 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 1110 may include transistors such as, for example, MOSFETS, FD-MOSFETS, FinFets, FD-RCATs, BJTs, HEMTs, and/or HBTs. The portion of the channel layer 1102 and the P-substrate donor wafer 1100 that may be above (when the layer stack is flipped over and bonded to the acceptor wafer 1110) the layer transfer demarcation plane 1199 may be removed by cleaving or other low temperature processes as described in the incorporated references, such as, for example, ion-cut with mechanical or thermal cleave or other layer transfer methods, thus forming remaining channel layer 1103. Damage/defects to crystalline structure of channel layer 1102 may be annealed by some of the annealing methods described, for example the short wavelength pulsed laser techniques, wherein the channel layer 1102 or portions of channel layer 1102 may be heated to defect annealing temperatures, but the layer transfer demarcation plane 1199 may be kept below the temperate for cleaving and/or significant hydrogen diffusion. The optical energy may be deposited in the upper layer of the stack, for example near surface 1182, and annealing of a portion of channel layer 1102 may take place via heat diffusion.

Figure 11C:
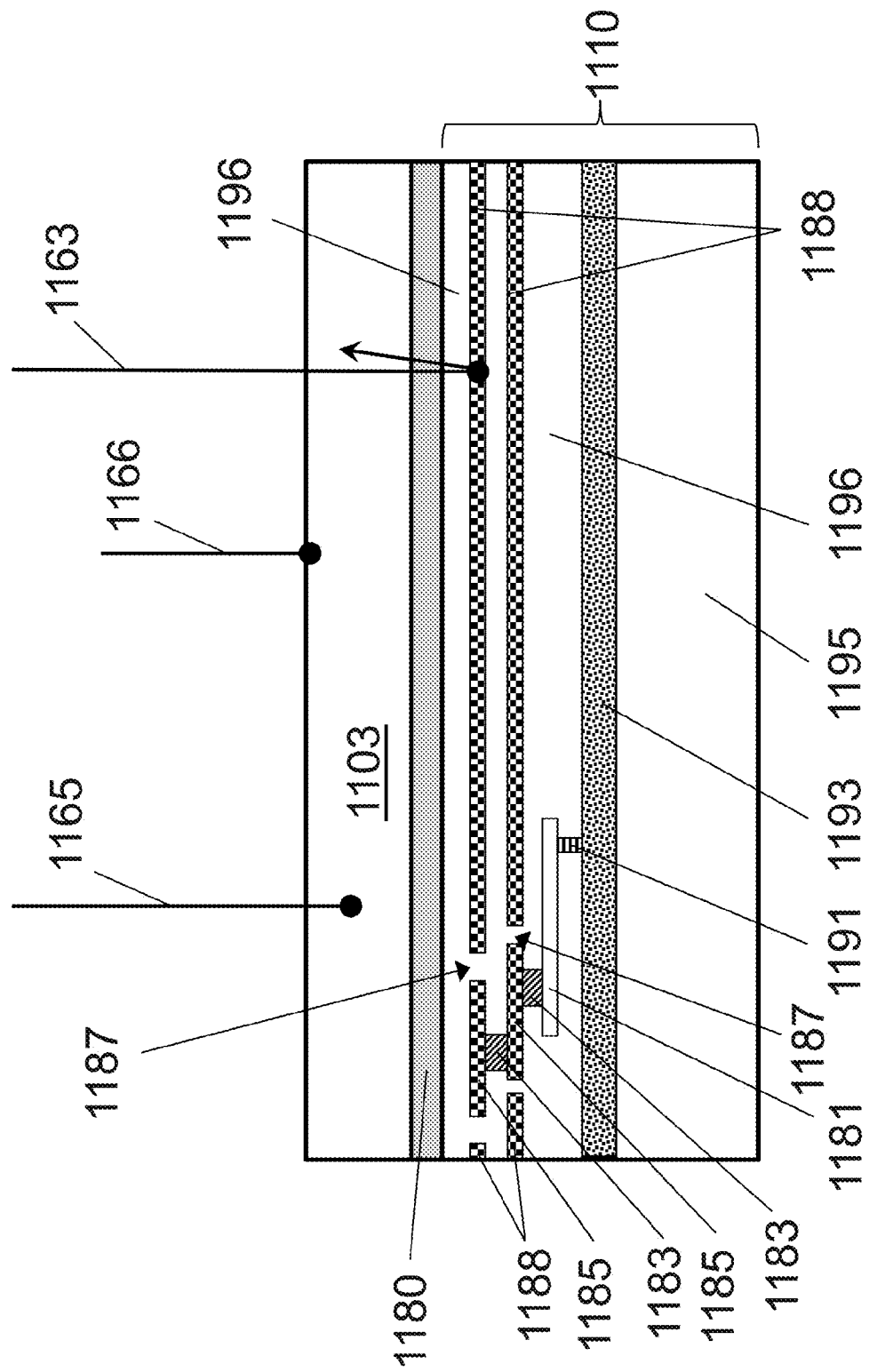

As illustrated in FIG. 11C, oxide layer 1180 and remaining channel layer 1103 have been layer transferred to acceptor wafer 1110. The top surface of remaining channel layer 1103 may be chemically or mechanically polished, and/or may be thinned by low temperature oxidation and strip processes, such as the TEL SPA tool radical oxidation and HF:H$_2$O solutions as described herein and in referenced patents and patent applications. Thru the processing, the wafer sized layer remaining channel layer 1103 could be thinned from its original total thickness, and its final total thickness could be in the range of about 5 nm to about 20 nm, for example, 5 nm, 7 nm, 10 nm, 12 nm, 15 nm, or 20 nm. Remaining channel layer 1103 may have a thickness and doping that may allow fully-depleted channel operation when the FD-MOSFET transistor is substantially completely formed. Acceptor wafer 1110 may include one or more (two are shown in this example) shield/heat sink layers 1188, which may include materials such as, for example, Aluminum, Tungsten (a refractory metal), Copper, silicon or cobalt based silicides, or forms of carbon such as carbon nanotubes. Each shield/heat sink layer 1188 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 1188 may include isolation openings 1187, and alignment mark openings (not shown), which may be utilized for short wavelength alignment of top layer (donor) processing to the acceptor wafer alignment marks (not shown). Shield/heat sink layer 1188 may include one or more shield path connects 1185 and shield path vias 1183. Shield path via 1183 may thermally and/or electrically couple and connect shield path connect 1185 to acceptor wafer 1110 interconnect metallization layers such as, for example, exemplary acceptor metal interconnect 1181 (shown). Shield path connect 1185 may also thermally and/or electrically couple and connect each shield/heat sink layer 1188 to the other and to acceptor wafer 1110 interconnect metallization layers such as, for example, acceptor metal interconnect 1181, thereby creating a heat conduction path from the shield/heat sink layer 1188 to the acceptor substrate 1195, and a heat sink (shown in FIG. 11G.). Isolation openings 1187 may include dielectric materials, similar to those of BEOL isolation 1196. Acceptor wafer 1110 may include first (acceptor) layer metal interconnect 1191, acceptor wafer transistors and devices 1193, and acceptor substrate 1195. Various topside defect anneals may be utilized. For this illustration, an optical beam such as the laser annealing previously described is used. Optical anneal beams may be optimized to focus light absorption and heat generation within or at the surface of remaining channel layer 1103 and provide surface smoothing and/or defect annealing (defects may be from the cleave and/or the ion-cut implantation) with exemplary smoothing/annealing ray 1166. The laser assisted smoothing/annealing with the absorbed heat generated by exemplary smoothing/annealing ray 1166 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,479,821 to Hawryluk et al. for example), may be utilized to increase the efficiency of the optical energy capture in conversion to heat for the desired annealing or activation processes. Moreover, multiple pulses of the laser may be utilized to improve the anneal, activation, and yield of the process. Reflected ray 1163 may be reflected and/or absorbed by shield/heat sink layer 1188 regions thus blocking the optical absorption of ray blocked metal interconnect 1181. Annealing of dopants or annealing of damage, such as from the H cleave implant damage, may be also accomplished by a set of rays such as repair ray 1165. Heat generated by absorbed photons from, for example, smoothing/annealing ray 1166, reflected ray 1163, and/or repair ray 1165 may also be absorbed by shield/heat sink layer 1188 regions and dissipated laterally and may keep the temperature of underlying metal layers, such as metal interconnect 1181, and other metal layers below it, cooler and prevent damage. Shield/heat sink layer 1188 and associated dielectrics may laterally spread and conduct the heat generated by the topside defect anneal, and in conjunction with the dielectric materials (low heat conductivity) above and below shield/heat sink layer 1188, keep the interconnect metals and low-k dielectrics of the acceptor wafer interconnect layers cooler than a damage temperature, such as, for example, 400° C. A second layer of shield/heat sink layer 1188 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 1188 may act as a heat spreader. Electrically conductive materials may be used for the two layers of shield/heat sink layer 1188 and thus may provide, for example, a Vss and a Vdd plane that may be connected to the donor layer transistors above, as well may be connected to the acceptor wafer transistors below, and/or may provide below transferred layer device interconnection. Shield/heat sink layer 1188 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 1188 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 1188 and under & overlying dielectric layers, spreads the localized heat/light energy of the topside anneal laterally and protects the underlying layers of interconnect metallization & dielectrics, such as in the acceptor wafer 1110, from harmful temperatures or damage. When there may be more than one shield/heat sink layer 1188 in the device, the heat conducting layer closest to the second crystalline layer or oxide layer 1180 may be constructed with a different material, for example a high melting point material, for example a refractory metal such as tungsten, than the other heat conducting layer or layers, which may be constructed with, for example, a lower melting point material, for example, such as aluminum or copper. Now transistors may be formed with low effective temperature (less than approximately 400° C. exposure to the acceptor wafer 1110 sensitive layers, such as interconnect and device layers) processing, and may be aligned to the acceptor wafer alignment marks (not shown) as described in the incorporated references. This may include further optical defect annealing or dopant activation steps. The donor wafer 1100 may now also be processed, such as smoothing and annealing, and reused for additional layer transfers. The insulator layer, such as deposited bonding oxides (for example oxide layer 1180) and/or before bonding preparation existing oxides (for example the BEOL isolation 1196 on top of the topmost metal layer of shield/heat sink layer 1188), between the donor wafer transferred monocrystalline layer and the acceptor wafer topmost metal layer, may include thicknesses of less than 1 um, less than 500 nm, less than 400 nm, less than 300 nm, less than 200 nm, or less than 100 nm.

Figure 11D:
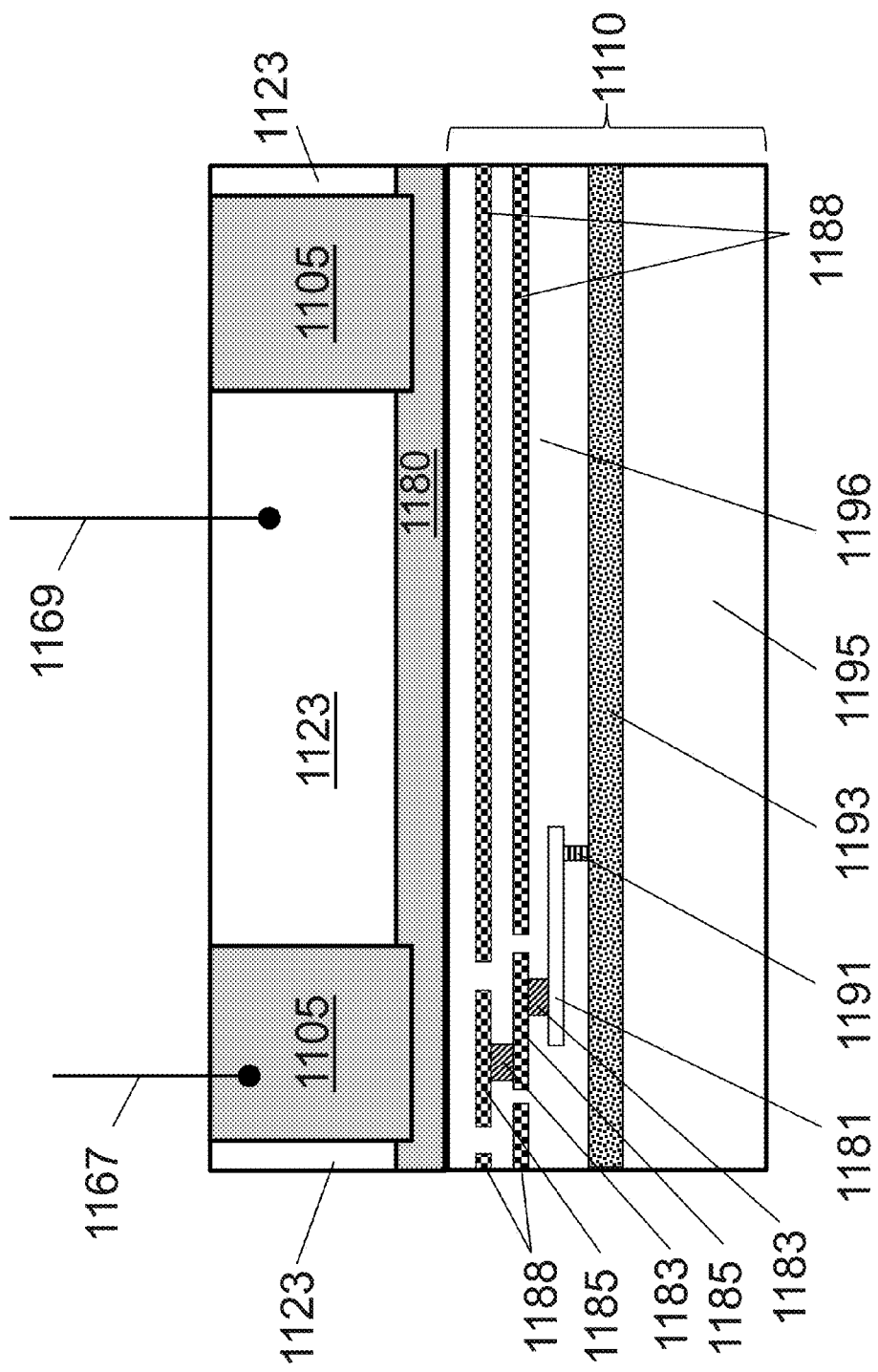

As illustrated in FIG. 11D, transistor isolation regions 1105 may be formed by mask defining and plasma/RIE etching remaining channel layer 1103 substantially to the top of oxide layer 1180 (not shown), substantially into oxide layer 1180, or into a portion of the upper oxide layer of acceptor wafer 1110 (not shown). Thus channel region 1123 may be formed, which may substantially form the transistor body. A low-temperature gap fill dielectric, such as SACVD oxide, may be deposited and chemically mechanically polished, the oxide remaining in isolation regions 1105. An optical step, such as illustrated by exemplary STI ray 1167, may be performed to anneal etch damage and densify the STI oxide in isolation regions 1105. The doping concentration of the channel region 1123 may include gradients of concentration or layers of differing doping concentrations.

Any additional doping, such as ion-implanted channel implants, may be activated and annealed with optical annealing, such as illustrated by exemplary implant ray 1169, as described herein. The optical anneal, such as exemplary STI ray 1167, and/or exemplary implant ray 1169 may be performed at separate times and processing parameters (such as laser energy, frequency, etc.) or may be done in combination or as one optical anneal. Optical absorber and or reflective layers or regions may be employed to enhance the anneal and/or protect the underlying sensitive structures. Moreover, multiple pulses of the laser may be utilized to improve the anneal, activation, and yield of the process.

As illustrated in FIG. 11E, a transistor forming process, such as a conventional HKMG with raised source and drains (S/D), may be performed. For example, a dummy gate stack (not shown), utilizing oxide and polysilicon, may be formed, gate spacers 1130 may be formed, raised S/D regions 1132 and channel stressors may be formed by etch and epitaxial deposition, for example, of SiGe and/or SiC depending on P or N channel, LDD and S/D ion-implantations may be performed, and first ILD 1136 may be deposited and CMP'd to expose the tops of the dummy gates. Thus transistor channel 1133 and S/D & LDD regions 1135 may be formed. The dummy gate stack may be removed and a gate dielectric 1107 may be formed and a gate metal material gate electrode 1108, including a layer of proper work function metal ($Ti_xAl_yN_z$ for example) and a conductive fill, such as aluminum, and may be deposited and CMP'd. The gate dielectric 1107 may be an atomic layer deposited (ALD) gate dielectric that may be paired with a work function specific gate metal in the industry standard high k metal gate process schemes, for example, as described in the incorporated references. Alternatively, the gate dielectric 1107 may be formed with a low temperature processes including, for example, LPCVD $SiO_2$ oxide deposition (see Ahn, J., et al., "High-quality MOSFET's with ultrathin LPCVD gate SiO2," IEEE Electron Device Lett., vol. 13, no. 4, pp. 186-188, April 1992) or low temperature microwave plasma oxidation of the silicon surfaces (see Kim, J. Y., et al., "The excellent scalability of the RCAT (recess-channel-array-transistor) technology for sub-70 nm DRAM feature size and beyond," 2005 IEEE VLSI-TSA International Symposium, pp. 33-11, 25-27 Apr. 2005) and a gate material with proper work function and less than approximately 400° C. deposition temperature such as, for example, tungsten or aluminum may be deposited. An optical step, such as represented by exemplary anneal ray 1121, may be performed to densify and/or remove defects from gate dielectric 1107, anneal defects and activate dopants such as LDD and S/D implants, densify the first ILD 1136, and/or form contact and S/D silicides (not shown). The optical anneal may be performed at each sub-step as desired, or may be done at prior to the HKMG deposition, or various combinations. Moreover, multiple pulses of the laser may be utilized to improve the anneal, activation, and yield of the process.

Figure 11F:
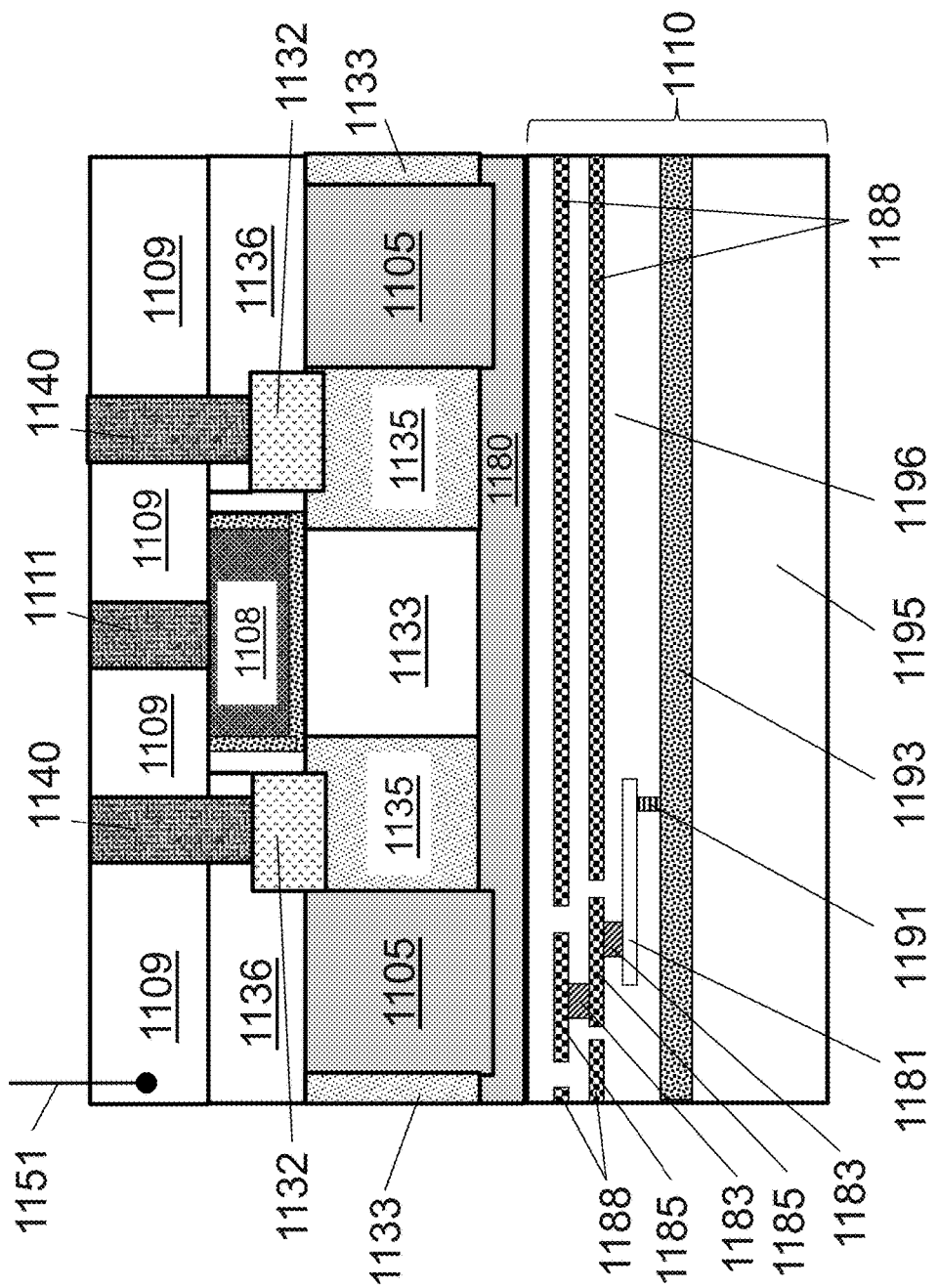

As illustrated in FIG. 11F, a low temperature thick oxide 1109 may be deposited and planarized. Source, gate, and drain contacts openings may be masked and etched preparing the transistors to be connected via metallization. Thus gate contact 1111 connects to gate electrode 1108, and source & drain contacts 1140 connect to raised S/D regions 1132. An optical step, such as illustrated by exemplary ILD anneal ray 1151, may be performed to anneal contact etch damage and densify the thick oxide 1109.

Figure 11G:
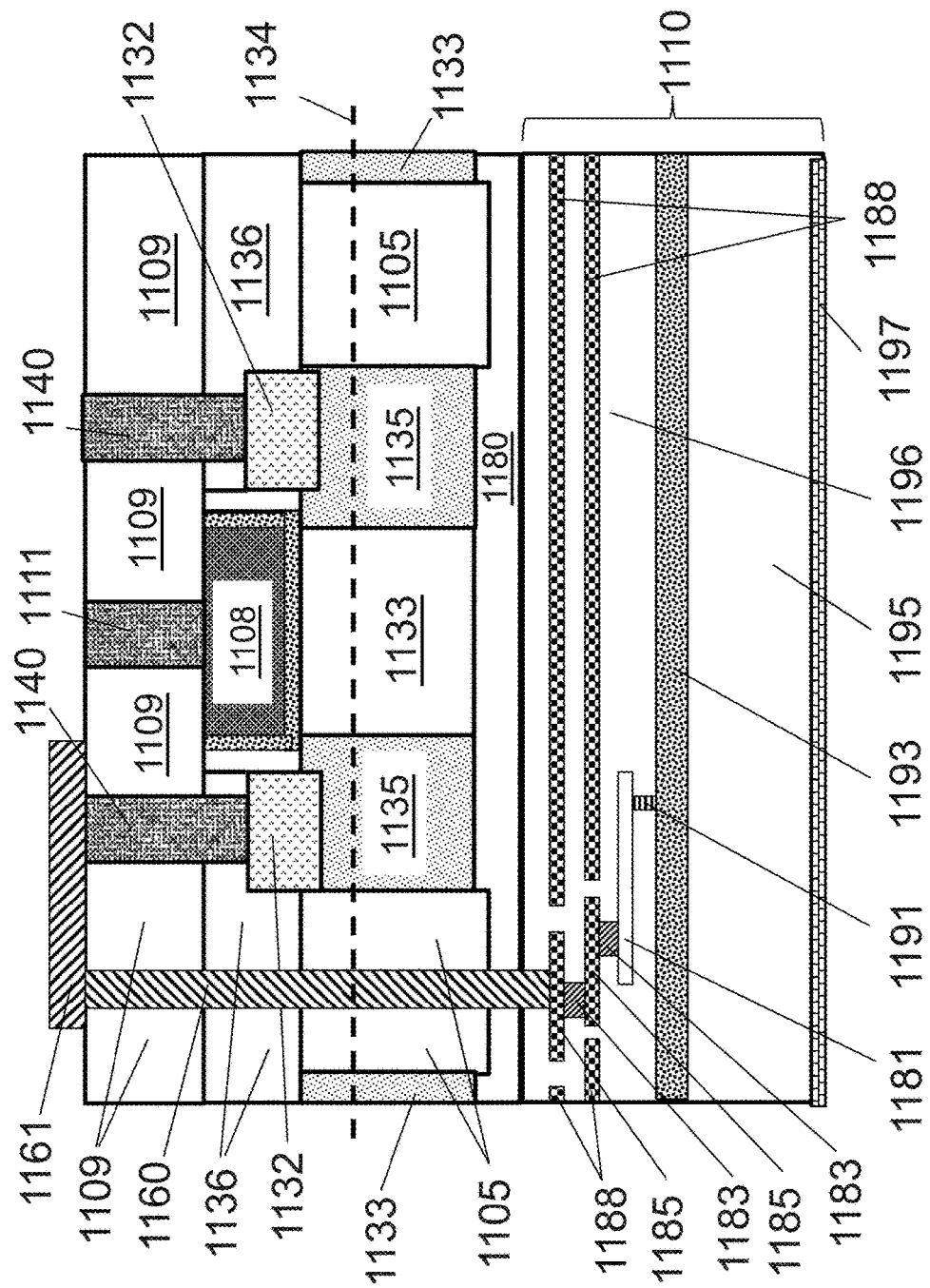

As illustrated in FIG. 11G, thru layer vias (TLVs) 1160 may be formed by etching thick oxide 1109, first ILD 1136, isolation regions 1105, oxide layer 1180, into a portion of the upper oxide layer BEOL isolation 1196 of acceptor wafer 1110 BEOL, and filling with an electrically and thermally conducting material (such as tungsten or cooper) or an electrically non-conducting but thermally conducting material (such as described elsewhere within). Second device layer metal interconnect 1161 may be formed by conventional processing. TLVs 1160 may be constructed of thermally conductive but not electrically conductive materials, for example, DLC (Diamond Like Carbon), and may connect the FD-MOSFET transistor device and other devices on the top (second) crystalline layer thermally to shield/heat sink layer 1188. TLVs 1160 may be constructed out of electrically and thermally conductive materials, such as Tungsten, Copper, or aluminum, and may provide a thermal and electrical connection path from the FD-MOSFET transistor device and other devices on the top (second) crystalline layer to shield/heat sink layer 1188, which may be a ground or Vdd plane in the design/layout. TLVs 1160 may be also constructed in the device scribelanes (pre-designed in base layers or potential dicelines) to provide thermal conduction to the heat sink, and may be sawed/diced off when the wafer is diced for packaging not shown). Shield/heat sink layer 1188 may be configured to act (or adapted to act) as an emf (electro-motive force) shield to prevent direct layer to layer cross-talk between transistors in the donor wafer layer and transistors in the acceptor wafer. In addition to static ground or Vdd biasing, shield/heat sink layer 1188 may be actively biased with an anti-interference signal from circuitry residing on, for example, a layer of the 3D-IC or off chip. The formed FD-MOSFET transistor device may include semiconductor regions wherein the dopant concentration of neighboring regions of the transistor in the horizontal plane, such as traversed by exemplary dopant plane 1134, may have regions, for example, transistor channel 1133 and S/D & LDD regions 1135, that differ substantially in dopant concentration, for example, a 10 times greater doping concentration in S/D & LDD regions 1135 than in transistor channel 1133, and/or may have a different dopant type, such as, for example p-type or n-type dopant, and/or may be doped and substantially undoped in the neighboring regions. For example, transistor channel 1133 may be very lightly doped (less than 1e15 atoms/$cm^3$) or nominally un-doped (less than 1e14 atoms/$cm^3$) and S/D & LDD regions 1135 may be doped at greater than 1e15 atoms/$cm^3$ or greater than 1e16 atoms/$cm^3$. For example, transistor channel 1133 may be doped with p-type dopant and S/D & LDD regions 1135 may be doped with n-type dopant.

A thermal conduction path may be constructed from the devices in the upper layer, the transferred donor layer and formed transistors, to the acceptor wafer substrate and associated heat sink. The thermal conduction path from the FD-MOSFET transistor device and other devices on the top (second) crystalline layer, for example, raised S/D regions 1132, to the acceptor wafer heat sink 1197 may include source & drain contacts 1140, second device layer metal interconnect 1161, TLV 1160, shield path connect 1185 (shown as twice), shield path via 1183 (shown as twice), metal interconnect 1181, first (acceptor) layer metal interconnect 1191, acceptor wafer transistors and devices 1193, and acceptor substrate 1195. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 1195. The elements of the thermal conduction path may include materials that are thermally conductive but may not be substantially electrically conductive, for example, Plasma. Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL isolation 1196 dielectric. The heat removal apparatus, which may include acceptor wafer heat sink 1197, may include an external surface from which heat transfer may take place by methods such as air cooling, liquid cooling, or attachment to another heat sink or heat spreader structure.

Furthermore, some or all of the layers utilized as shield/heat sink layer 1188, which may include shapes of material such as the strips or fingers as illustrated in FIG. 8G, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 1188 layer or layers. Moreover, some or all of the layers utilized as shield/heat sink layer 1188, which may include strips or fingers as illustrated in FIG. 8G, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 1188 layer or layers. The Vsupply on line 17C12 and the control signals on control line 17C16 may be controlled by and/or generated in the second layer transistors (for example donor wafer device structures such as the FD-MOSFETs formed as described in relation to FIG. 11) or first layer transistors (acceptor, for example acceptor wafer transistors and devices 1193), or off chip circuits. Furthermore, some or all of the layers utilized as shield/heat sink layer 1188, which may include strips or fingers as illustrated in FIG. 8G or other shapes such as those in FIG. 8B, may be utilized to distribute independent power supplies to various portions of the second layer transistors (for example donor wafer device structures such as the FD-MOSFETs formed as described in relation to FIG. 11) or first layer transistors (acceptor, for example acceptor wafer transistors and devices 1193) and circuits; for example, one power supply and/or voltage may be routed to the sequential logic circuits of the second layer and a different power supply and/or voltage routed to the combinatorial logic circuits of the second layer. Patterning of shield/heat sink layer 1188 or layers can impact their heat-shielding capacity. This impact may be mitigated, for example, by enhancing the top shield/heat sink layer 1188 areal density, creating more of the secondary shield/heat sink layers 1188, or attending to special CAD rules regarding their metal density, similar to CAD rules that are required to accommodate Chemical-Mechanical Planarization (CMP). These constraints would be integrated into a design and layout EDA tool.

TLVs 1160 may be formed through the transferred layers. As the transferred layers may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers, the smaller the thru layer via diameter obtainable, which may result from maintaining manufacturable via aspect ratios. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers.

As illustrated in FIG. 11H, at least one conductive bond pad 1164 for interfacing electrically (and may thermally) to external devices may be formed on top of the completed device and may include at least one metal layer of second device layer metal interconnect 1161. Bond pad 1164 may overlay second device layer metal interconnect 1161 or a portion of (some of the metal and insulator layers of) second device layer metal interconnect 1161. Bond pad 1164 may be directly aligned to the acceptor wafer alignment marks (not shown) and the I/O driver circuitry may be formed by the second layer (donor) transistors, for example, donor wafer device structures such as the FD-MOSFETs formed as described in relation to FIG. 11. Bond pad 1164 may be connected to the second layer transistors thru the second device layer metal interconnect 1161 which may include vias 1162. The I/O driver circuitry may be formed by transistors from the acceptor wafer transistors and devices 1193, or from transistors in other strata if the 3DIC device has more than two layers of transistors. I/O pad control metal segment 1167 may be formed directly underneath bond pad 1164 and may influence the noise and ESD (Electro Static Discharge) characteristics of bond pad 1164. The emf influence of I/O pad control metal segment 1167 may be controlled by circuitry formed from a portion of the second layer transistors. I/O pad control metal segment 1167 may be formed with second device layer metal interconnect 1161. Furthermore, metal segment 1189 of the topmost shield/heat sink layer 1188 may be used to influence the FD-MOSFET transistor or transistors above it by emf, and influence the noise and ESD (Electro Static Discharge) characteristics of bond pad 1164. Metal segment 1189 may be controlled by second layer (donor) transistors, for example, donor wafer device structures such as the FD-MOSFETs formed as described in relation to FIG. 11 and/or by transistors from the acceptor wafer transistors and devices 1193, or from transistors in other strata if the 3DIC device has more than two layers of transistors.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 11 formation techniques herein.

Persons of ordinary skill in the art will appreciate that the illustrations in FIGS. 11A through 11H are exemplary only and are not drawn to scale. Such skilled persons will further appreciate that many variations are possible such as, for example, a p-channel FD-MOSFET may be formed with changing the types of dopings appropriately. Moreover, the P-substrate donor wafer 1100 may be n type or un-doped. Furthermore, isolation regions 1105 may be formed by a hard mask defined process flow, wherein a hard mask stack, such as, for example, silicon oxide and silicon nitride layers, or silicon oxide and amorphous carbon layers, may be utilized. Moreover, CMOS FD MOSFETs may be constructed with n-MOSFETs in a first mono-crystalline silicon layer and p-MOSFETs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Many other modifications within the scope of the invention will suggest themselves to such skilled persons after reading this specification. Thus the invention is to be limited only by the appended claims.

A planar fully depleted n-channel MOSFET (FD-MOSFET) with an optional integrated heat shield/spreader and back planes and body bias taps suitable for a monolithic 3D IC may be constructed as follows. The FD-MOSFET may provide an improved transistor variability control and conduction channel electrostatic control, as well as the ability to utilize an updoped channel, thereby improving carrier mobility. In addition, the FD-MOSFET does not demand doping or pocket implants in the channel to control the electrostatic characteristics and tune the threshold voltages. Sub-threshold slope, DIBL, and other short channel effects are greatly improved due to the firm gate electrostatic control over the channel. In this embodiment, a ground plane is constructed that may provide improved electrostatics and/or Vt adjustment and/or back-bias of the FD-MOSFET. In addition, selective regions may be constructed to provide body bias and/or partially depleted/bulk-like transistors. Moreover, a heat spreading, heat conducting and/or optically reflecting material layer or layers may be incorporated between the sensitive metal interconnect layers and the layer or regions being optically irradiated and annealed to repair defects in the crystalline 3D-IC layers and regions and to activate semiconductor dopants in the crystalline layers or regions of a 3D-IC without harm to the sensitive metal interconnect and associated dielectrics. FIG. 12A-G illustrates an exemplary n-channel FD-MOSFET which may be constructed in a 3D stacked layer using procedures outlined below and in U.S. Pat. No. 8,273,610 and U.S. Pat. Nos. 8,557,632 and 8,581,349. The contents of the foregoing applications are incorporated herein by reference.

As illustrated in FIG. 12A, SOI donor wafer substrate 1200 may include back channel layer 1202 above Buried Oxide BOX layer 1201. Back channel layer 1202 may be doped by ion implantation and thermal anneal, may include a crystalline material, for example, mono-crystalline (single crystal) silicon and may be heavily doped (greater than 1e16 atoms/cm$^3$), lightly doped (less than 1e16 atoms/cm$^3$) or nominally un-doped (less than 1e14 atoms/cm$^3$). SOI donor wafer substrate 1200 may include a crystalline material, for example, mono-crystalline (single crystal) silicon and at least the upper layer near BOX layer 1201 may be very lightly doped (less than 1e15 atoms/cm$^3$) or nominally un-doped (less than 1e14 atoms/cm$^3$). Back channel layer 1202 may have additional ion implantation and anneal processing to provide a different dopant level than SOI donor wafer substrate 1200 and may have graded or various layers of doping concentration. SOI donor wafer substrate 1200 may have additional ion implantation and anneal processing to provide a different dopant level than back channel layer 1202 and may have graded or various layers of doping concentration. The layer stack may alternatively be formed by epitaxially deposited doped or undoped silicon layers, or by a combination of epitaxy and implantation, or by layer transfer. Annealing of implants and doping may include, for example, conductive/inductive thermal, optical annealing techniques or types of Rapid Thermal Anneal (RTA or spike). The preferred at least top of SOI donor wafer substrate 1200 doping will be undoped to eventually create an FD-MOSFET transistor with an updoped conduction channel. SOI donor wafer may be constructed by layer transfer techniques described herein or elsewhere as known in the art, or by laser annealed SIMOX at a post donor layer transfer to acceptor wafer step. BOX layer 1201 may be thin enough to provide for effective back and/or body bias, for example, 25 nm, or 20 nm, or 10 nm, or 35 nm.

As illustrated in FIG. 12B, the top surface of the SOI donor wafer substrate 1200 layer stack may be prepared for oxide wafer bonding with a deposition of an oxide or by thermal oxidation of back channel layer 1202 to form oxide layer 1280. A layer transfer demarcation plane (shown as dashed line) 1299 may be formed by hydrogen implantation or other methods as described in the incorporated references, and may reside within the SOI donor wafer substrate 1200. The SOI donor wafer substrate 1200 stack, such as surface 1282, and acceptor wafer 1210 may be prepared for wafer bonding as previously described and low temperature (less than approximately 400° C.) bonded. Acceptor wafer 1210, as described in the incorporated references, may include, for example, transistors, circuitry, and metal, such as, for example, aluminum or copper, interconnect wiring, a metal shield/heat sink layer or layers, and thru layer via metal interconnect strips or pads. Acceptor wafer 1210 may be substantially comprised of a crystalline material, for example mono-crystalline silicon or germanium, or may be an engineered substrate/wafer such as, for example, an SOI (Silicon on Insulator) wafer or GeOI (Germanium on Insulator) substrate. Acceptor wafer 1210 may include transistors such as, for example, MOSFETS, FD-MOSFETS, FinFets, FD-RCATs, BJTs, HEMTs, and/or HBTs. The portion of the SOI donor wafer substrate 1200 that may be above (when the layer stack is flipped over and bonded to the acceptor wafer 1210) the layer transfer demarcation plane 1299 may be removed by cleaving or other low temperature processes as described in the incorporated references, such as, for example, ion-cut with mechanical or thermal cleave or other layer transfer methods, thus forming remaining channel layer 1203. Damage/defects to crystalline structure of back channel layer 1202 may be annealed by some of the annealing methods described, for example the short wavelength pulsed laser techniques, wherein the back channel layer 1202 and/or portions of the SOI donor wafer substrate 1200 may be heated to defect annealing temperatures, but the layer transfer demarcation plane 1299 may be kept below the temperate for cleaving and/or significant hydrogen diffusion. The optical energy may be deposited in the upper layer of the stack, for example near surface 1282, and annealing of back channel layer 1202 and/or portions of the SOI donor wafer substrate 1200 may take place via heat diffusion. Moreover, multiple pulses of the laser may be utilized to improve the anneal, activation, and yield of the process and/or to control the maximum temperature of various structures in the stack.

Figure 12C:
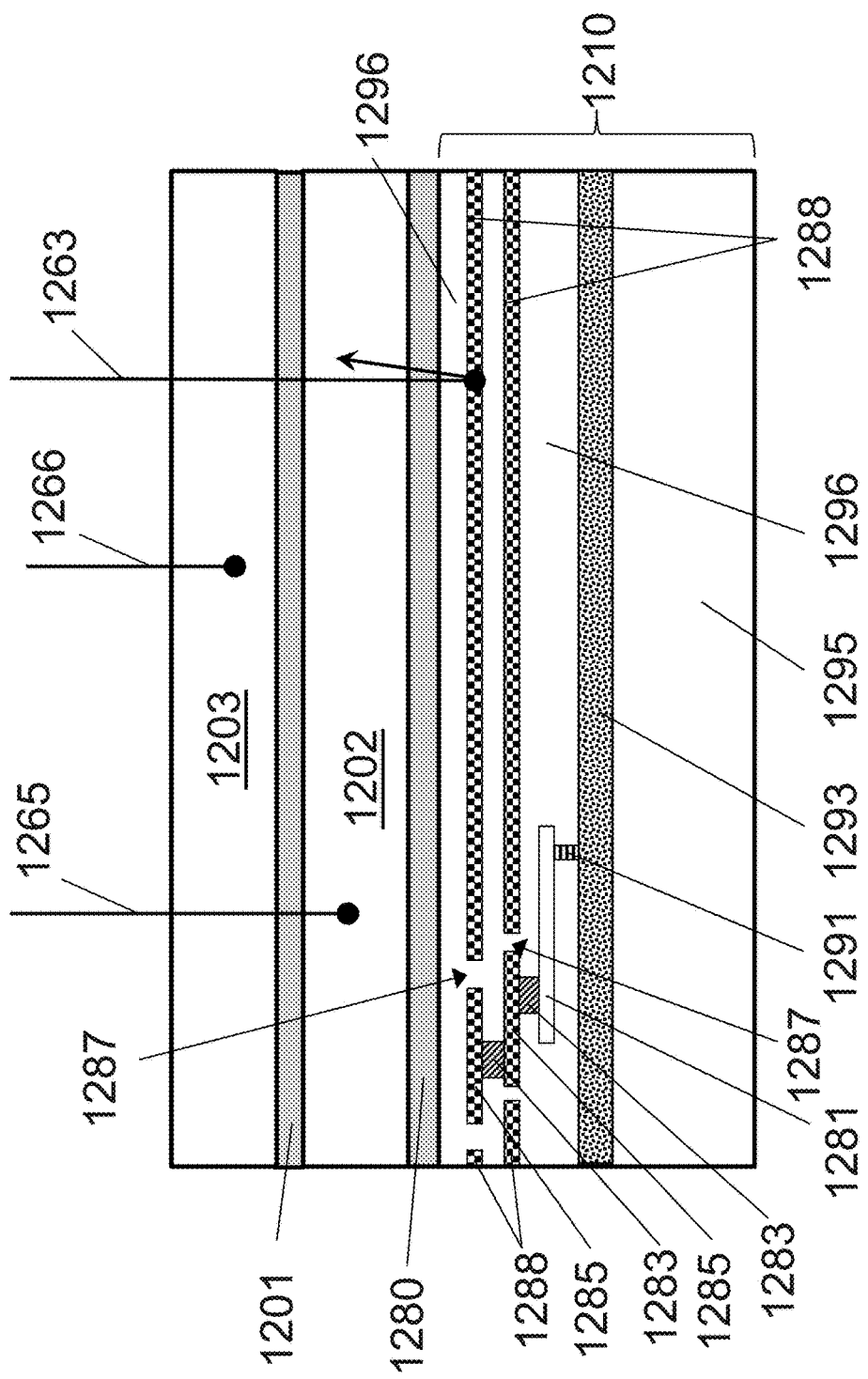

As illustrated in FIG. 12C, oxide layer 1280, back channel layer 1202, BOX layer 1201 and channel layer 1203 may be layer transferred to acceptor wafer 1210. The top surface of channel layer 1203 may be chemically or mechanically polished, and/or may be thinned by low temperature oxidation and strip processes, such as the TEL SPA tool radical oxidation and HF:H$_2$O solutions as described herein and in referenced patents and patent applications. Thru the processing, the wafer sized layer channel layer 1203 could be thinned from its original total thickness, and its final total thickness could be in the range of about 5 nm to about 20 nm, for example, 5 nm, 7 nm, 10 nm, 12 nm, 15 nm, or 20 nm. Channel layer 1203 may have a thickness and/or doping that may allow fully-depleted channel operation when the FD-MOSFET transistor is substantially completely formed. Acceptor wafer 1210 may include one or more (two are shown in this example) shield/heat sink layers 1288, which may include materials such as, for example, Aluminum, Tungsten (a refractory metal), Copper, silicon or cobalt based silicides, or forms of carbon such as carbon nanotubes. Each shield/heat sink layer 1288 may have a thickness range of about 50 nm to about 1 mm, for example, 50 nm, 100 nm, 200 nm, 300 nm, 500 nm, 0.1 um, 1 um, 2 um, and 10 um. Shield/heat sink layer 1288 may include isolation openings 1287, and alignment mark openings (not shown), which may be utilized for short wavelength alignment of top layer (donor) processing to the acceptor wafer alignment marks (not shown). Shield/heat sink layer 1288 may include one or more shield path connects 1285 and shield path vias 1283. Shield path via 1283 may thermally and/or electrically couple and connect shield path connect 1285 to acceptor wafer 1210 interconnect metallization layers such as, for example, exemplary acceptor metal interconnect 1281 (shown). Shield path connect 1285 may also thermally and/or electrically couple and connect each shield/heat sink layer 1288 to the other and to acceptor wafer 1210 interconnect metallization layers such as, for example, acceptor metal interconnect 1281, thereby creating a heat conduction path from the shield/heat sink layer 1288 to the acceptor substrate 1295, and a heat sink (shown in FIG. 12G.). Isolation openings 1287 may include dielectric materials, similar to those of BEOL isolation 1296. Acceptor wafer 1210 may include first (acceptor) layer metal interconnect 1291, acceptor wafer transistors and devices 1293, and acceptor substrate 1295. Various topside defect anneals may be utilized. For this illustration, an optical beam such as the laser annealing previously described is used. Optical anneal beams may be optimized to focus light absorption and heat generation within or at the surface of channel layer 1203 and provide surface smoothing and/or defect annealing (defects may be from the cleave and/or the ion-cut implantation) with exemplary smoothing/annealing ray 1266. The laser assisted smoothing/annealing with the absorbed heat generated by exemplary smoothing/annealing ray 1266 may also include a pre-heat of the bonded stack to, for example, about 100° C. to about 400° C., and/or a rapid thermal spike to temperatures above about 200° C. to about 600° C. Additionally, absorber layers or regions, for example, including amorphous carbon, amorphous silicon, and phase changing materials (see U.S. Pat. Nos. 6,635,588 and 6,479,821 to Hawryluk et al. for example), may be utilized to increase the efficiency of the optical energy capture in conversion to heat for the desired annealing or activation processes. Moreover, multiple pulses of the laser may be utilized to improve the anneal, activation, and yield of the process. Reflected ray 1263 may be reflected and/or absorbed by shield/heat sink layer 1288 regions thus blocking the optical absorption of ray blocked metal interconnect 1281. Annealing of dopants or annealing of damage in back channel layer 1202 and/or BOX 1210 and/or channel layer 1203, such as from the H cleave implant damage, may be also accomplished by a set of rays such as repair ray 1265, illustrated is focused on back channel layer 1202. Heat generated by absorbed photons from, for example, smoothing/annealing ray 1266, reflected ray 1263, and/or repair ray 1265 may also be absorbed by shield/heat sink layer 1288 regions and dissipated laterally and may keep the temperature of underlying metal layers, such as metal interconnect 1281, and other metal layers below it, cooler and prevent damage. Shield/heat sink layer 1288 and associated dielectrics may laterally spread and conduct the heat generated by the topside defect anneal, and in conjunction with the dielectric materials (low heat conductivity) above and below shield/heat sink layer 1288, keep the interconnect metals and low-k dielectrics of the acceptor wafer interconnect layers cooler than a damage temperature, such as, for example, 400° C. A second layer of shield/heat sink layer 1288 may be constructed (shown) with a low heat conductive material sandwiched between the two heat sink layers, such as silicon oxide or carbon doped 'low-k' silicon oxides, for improved thermal protection of the acceptor wafer interconnect layers, metal and dielectrics. Shield/heat sink layer 1288 may act as a heat spreader. Electrically conductive materials may be used for the two layers of shield/heat sink layer 1288 and thus may provide, for example, a Vss and a Vdd plane that may be connected to the donor layer transistors above, as well may be connected to the acceptor wafer transistors below, and/or may provide below transferred layer device interconnection. Shield/heat sink layer 1288 may include materials with a high thermal conductivity greater than 10 W/m-K, for example, copper (about 400 W/m-K), aluminum (about 237 W/m-K), Tungsten (about 173 W/m-K), Plasma Enhanced Chemical Vapor Deposited Diamond Like Carbon-PECVD DLC (about 1000 W/m-K), and Chemical Vapor Deposited (CVD) graphene (about 5000 W/m-K). Shield/heat sink layer 1288 may be sandwiched and/or substantially enclosed by materials with a low thermal conductivity (less than 10 W/m-K), for example, silicon dioxide (about 1.4 W/m-K). The sandwiching of high and low thermal conductivity materials in layers, such as shield/heat sink layer 1288 and under & overlying dielectric layers, spreads the localized heat/light energy of the topside anneal laterally and protects the underlying layers of interconnect metallization & dielectrics, such as in the acceptor wafer 1210, from harmful temperatures or damage. When there may be more than one shield/heat sink layer 1288 in the device, the heat conducting layer closest to the second crystalline layer or oxide layer 1280 may be constructed with a different material, for example a high melting point material, for example a refractory metal such as tungsten, than the other heat conducting layer or layers, which may be constructed with, for example, a lower melting point material, for example such as aluminum or copper. Now transistors may be formed with low effective temperature (less than approximately 400° C. exposure to the acceptor wafer 1210 sensitive layers, such as interconnect and device layers) processing, and may be aligned to the acceptor wafer alignment marks (not shown) as described in the incorporated references. This may include further optical defect annealing or dopant activation steps. The remaining SOI donor wafer substrate 1200 may now also be processed, such as smoothing and annealing, and reused for additional layer transfers. The insulator layer, such as deposited bonding oxides (for example oxide layer 1280) and/or before bonding preparation existing oxides (for example the BEOL isolation 1296 on top of the topmost metal layer of shield/heat sink layer 1288), between the donor wafer transferred monocrystalline layer and the acceptor wafer topmost metal layer, may include thicknesses of less than 1 um, less than 500 nm, less than 400 nm, less than 300 nm, less than 200 nm, or less than 100 nm.

Figure 12D:
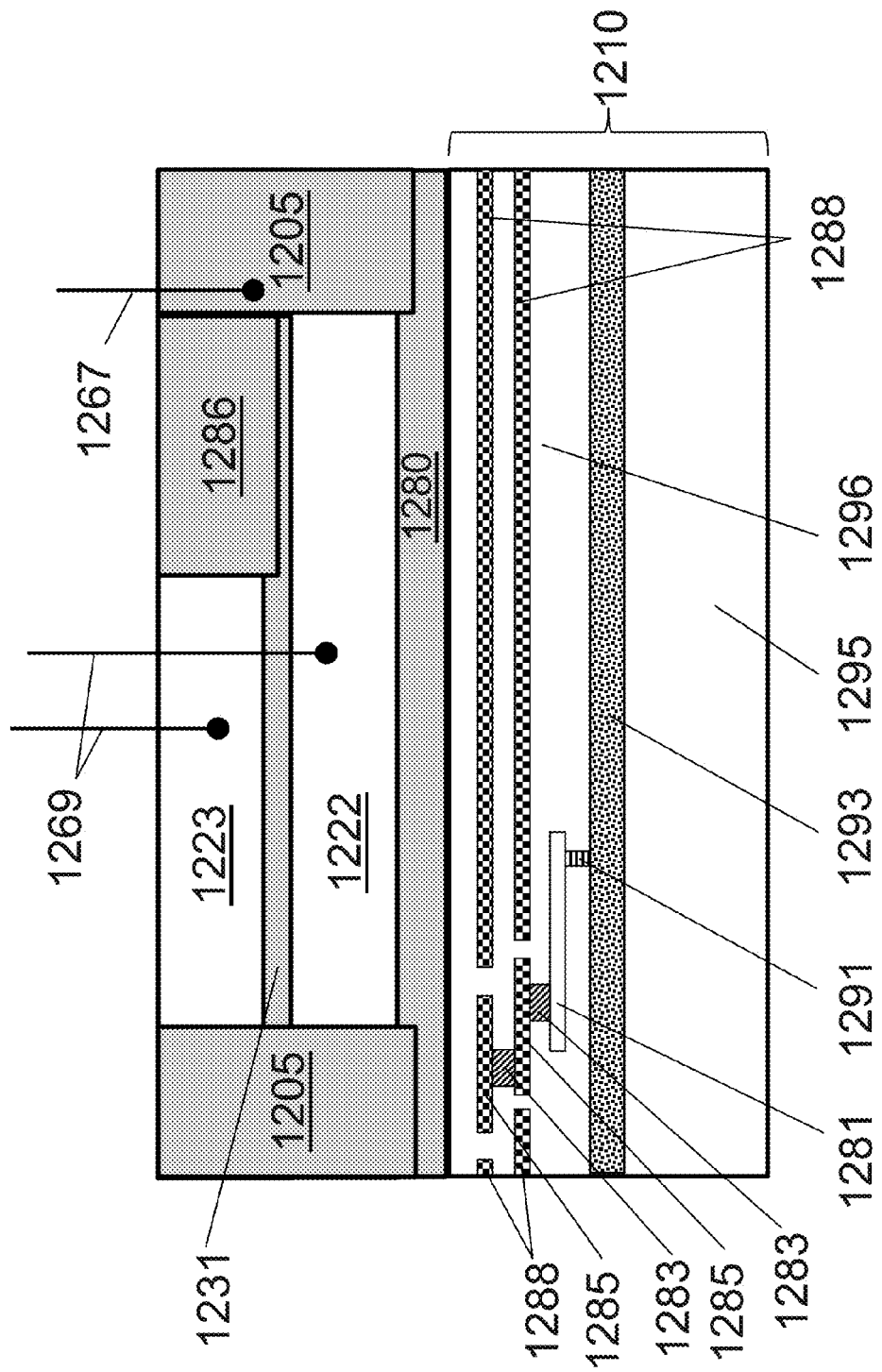

As illustrated in FIG. 12D, transistor and back channel isolation regions 1205 and/or transistor isolation regions 1286 may be formed. Transistor isolation region 1286 may be formed by mask defining and plasma/RIE etching channel layer 1203, substantially to the top of BOX layer 1201 (not shown), substantially into BOX layer 1201, or back channel layer 1202 (not shown). Transistor and back channel isolation regions 1205 may be formed by mask defining and plasma/RIE etching channel layer 1203, BOX layer 1201 and back channel layer 1202, substantially to the top of oxide layer 1280 (not shown), substantially into oxide layer 1280, or further into the top BEOL dielectric layer in acceptor wafer 1210 (not shown). Thus channel region 1223 may be formed, which may substantially form the transistor body, back-channel region 1222 may be formed, which may provide a back bias and/or Vt control by doping or bias to one or more channel regions 1223, and BOX region 1231. Back-channel region 1222 may be ion implanted for Vt control and/or body bias efficiency. A low-temperature gap fill dielectric, such as SACVD oxide, may be deposited and chemically mechanically polished, the oxide remaining in transistor and back channel isolation regions 1205 and transistor isolation regions 1286. Back-channel region 1222 may be ion implanted for Vt control and/or body bias efficiency. An optical step, such as illustrated by exemplary STI ray 1267, may be performed to anneal etch damage and densify the STI oxide in transistor and back channel isolation regions 1205. The doping concentration of channel region 1223 may include vertical or horizontal gradients of concentration or layers of differing doping concentrations. The doping concentration of back-channel region 1222 may include vertical or horizontal gradients of concentration or layers of differing doping concentrations. Any additional doping, such as ion-implanted channel implants, may be activated and annealed with optical annealing, such as illustrated by exemplary implant ray 1269, as described herein. The optical anneal, such as exemplary STI ray 1267, and/or exemplary implant ray 1269 may be performed at separate times and processing parameters (such as laser energy, frequency, etc.) or may be done in combination or as one optical anneal. Optical absorber and or reflective layers or regions may be employed to enhance the anneal and/or protect the underlying sensitive structures. Moreover, multiple pulses of the laser may be utilized to improve the anneal, activation, and yield of the process.

Figure 12E:
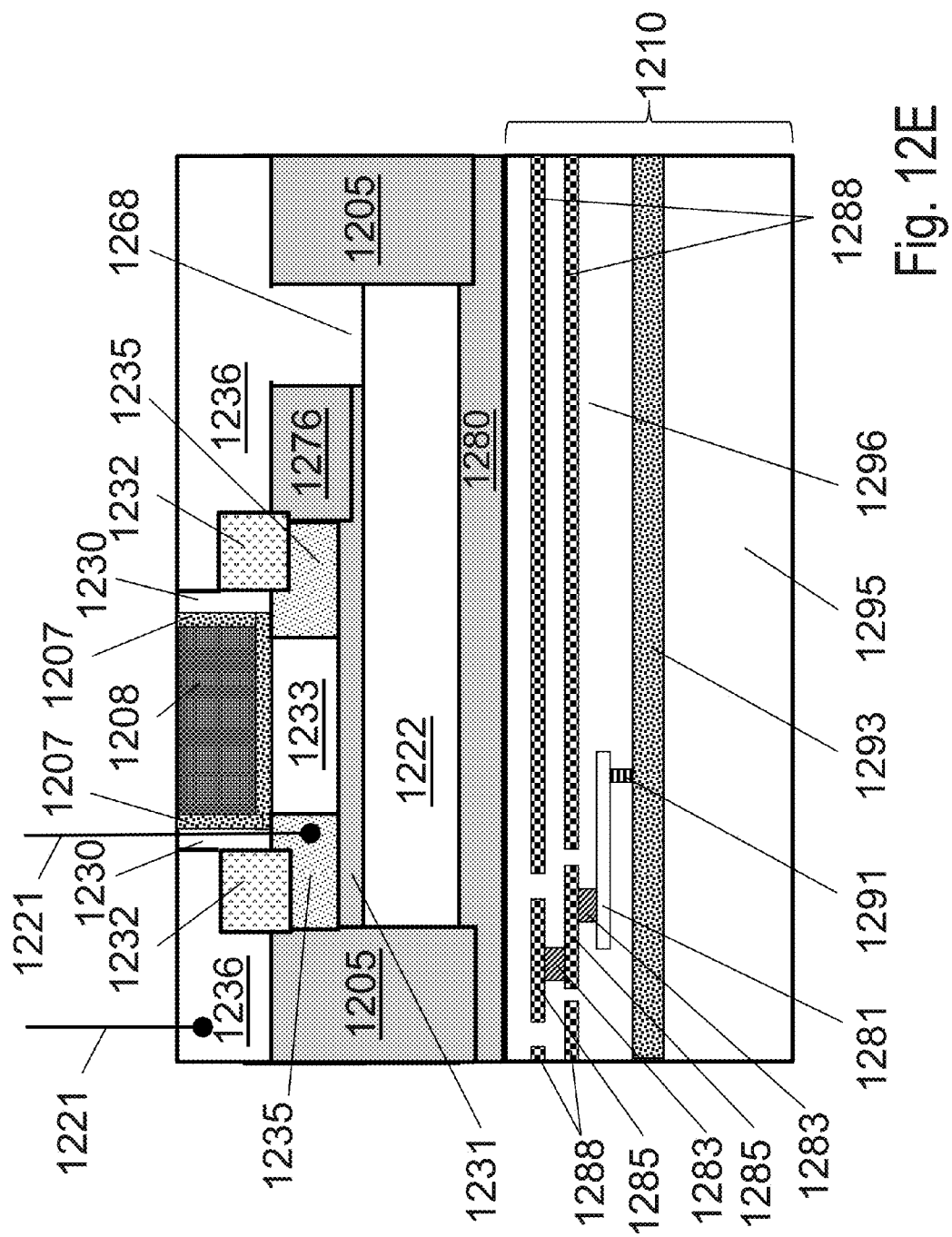

As illustrated in FIG. 12E, a transistor forming process, such as a conventional HKMG with raised source and drains (S/D), may be performed. For example, a dummy gate stack (not shown), utilizing oxide and polysilicon, may be formed, gate spacers 1230 may be formed, raised S/D regions 1232 and channel stressors may be formed by etch and epitaxial deposition, for example, of SiGe and/or SiC depending on P or N channel, LDD and S/D ion-implantations may be performed, and first ILD 1236 may be deposited and CMP'd to expose the tops of the dummy gates. Thus transistor channel region 1233 and S/D & LDD regions 1235 may be formed. The dummy gate stack may be removed and a gate dielectric 1207 may be formed and a gate metal material gate electrode 1208, including a layer of proper work function metal ($Ti_xAl_yN_z$ for example) and a conductive fill, such as aluminum, and may be deposited and CMP'd. The gate dielectric 1207 may be an atomic layer deposited (ALD) gate dielectric that may be paired with a work function specific gate metal in the industry standard high k metal gate process schemes, for example, as described in the incorporated references. Alternatively, the gate dielectric 1207 may be formed with a low temperature processes including, for example, LPCVD $SiO_2$ oxide deposition (see Ahn, J., et al., "High-quality MOSFET's with ultrathin LPCVD gate SiO2," IEEE Electron Device Lett., vol. 13, no. 4, pp. 186-188, April 1992) or low temperature microwave plasma oxidation of the silicon surfaces (see Kim, J. Y., et al., "The excellent scalability of the RCAT (recess-channel-array-transistor) technology for sub-70 nm DRAM feature size and beyond," 2005 IEEE VLSI-TSA International Symposium, pp. 33-12, 25-27 Apr. 2005) and a gate material with proper work function and less than approximately 400° C. deposition temperature such as, for example, tungsten or aluminum may be deposited. An optical step, such as represented by exemplary anneal ray 1221, may be performed to densify and/or remove defects from gate dielectric 1207, anneal defects and activate dopants such as LDD and S/D implants, densify the first ILD 1236, and/or form contact and S/D silicides (not shown). The optical anneal may be performed at each sub-step as desired, or may be done at prior to the HKMG deposition, or various combinations. Optionally, portions of transistor isolation region 1286 and BOX region 1231 may be lithographically defined and etched away, thus forming second transistor isolation regions 1276 and PD transistor area 1268. Partially depleted transistors (not shown) may be constructed in a similar manner as the FD-MOSFETs constructed on transistor channel region 1233 herein, but now with the thicker back-channel region 1222 silicon as its channel body. PD transistor area 1268 may also be utilized to later form a direct connection thru a contact to the back-channel region 1222 for back bias and Vt control of the transistor with transistor channel region 1233. If no PD devices are desired, then it may be more efficient to later form a direct connection thru a contact to the back-channel region 1222 for back bias and Vt control of the transistor with transistor channel region 1233 by etching a contact thru transistor isolation region 1286.

Figure 12F:
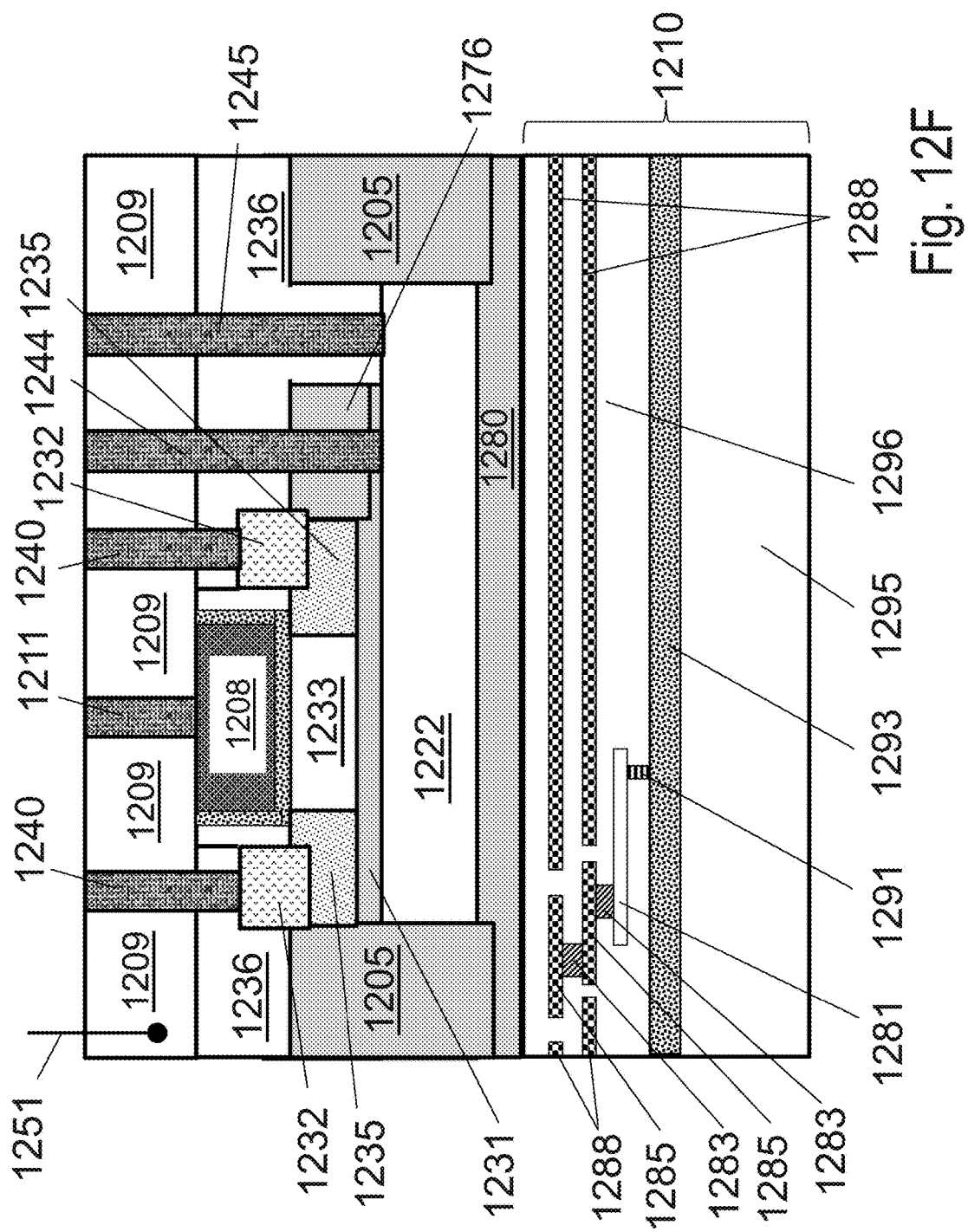

As illustrated in FIG. 12F, a low temperature thick oxide 1209 may be deposited and planarized Source, gate, drain, two types of back contact openings may be masked, etched, and filled with electrically conductive materials preparing the transistors to be connected via metallization. Thus gate contact 1211 connects to gate electrode 1208, source & drain contacts 1240 connect to raised S/D regions 1232, back channel contact 1244 may connect to back-channel region 1222, and direct back contact 1245 may connect to back-channel region 1222. An optical step, such as illustrated by exemplary ILD anneal ray 1251, may be performed to anneal contact etch damage and densify the thick oxide 1209. Back channel contact 1244 and direct back contact 1245 may be formed to connect to shield/heat sink layer 1288 by further etching, and may be useful for hard wiring a back bias that may be controlled by, for example, the second layer or first layer circuitry into the FD MOSFET.

Figure 12G:
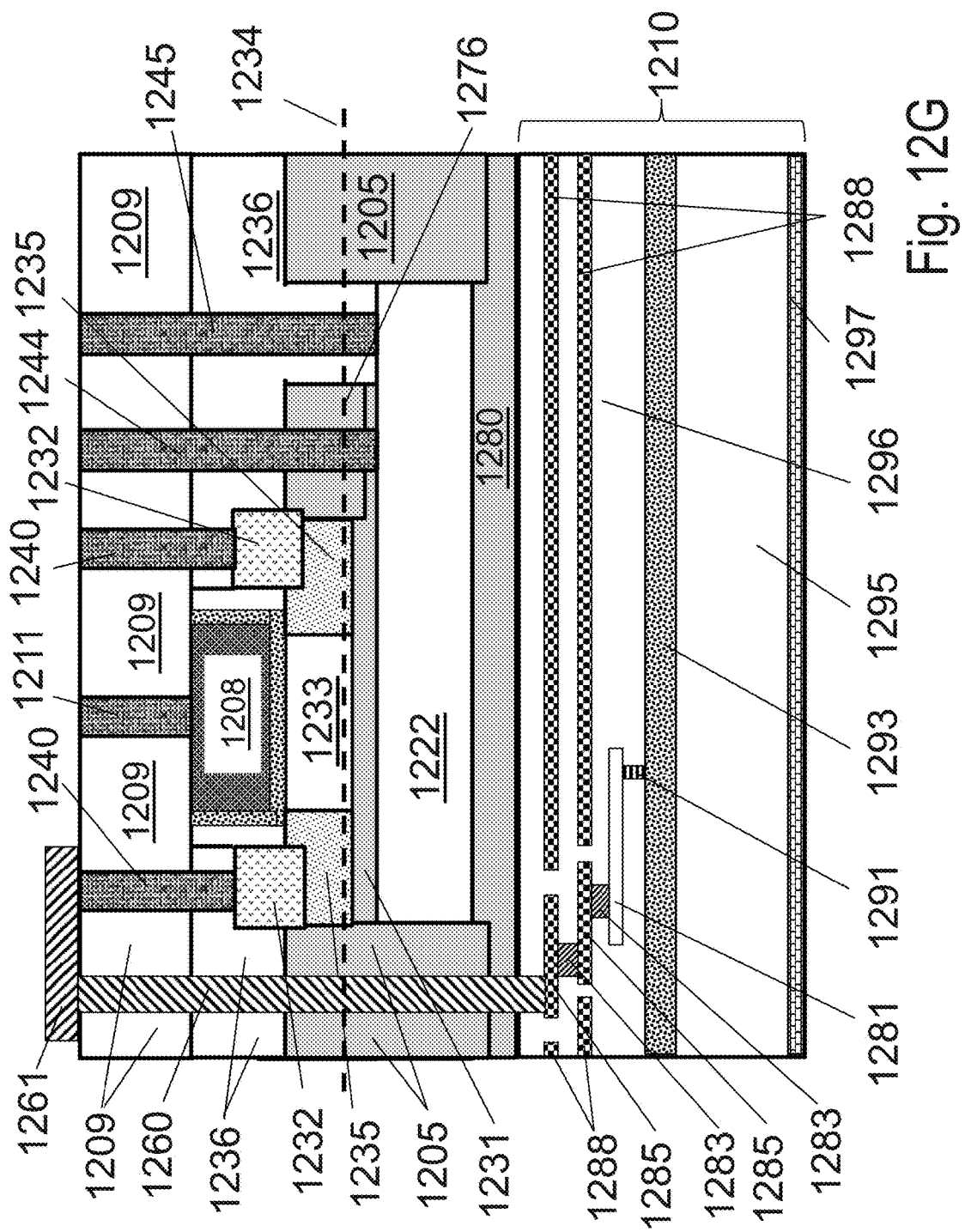

As illustrated in FIG. 12G, thru layer vias (TLVs) 1260 may be formed by etching thick oxide 1209, first ILD 1236, transistor and back channel isolation regions 1205, oxide layer 1280, into a portion of the upper oxide layer BEOL isolation 1296 of acceptor wafer 1210 BEOL, and filling with an electrically and thermally conducting material (such as tungsten or cooper) or an electrically non-conducting but thermally conducting material (such as described elsewhere within). Second device layer metal interconnect 1261 may be formed by conventional processing. TLVs 1260 may be constructed of thermally conductive but not electrically conductive materials, for example, DLC (Diamond Like Carbon), and may connect the FD-MOSFET transistor device and other devices on the top (second) crystalline layer thermally to shield/heat sink layer 1288. TLVs 1260 may be constructed out of electrically and thermally conductive materials, such as Tungsten, Copper, or aluminum, and may provide a thermal and electrical connection path from the FD-MOSFET transistor device and other devices on the top (second) crystalline layer to shield/heat sink layer 1288, which may be a ground or Vdd plane in the design/layout. TLVs 1260 may be also constructed in the device scribelanes (pre-designed in base layers or potential dicelines) to provide thermal conduction to the heat sink, and may be sawed/diced off when the wafer is diced for packaging not shown). Shield/heat sink layer 1288 may be configured to act (or adapted to act) as an emf (electromotive force) shield to prevent direct layer to layer crosstalk between transistors in the donor wafer layer and transistors in the acceptor wafer. In addition to static ground or Vdd biasing, shield/heat sink layer 1288 may be actively biased with an anti-interference signal from circuitry residing on, for example, a layer of the 3D-IC or off chip. The formed FD-MOSFET transistor device may include semiconductor regions wherein the dopant concentration of neighboring regions of the transistor in the horizontal plane, such as traversed by exemplary dopant plane 1234, may have regions, for example, transistor channel region 1233 and S/D & LDD regions 1235, that differ substantially in dopant concentration, for example, a 10 times greater doping concentration in S/D & LDD regions 1235 than in transistor channel region 1233, and/or may have a different dopant type, such as, for example p-type or n-type dopant, and/or may be doped and substantially undoped in the neighboring regions. For example, transistor channel region 1233 may be very lightly doped (less than 1e15 atoms/cm$^3$) or nominally un-doped (less than 1e14 atoms/cm$^3$) and S/D & LDD regions 1235 may be doped at greater than 1e15 atoms/cm$^3$ or greater than 1e16 atoms/cm$^3$. For example, transistor channel region 1233 may be doped with p-type dopant and S/D & LDD regions 1235 may be doped with n-type dopant.

A thermal conduction path may be constructed from the devices in the upper layer, the transferred donor layer and formed transistors, to the acceptor wafer substrate and associated heat sink. The thermal conduction path from the FD-MOSFET transistor device and other devices on the top (second) crystalline layer, for example, raised S/D regions 1232, to the acceptor wafer heat sink 1297 may include source & drain contacts 1240, second device layer metal interconnect 1261, TLV 1260, shield path connect 1285 (shown as twice), shield path via 1283 (shown as twice), metal interconnect 1281, first (acceptor) layer metal interconnect 1291, acceptor wafer transistors and devices 1293, and acceptor substrate 1295. The elements of the thermal conduction path may include materials that have a thermal conductivity greater than 10 W/m-K, for example, copper (about 400 W/m-K), aluminum (about 237 W/m-K), and Tungsten (about 173 W/m-K), and may include material with thermal conductivity lower than 10 W/m-K but have a high heat transfer capacity due to the wide area available for heat transfer and thickness of the structure (Fourier's Law), such as, for example, acceptor substrate 1295. The elements of the thermal conduction path may include materials that are thermally conductive but may not be substantially electrically conductive, for example, Plasma. Enhanced Chemical Vapor Deposited Diamond Like Carbon-PECVD DLC (about 1000 W/m-K), and Chemical Vapor Deposited (CVD) graphene (about 5000 W/m-K). The acceptor wafer interconnects may be substantially surrounded by BEOL isolation 1296, which may be a dielectric such as, for example, carbon doped silicon oxides. The heat removal apparatus, which may include acceptor wafer heat sink 1297, may include an external surface from which heat transfer may take place by methods such as air cooling, liquid cooling, or attachment to another heat sink or heat spreader structure.

Furthermore, some or all of the layers utilized as shield/heat sink layer 1288, which may include shapes of material such as the strips or fingers as illustrated in FIG. 8G, may be driven by a portion of the second layer transistors and circuits (within the transferred donor wafer layer or layers) or the acceptor wafer transistors and circuits, to provide a programmable back-bias to at least a portion of the second layer transistors. The programmable back bias may utilize a circuit to do so, for example, such as shown in FIG. 17B of U.S. Pat. No. 8,273,610, the contents incorporated herein by reference; wherein the 'Primary' layer may be the second layer of transistors for which the back-bias is being provided, the 'Foundation' layer could be either the second layer transistors (donor) or first layer transistors (acceptor), and the routing metal lines connections 1723 and 1724 may include portions of the shield/heat sink layer 1288 layer or layers. Moreover, some or all of the layers utilized as shield/heat sink layer 1288, which may include strips or fingers as illustrated in FIG. 8G, may be driven by a portion of the second layer transistors and circuits (within the transferred donor wafer layer or layers) or the acceptor wafer transistors and circuits to provide a programmable power supply to at least a portion of the second layer transistors. The programmable power supply may utilize a circuit to do so, for example, such as shown in FIG. 17C of U.S. Pat. No. 8,273,610, the contents incorporated herein by reference; wherein the 'Primary' layer may be the second layer of transistors for which the programmable power supplies are being provided to, the 'Foundation' layer could be either the second layer transistors (donor) or first layer transistors (acceptor), and the routing metal line connections from Vout to the various second layer transistors may include portions of the shield/heat sink layer 1288 layer or layers. The Vsupply on line 17C12 and the control signals on control line 17C16 may be controlled by and/or generated in the second layer transistors (for example donor wafer device structures such as the FD-MOSFETs formed as described in relation to FIG. 12) or first layer transistors (acceptor, for example acceptor wafer transistors and devices 1293), or off chip circuits. Furthermore, some or all of the layers utilized as shield/heat sink layer 1288, which may include strips or fingers as illustrated in FIG. 8G or other shapes such as those in FIG. 8B, may be utilized to distribute independent power supplies to various portions of the second layer transistors (for example donor wafer device structures such as the FD-MOSFETs formed as described in relation to FIG. 12) or first layer transistors (acceptor, for example acceptor wafer transistors and devices 1293) and circuits; for example, one power supply and/or voltage may be routed to the sequential logic circuits of the second layer and a different power supply and/or voltage routed to the combinatorial logic circuits of the second layer. Patterning of shield/heat sink layer 1288 or layers can impact their heat-shielding capacity. This impact may be mitigated, for example, by enhancing the top shield/heat sink layer 1288 areal density, creating more of the secondary shield/heat sink layers 1288, or attending to special CAD rules regarding their metal density, similar to CAD rules that are required to accommodate Chemical-Mechanical Planarization (CMP). These constraints would be integrated into a design and layout EDA tool.

TLVs 1260 may be formed through the transferred layers. As the transferred layers may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers, the smaller the thru layer via diameter obtainable, which may result from maintaining manufacturable via aspect ratios. The thickness of the layer or layers transferred according to some embodiments of the invention may be designed as such to match and enable the most suitable obtainable lithographic resolution (and enable the use of conventional state of the art lithographic tools), such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers.

Formation of CMOS in one transferred layer and the orthogonal connect strip methodology may be found as illustrated in at least FIGS. 30-33, 73-80, and 94 and related specification sections of U.S. Pat. No. 8,273,610, and may be applied to at least the FIG. 12 formation techniques herein.

Persons of ordinary skill in the art will appreciate that the illustrations in FIGS. 12A through 12G are exemplary only and are not drawn to scale. Such skilled persons will further appreciate that many variations are possible such as, for example, a p-channel FD-MOSFET may be formed with changing the types of dopings appropriately. Moreover, the SOI donor wafer substrate 1200 may be n type or un-doped. Furthermore, transistor and back channel isolation regions 1205 and transistor isolation region 1286 may be formed by a hard mask defined process flow, wherein a hard mask stack, such as, for example, silicon oxide and silicon nitride layers, or silicon oxide and amorphous carbon layers, may be utilized. Moreover, CMOS FD MOSFETs may be constructed with n-MOSFETs in a first mono-crystalline silicon layer and p-MOSFETs in a second mono-crystalline layer, which may include different crystalline orientations of the mono-crystalline silicon layers, such as for example, <100>, <111> or <551>, and may include different contact silicides for optimum contact resistance to p or n type source, drains, and gates. Further, dopant segregation techniques (DST) may be utilized to efficiently modulate the source and drain Schottky barrier height for both p and n type junctions formed. Furthermore, raised source and drain contact structures, such as etch and epi SiGe and SiC, may be utilized for strain and contact resistance improvements and the damage from the processes may be optically annealed. Many other modifications within the scope of the invention will suggest themselves to such skilled persons after reading this specification. Thus the invention is to be limited only by the appended claims.

In many applications it is desired to use a combination of N type transistors and P type transistors. While using two overlaid layers, at least one layer of P type transistors on top of at least one layer of N type transistors, has been previously described herein and n referenced patent applications, it might be desired to have those transistors connected by the same overlaying interconnection layers coupling to one transistor layer. In U.S. Pat. No. 8,273,610, the contents of which are incorporated herein by reference, there are at least two flows to provide such. The flows could be adapted to vertical transistors just as well. The first flow suggests using repeating rows of N type and P type and is detailed in at least FIGS. 20-35 and FIGS. 73-79 of U.S. Pat. No. 8,273,610. An alternative flow suggests using layers within the strata in a vertical manner, and is described in at least FIG. 95 of U.S. Pat. No. 8,273,610.

While concepts in this document have been described with respect to 3D-ICs with two stacked device layers, those of ordinary skill in the art will appreciate that it can be valid for 3D-ICs with more than two stacked device layers. Additionally, some of the concepts may be applied to 2D ICs.

An additional embodiment of the invention is to utilize the underlying interconnection layer or layers to provide connections and connection paths (electrical and/or thermal) for the overlying transistors. While the common practice in the IC industry is that interconnection layers are overlaying the transistors that they connect, the 3D IC technology may include the possibility of constructing connections underneath (below) the transistors as well. For example, some of the connections to, from, and in-between transistors in a layer of transistors may be provided by the interconnection layer or layers above the transistor layer; and some of the connections to, from, and in-between the transistors may be provided by the interconnection layer or layers below the transistor layer or layers. In general there is an advantage to have the interconnect closer to the transistors that they are connecting and using both sides of the transistors—both above and below—provides enhanced "closeness" to the transistors. In addition, there may be less interconnect routing congestion that would impede the efficient or possible connection of a transistor to transistors in other layers and to other transistors in the same layer.

The connection layers may, for example, include power delivery, heat removal, macro-cell connectivity, and routing between macro-cells. As illustrated in FIG. 9A-D, an exemplary illustration and description of connections below a layer of transistors and macro-cell formation and connection is shown. When the same reference numbers are used in different drawing figures (among FIGS. 9A-D), they may indicate analogous, similar or identical structures to enhance the understanding of the embodiments of the invention being discussed by clarifying the relationships between the structures and embodiments presented in the various diagrams—particularly in relating analogous, similar or identical functionality to different physical structures. The term macro-cell may include one or more logic cells.

An important advantage is that the connections could be made above and below the transistor layers. A Macro-cell library could use under the transistor layer connections and over the transistor layer connections. A router can use under the transistor layer connections and over the transistor layer connections, and power delivery could use under the transistor layer connections and over the transistor layer connections. Some of the connections could be solely for the transistor of that layer and other connections could include connections to other transistor or device layers.

Figure 9A:
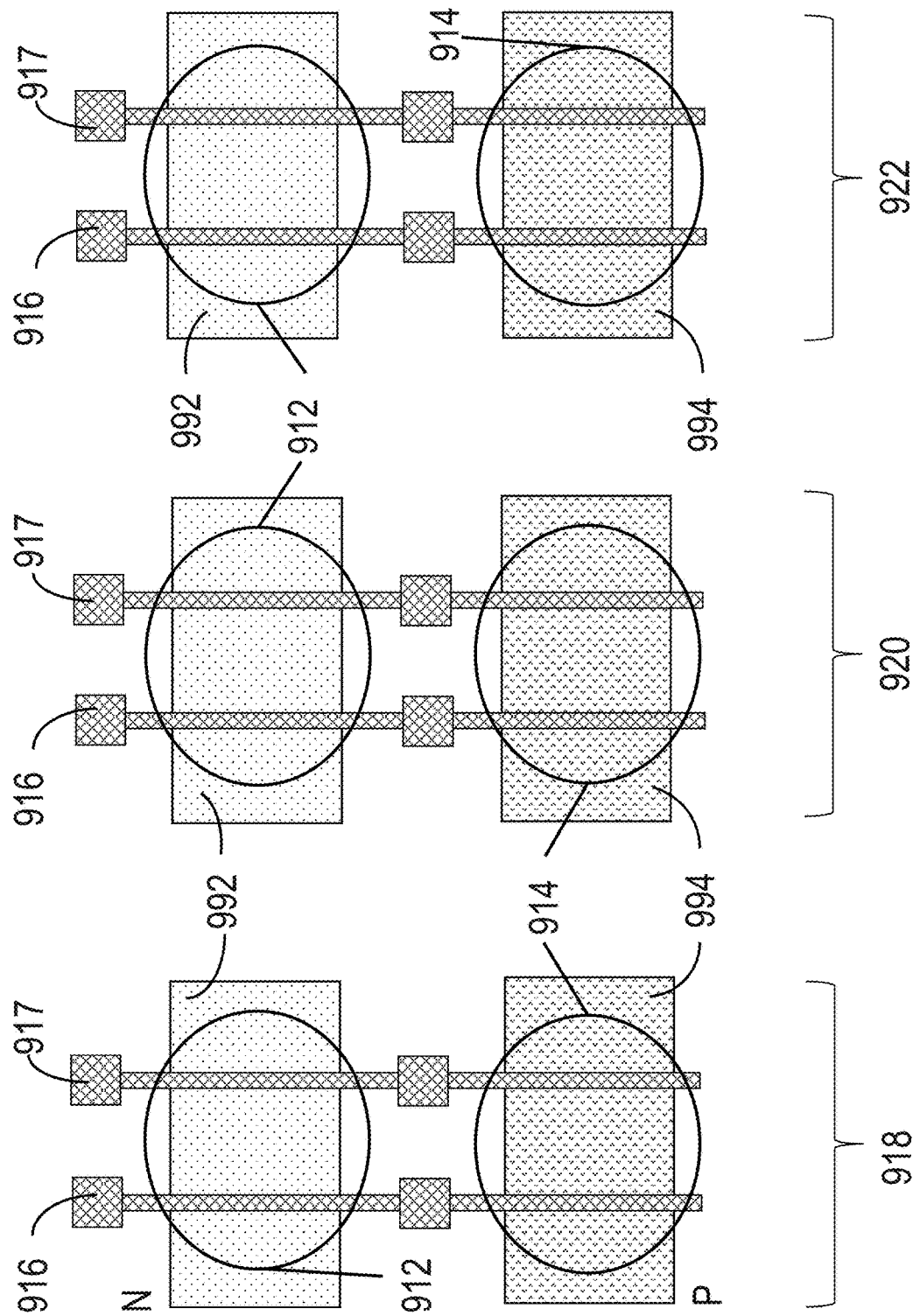

As illustrated in FIG. 9A, a repeating device or circuit structure, such as, for example, a gate-array like transistor structure, may be constructed in a layer, such as for example, monocrystalline silicon, as described elsewhere herein and in U.S. Pat. No. 8,273,610, whose contents are incorporated by reference. FIG. 9A is an exemplary illustration of the top view of three of the repeating elements of the gate-array like transistor structure layer. The exemplary repeating elements of the structure may include a first element 918, a second element 920, and a third element 922, and each element may include two transistor pairs, for example, N transistor pair 912 and P transistor pair 914. N transistor pair 912 may include common diffusion 992 and a portion of first common gate 916 and second common gate 917. P transistor pair 914 may include common diffusion 994 and a portion of first common gate 916 and second common gate 917. The structure of FIG. 9A can represent a small section of a gate-array in which the structure keeps repeating.

Figure 9B:
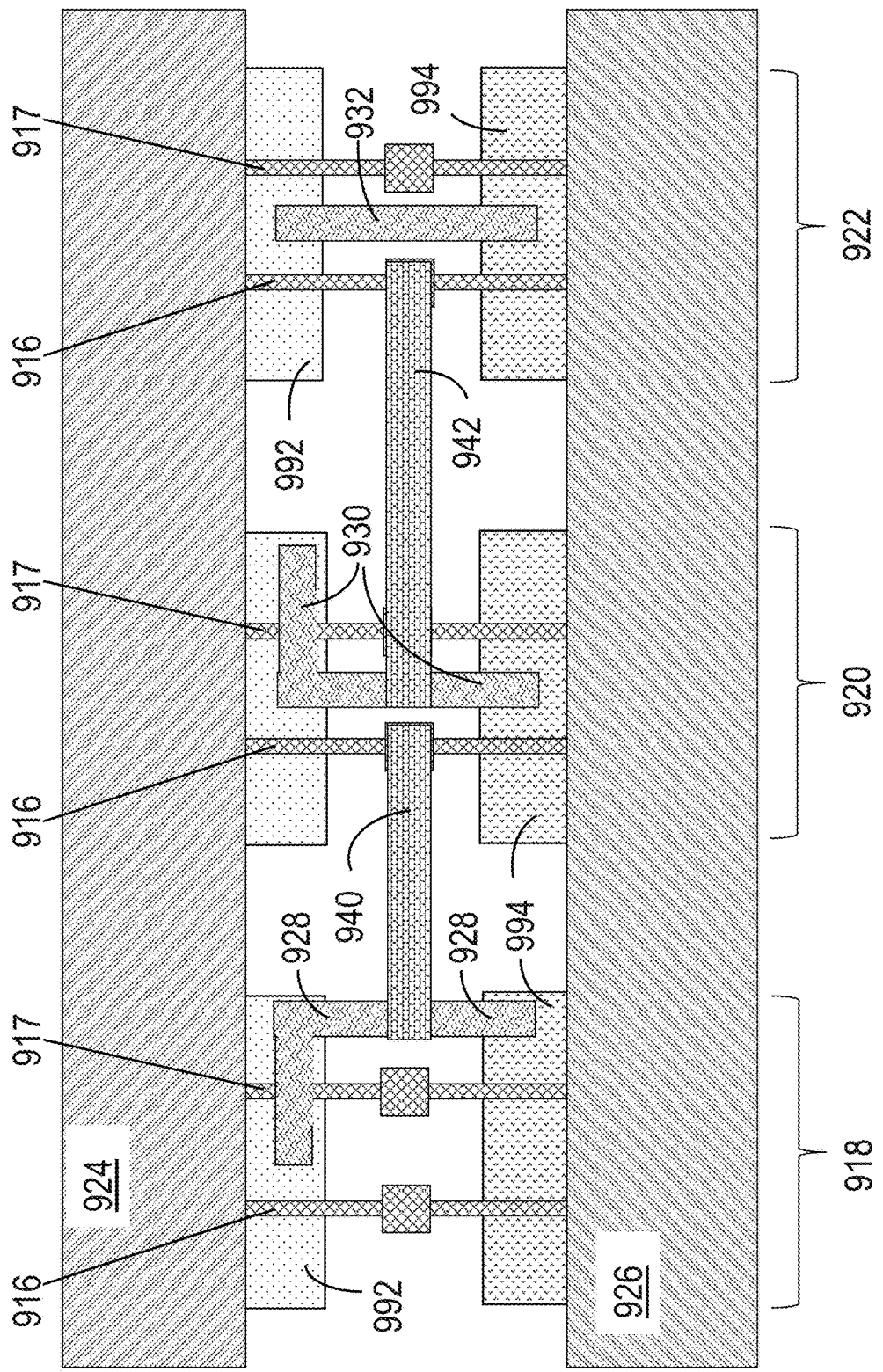

As illustrated in FIG. 9B, the interconnection layers underneath (below) the transistors of FIG. 9A may be constructed to provide connections (along with the vias of FIG. 9C) between the transistors of FIG. 9A. Underneath (below) the transistors may be defined as being in the direction of the TLVs (thru Layer Vias) or TSVs (Thru Silicon Vias) that are going through the layer of transistor structures and transistors referred to in the FIG. 9A discussion. The view of exemplary illustration FIG. 9B is from below the interconnection layers which are below the repeating device or circuit structure; however, the orientation of the repeating device or circuit structure is kept the same as FIG. 9A for clarity. The interconnection layers underneath may include a ground-'Vss' power grid 924 and a power-'Vdd' power grid 926. The interconnection layers underneath may include macro-cell construction connections such as, for example, NOR gate macro-cell connection 928 for a NOR gate cell formation formed by the four transistors of first element 918, NAND gate macro-cell connection 930 for a NAND gate cell formation formed by the four transistors of second element 920, and Inverter macro-gate cell connection 932 for an Inverter gate cell formation formed by two of the four transistors of third element 922. The interconnection layers may include routing connection 940 which connects the output of the NOR gate of first element 918 to the input of the NAND gate of second element 920, and additional routing connection 942 which connects the output of the NAND gate of second element 920 to the input of the inverter gate of third element 922. The macro-cells and the routing connections (or routing structures) are part of the logic cell and logic circuit construction. The connection material may include for example, copper, aluminum, and/or conductive carbon.

Figure 9C:
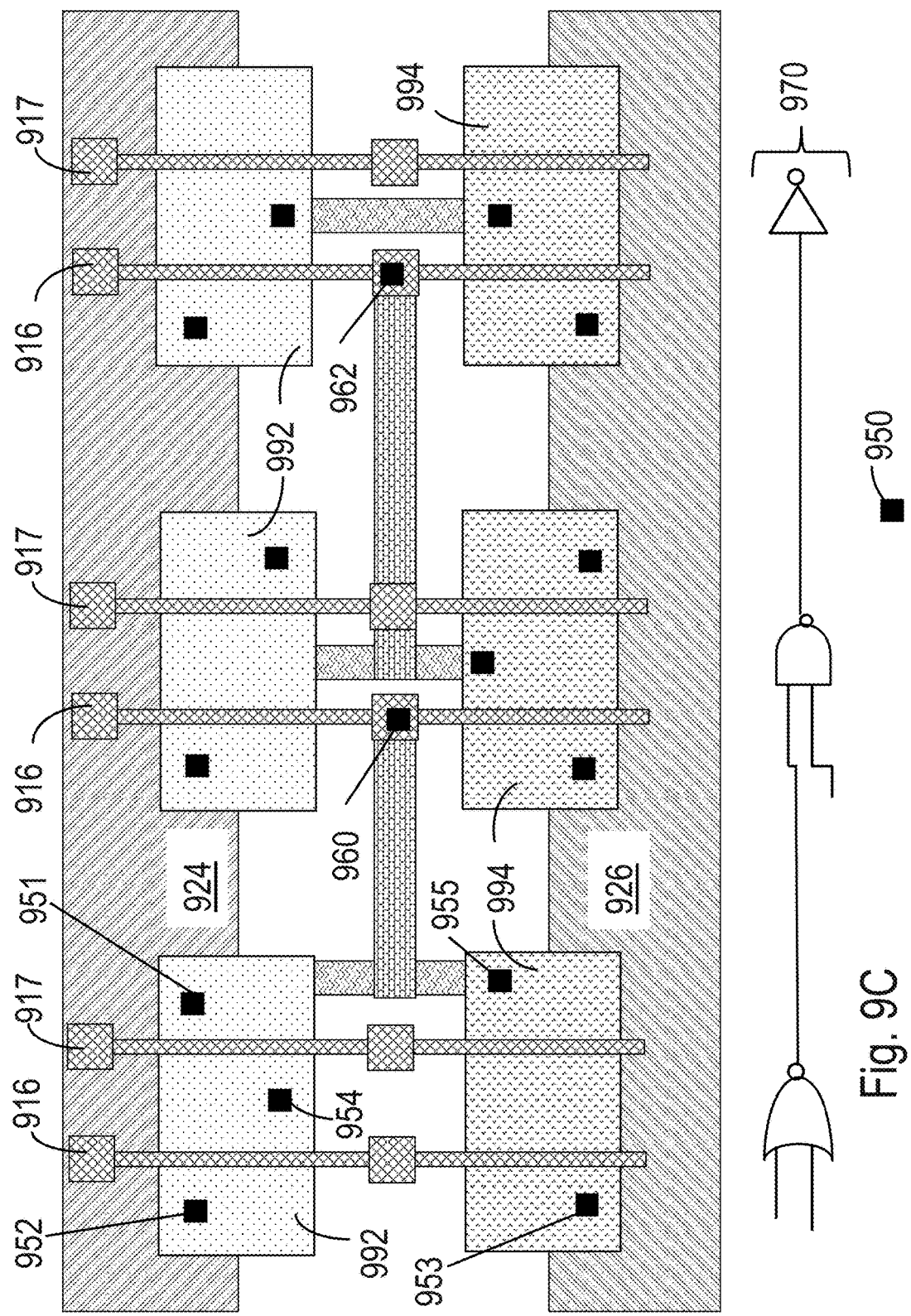

As illustrated in FIG. 9C, generic connections 950 may be formed to electrically connect the transistors of FIG. 9A to the underlying connection layer or layers presented in FIG. 9B. Generic connections 950 may also be called contacts as they represent the contact made between the interconnection layers and the transistors themselves, and may also be called TLVs (Thru Layer Vias), as described elsewhere herein. The diameter of the connections, such as, for example, generic connections 950, may be, for example, less than 1 um, less than 100 nm, or less than 40 nm, and the alignment of the connections to the underlying interconnection layer or layers or to the transistors may be less than 40 nm or even less than 10 nm, and may utilize conventional industry lithography tools.

The process flow may involve first processing the connection layers such as presented in FIG. 9B. Connections such as power busses ground-'Vss' power grid 924 and a power-'Vdd' power grid 926 and macro cell connections segments NOR gate macro-cell connection 928, NAND gate macro-cell connection 930, and Inverter macro-gate cell connection 932 and routing segments routing connection 940 and additional routing connection 942, could substantially all be processed at the top metal interconnect layers of the base wafer, and accordingly be aligned to the base wafer alignment marks with far less than 40 nm alignment error. An oxide layer could be deposited and a layer of single crystal silicon could be transferred over using a process flow such as been described herein or in referenced patents and patent applications. And may be followed by processing steps for forming transistors such as presented in FIG. 9A (N transistor pair 912 and P transistor pair 914) aligned to the base wafer alignment marks using a process flow such as been described herein or in reference patents and patent applications. The monolithic 3D transistors in the transistor layer could be made by any of the techniques presented herein or other techniques. The connections between the transistors and the underlying connection layers may be processed. For example, as illustrated in FIG. 9C (now viewing from the topside, in the direction opposite that of FIG. 9B), generic connections 950 may be specifically employed as power grid connections, such as Vss connection 952 and second Vss connection 951, and Vdd connection 953. Further, generic connections 950 may be specifically employed as macro-cell connections, such as macro-cell connection 954 and second macro-cell connection 955, connecting/coupling a specific location of common diffusion 992 to a specific location of common diffusion 994 with NOR gate macro-cell connection 928. Moreover, generic connections 950 may be specifically employed as connections to routing, such as, for example, routing connection 960 and second routing connection 962. FIG. 9C also includes an illustration of the logic schematic 970 represented by the physical illustrations of FIG. 9A, FIG. 9B and FIG. 9C.

As illustrated in FIG. 9D, and with reference to the discussion of at least FIGS. 47A and 47B of U.S. patent application Ser. No. 13/441,923 and FIGS. 59 and 60 of U.S. Pat. No. 8,273,610, thru silicon connection 989, which may be the generic connections 950 previously discussed, may provide connection from the transistor layer 984 to the underlying interconnection layer 982. Underlying interconnection layer 982 may include one or more layers of '1×' thickness metals, isolations and spacing as described with respect to the referenced FIGS. 47A&B and FIGS. 59 and 60. Alternatively, thru layer connection 988, which may be the generic connections 950 previously discussed, may provide connection from the transistor layer 984 to the underlying interconnection layer 982 by connecting to the above interconnection layer 986 which connects to the transistor layer 984. Further connection to the substrate transistor layer 972 may utilize making a connection from underlying interconnection layer 982 to 2× interconnection layer 980, which may be connected to 4× interconnection layer 978, which may be connected to substrate 2× interconnection layer 976, which may be connected to substrate 1× interconnection layer 974, which may connect to substrate transistor layer 972. Underlying interconnection layer 982, above interconnection layer 986, 2× interconnection layer 980, 4× interconnection layer 978, substrate 2× interconnection layer 976, and substrate 1× interconnection layer 974 may include one or more interconnect layers, each of which may include metal interconnect lines, vias, and isolation materials. As described in detail in the referenced FIGS. 47A&B and FIGS. 59 and 60 discussions, 1× layers may be thinner than 2× layers, and 2× layers may be thinner than 4× layers.

Figure 10B:
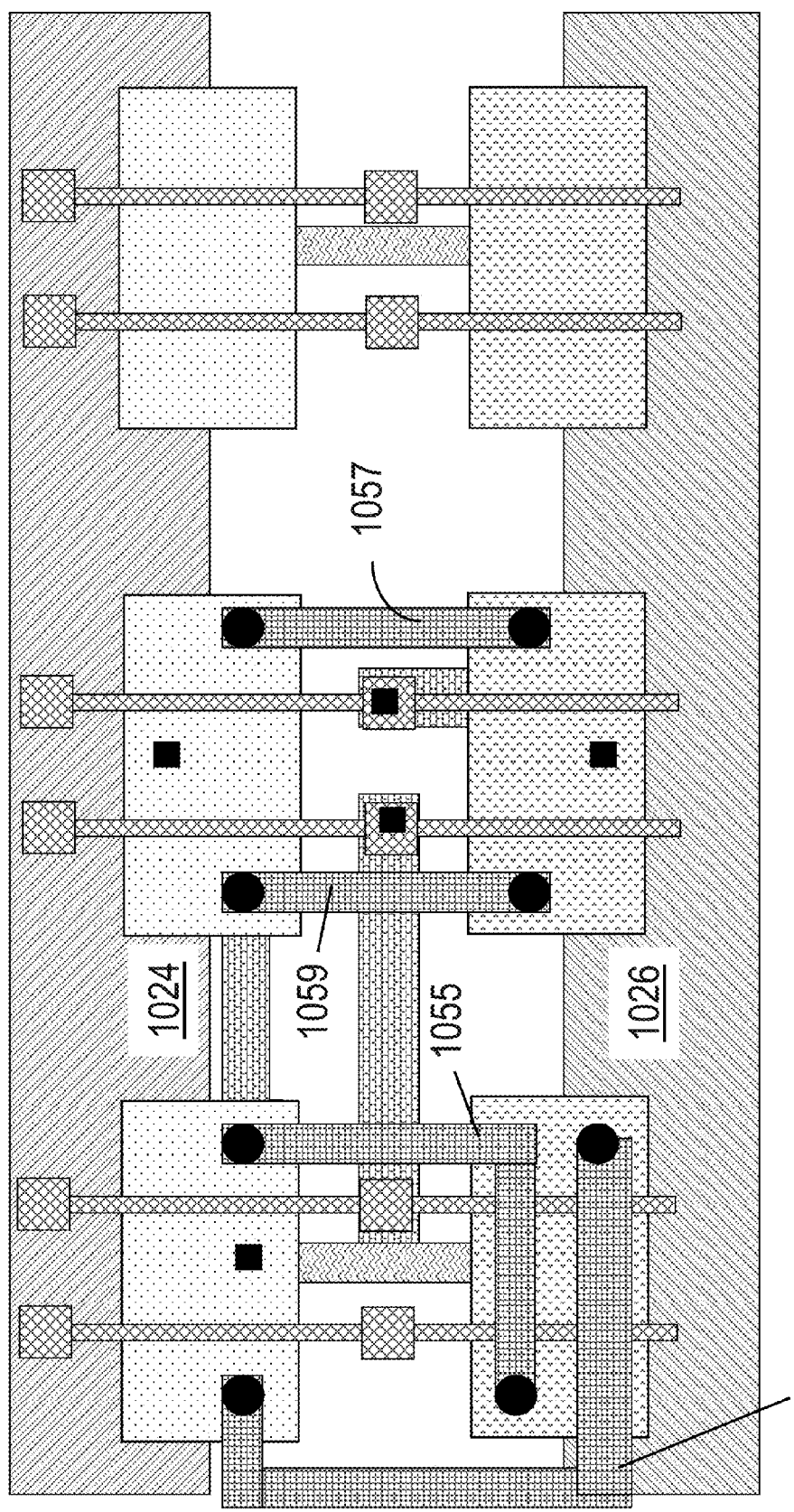

FIG. 10A and FIG. 10B illustrate additional exemplary circuits which may utilize both under transistor layer connections and over transistor layer connections. The circuits may, for example, use the array structure of FIG. 9A. N and P transistor pair element 1018 may be configured as a multiplexer cell, and N and P transistor pair second element 1020 may be configured as an inverter driving inverter. FIG. 10A illustrates the under transistors layer connections. FIG. 10A and FIG. 10B use the same drawing symbols as was used in FIG. 9B and FIG. 9C. Power buses ground-'Vss' power grid 1024 and a power-'Vdd' power grid 1026 provide power and connection segment 1028 is part of the macro-cell library for implementing a multiplexer gate. Second connection segment 1030, third connection segment 1032, and fourth connection segment 1040 are part of the routing connections forming the circuit. The specific circuit illustrated by FIG. 10A and FIG. 10B could part of a larger macro-cell of half a flip-flop. In such case the connections second connection segment 1030, third connection segment 1032, and fourth connection segment 1040 may be part of the macro-cell as well. FIG. 10B illustrates the connections over the transistor layer as well as the connections to below the transistor layer. Connections first macro-cell above connection 1053, second macro-cell above connection 1055, third macro-cell above connection 1057, and fourth macro-cell above connection 1059 may be over the transistor layer connections used as part of the macro-cell library. Symbol 1050 indicates a contact from the over the transistor layer connection and the transistor structure underneath it. Symbol 1051 indicates a contact from the under the transistor layer connection and the transistor structure above it. Many of the connections are dedicated solely for connections between the transistor on that layer to other transistor on the same layer such as first macro-cell above connection 1053, second macro-cell above connection 1055, third macro-cell above connection 1057, and connection segment 1028, second connection segment 1030, third connection segment 1032, and fourth connection segment 1040. The processing of connections over the transistor layer would be after the formation of the transistor layer and the process steps related to the formation of those transistors.

The design flow of a 3D IC that incorporates the "below-transistor" connections, such as are described for example, with respect to FIGS. 9A-D, would need to be modified accordingly. The chip power grid may need to be designed to include the below-transistors grid and connection of this grid to the overall chip power grid structure. The macro-cell library may need to be designed to include below-transistor connections. The Place and Route tool may need to be modified to make use of the below-transistor routing resources. The resources might include the power grid aspect, the macro-cell aspect, the allocation of routing resources underneath (below), heat transfer considerations, and the number of layers underneath that may be allocated for the routing task. Typically, at least two interconnection layers underneath may be allocated.

For the case of connecting below-transistor routing layers to the conventional above-transistor routing layers, each connection may pass through generic connections 950 to cross the transistor-forming layers. Such contacts may already exist for many nets that directly connect to transistor sources, drains, and gates; and hence, such nets can be relatively freely routed using both below- and above-transistors interconnection routing layers. Other nets that may not normally include generic connections 950 in their structure may be routed on either side of the transistor layer but not both, as crossing the transistor layer may incur creating additional generic connections 950; and hence, potentially congest the transistor layer.

Consequently, a good approach for routing in such a situation may be to use the below-transistor layers for short-distance wiring and create wiring library macros that may tend to be short-distanced in nature. Macro outputs, on the other hand, frequently need to additionally connect to remote locations and should be made available at contacts, such as generic connections 950, which are to be used on both sides of the transistor layer. When routing, nets that are targeted for both below and above the transistor layer and that do not include contacts such as generic connections 950 may need special prioritized handling that may split them into two or more parts and insert additional contact[s] in the transistor layer before proceeding to route the design. An additional advantage of the availability and use of an increased number of routing layers on both sides of the transistor layer is the router's greater ability to use relaxed routing rules while not increasing routing congestion. For example, relaxing routing rules such as wider traces, wherein 1.5× or more the width of those traces used for the same layer in one sided routing for the same process node could be utilized in the two sided routing (above and below transistor layer), and may result in reduced resistance; and larger metal spacing, wherein 1.5× or more the space of those spaces used for the same layer in one sided routing for the same process node, could be utilized in the two sided routing (above and below transistor layer), and may result in decreased crosstalk and capacitance.

Persons of ordinary skill in the art will appreciate that the illustrations in FIGS. 9A through 9D and FIGS. 10A and 10B are exemplary only and are not drawn to scale. Such skilled persons will further appreciate that many variations are possible such as, for example, the interconnection layer or layer below or above the transistor layer may also be utilized for connection to other strata and transistor layers, not just the transistor layer that is between the above and below interconnection layer or layers. Furthermore, connections made directly underneath and to common diffusions, such as common diffusion 992 and second common diffusion 994, may be problematic in some process flows and TLVs through the adjacent STI (shallow trench isolation) area with routing thru the first layer of interconnect above the transistor layer to the TLV may instead be utilized. Moreover, silicon connection 989 may be more than just a diffusion connection such as Vss connection 952, second Vss connection 951, and Vdd connection 953, such as, for example, macro-cell connection 954, second macro-cell connection 955, routing connection 960, or second routing connection 962. Furthermore, substrate transistor layer 972 may also be a transistor layer above a lower transistor layer in a 3D IC stack. Many other modifications within the scope of the invention will suggest themselves to such skilled persons after reading this specification. Thus the invention is to be limited only by the appended claims.

Some embodiments of the invention may include alternative techniques to build IC (Integrated Circuit) devices including techniques and methods to construct 3D IC systems. Some embodiments of the invention may enable device solutions with far less power consumption than prior art. The device solutions could be very useful for the growing application of mobile electronic devices and mobile systems such as, for example, mobile phones, smart phone, and cameras, those mobile systems may also connect to the internet. For example, incorporating the 3D IC semiconductor devices according to some embodiments of the invention within the mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention. Mobile system applications of the 3DIC technology described herein may be found at least in FIG. 156 of U.S. Pat. No. 8,273,610, the contents of which are incorporated by reference.

In this document, the connection made between layers of, generally single crystal, transistors, which may be variously named for example as thermal contacts and vias, Thru Layer Via (TLV), TSV (Thru Silicon Via), may be made and include electrically and thermally conducting material or may be made and include an electrically non-conducting but thermally conducting material or materials. A device or method may include formation of both of these types of connections, or just one type. By varying the size, number, composition, placement, shape, or depth of these connection structures, the coefficient of thermal expansion exhibited by a layer or layers may be tailored to a desired value. For example, the coefficient of thermal expansion of the second layer of transistors may be tailored to substantially match the coefficient of thermal expansion of the first layer, or base layer of transistors, which may include its (first layer) interconnect layers.

Base wafers or substrates, or acceptor wafers or substrates, or target wafers substrates herein may be substantially comprised of a crystalline material, for example, mono-crystalline silicon or germanium, or may be an engineered substrate/wafer such as, for example, an SOI (Silicon on Insulator) wafer or GeOI (Germanium on Insulator) substrate.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Rather, the scope of the invention includes both combinations and sub-combinations of the various features described hereinabove as well as modifications and variations which would occur to such skilled persons upon reading the foregoing description. Thus the invention is to be limited only by the appended claims.

We claim:

1. An Integrated Circuit device, comprising:
   a base wafer comprising single crystal, said base wafer comprising a plurality of first transistors;
   at least one metal layer providing interconnection between said plurality of first transistors;
   a first wire structure constructed to provide power to a portion of said first transistors;
   a second layer of less than 2 micron thickness, said second layer comprising a plurality of second single crystal transistors, said second layer overlying said at least one metal layer; and
   a second wire structure constructed to provide power to a portion of said second transistors,
   wherein said second wire structure is isolated from said first wire structure to provide a different power voltage to said portion of said second transistors.

2. An Integrated Circuit device according to claim 1, further comprising:
   at least one conductive structure underneath at least one of said second single crystal transistors, said at least one conductive structure is constructed to provide a back-bias to at least one of said second single crystal transistors.

3. An Integrated Circuit device according to claim 1, further comprising:
   at least one thermal conduction path from at least one of said second single crystal transistors to an external surface of said Integrated Circuit device.

4. An Integrated Circuit device according to claim 1, further comprising:
   a heat-spreader layer disposed between said first layer and said second layer.

5. An Integrated Circuit device according to claim 1, wherein at least a portion of said second wire structure is controlled by at least one of said transistors.

6. An Integrated Circuit device according to claim 1, further comprising:
   a conductive layer disposed underneath said second layer, wherein said conductive layer provides power to at least one of said second single crystal transistors.

7. An Integrated Circuit device according to claim 1, further comprising:
   a conductive pad overlying at least one of said second single crystal transistors.

8. An Integrated Circuit device, comprising:
   a base wafer comprising single crystal, said base wafer comprising a plurality of first transistors;
   at least one metal layer providing interconnection between said plurality of first transistors;
   a second layer of less than 2 micron thickness, said second layer comprising a plurality of second transistors, said second layer overlying said at least one metal layer; and
   at least one conductive structure constructed to provide power to a portion of said second transistors,
   wherein said provide power is controlled by at least one of said transistors.

9. An Integrated Circuit device according to claim 8, wherein at least one of said second transistors comprises a back-bias structure.

10. An Integrated Circuit device according to claim 8, further comprising:
    at least one thermal conduction path from at least one of said second transistors to an external surface of said Integrated Circuit device.

11. An Integrated Circuit device according to claim 8, further comprising:
   a shielding layer,
      wherein said shielding layer provides shielding for said at least one metal layer from heat resulting from optical annealing of said second transistors.

12. An Integrated Circuit device according to claim 8, wherein said at least one conductive structure is disposed between said base wafer and said second layer.

13. An Integrated Circuit device according to claim 8, further comprising:
   a conductive pad overlying at least one of said second transistors.

14. An Integrated Circuit device according to claim 8, further comprising:
   at least one thermal conduction path from said at least one conductive structure to an external surface of said Integrated Circuit device.

15. An Integrated Circuit device, comprising:
   a base wafer comprising single crystal, said base wafer comprising a plurality of first transistors;
   at least one metal layer providing interconnection between said plurality of first transistors;
   a second layer of less than 2 micron thickness, said second layer comprising a plurality of second transistors, said second layer overlying said at least one metal layer,
   at least one conductive structure constructed to provide power to a portion of said second transistors,
      wherein said provide power is controlled by at least one of said transistors;
   a plurality of conductive pads,
      wherein at least one of said conductive pads overlays at least one of said second transistors; and
   at least one I/O circuit,
      wherein said at least one I/O circuit is adapted to interface with external devices through at least one of said plurality of conductive pads.

16. An Integrated Circuit device according to claim 15, wherein at least one of said second transistors comprise a back-bias structure.

17. An Integrated Circuit device according to claim 15, further comprising:
   at least one thermal conduction path from at least one of said second transistors to an external surface of said Integrated Circuit device.

18. An Integrated Circuit device according to claim 15, further comprising:
   a shielding layer,
      wherein said shielding layer provides shielding for said at least one metal layer from heat resulting from optical annealing of said second transistors.

19. An Integrated Circuit device according to claim 15, further comprising:
   at least one heat spreader layer underneath said second layer.

20. An Integrated Circuit device according to claim 15, wherein said at least one conductive structure is disposed between said base wafer and said second layer.

* * * * *